(12) United States Patent
Seo

(10) Patent No.: US 9,853,032 B2
(45) Date of Patent: Dec. 26, 2017

(54) SEMICONDUCTOR DEVICES AND METHODS FOR FABRICATING THE SAME

(71) Applicant: Samsung Electronics Co., Ltd., Suwon-si (KR)

(72) Inventor: JungWoo Seo, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/230,622

(22) Filed: Aug. 8, 2016

(65) Prior Publication Data

US 2016/0343716 A1    Nov. 24, 2016

Related U.S. Application Data

(62) Division of application No. 14/570,365, filed on Dec. 15, 2014, now Pat. No. 9,449,977, which is a division
(Continued)

(30) Foreign Application Priority Data

Mar. 14, 2011    (KR) .................. 10-2011-0022440

(51) Int. Cl.
| | | |
|---|---|---|
| *H01L 27/108* | (2006.01) | |
| *H01L 21/311* | (2006.01) | |
| *H01L 49/02* | (2006.01) | |

(52) U.S. Cl.
CPC .. *H01L 27/10852* (2013.01); *H01L 21/31111* (2013.01); *H01L 27/108* (2013.01);
(Continued)

(58) Field of Classification Search
CPC ....... H01L 28/90; H01L 28/91; H01L 27/108; H01L 27/10852; H01L 27/10805;
(Continued)

(56) References Cited

U.S. PATENT DOCUMENTS

| | | |
|---|---|---|
| 7,393,743 B2 | 7/2008 | Manning |
| 7,456,461 B2 | 11/2008 | Gutsche et al. |
| | (Continued) | |

FOREIGN PATENT DOCUMENTS

| | | |
|---|---|---|
| KR | 20090012408 | 2/2009 |
| KR | 20090041168 | 4/2009 |
| KR | 20090110692 | 10/2009 |

OTHER PUBLICATIONS

"Semiconductor Devices and Methods for Fabricating the Same" Specification, Drawings, Claims and Prosecution History of U.S. Appl. No. 13/415,165, filed Mar. 8, 2012 by JungWoo Seo.
(Continued)

*Primary Examiner* — Jesse Y Miyoshi
*Assistant Examiner* — David Spalla
(74) *Attorney, Agent, or Firm* — Onello & Mello, LLP

(57) ABSTRACT

A semiconductor device includes a substrate and a plurality of storage nodes on the substrate and extending in a vertical direction relative to the substrate. A lower support pattern is in contact with the storage nodes between a bottom and a top of the storage nodes, the lower support pattern spaced apart from the substrate in the vertical direction, and the lower support pattern having a first maximum thickness in the vertical direction. An upper support pattern is in contact with the storage nodes above the lower support pattern relative to the substrate, the upper support pattern spaced apart from the lower support pattern in the vertical direction, and the lower support pattern having a second maximum thickness in the vertical direction that is greater than the first maximum thickness of the lower support pattern.

20 Claims, 46 Drawing Sheets

Related U.S. Application Data of application No. 13/415,165, filed on Mar. 8, 2012, now Pat. No. 8,912,629.

(52) U.S. Cl.
CPC ........ *H01L 27/10814* (2013.01); *H01L 28/60* (2013.01); *H01L 28/90* (2013.01)

(58) Field of Classification Search
CPC ......... H01L 27/10808; H01L 27/10811; H01L 27/10814
See application file for complete search history.

(56) References Cited

U.S. PATENT DOCUMENTS

| | | | |
|---|---|---|---|
| 7,557,015 | B2 | 7/2009 | Sandhu et al. |
| 8,163,613 | B2 | 4/2012 | Fishburn |
| 2005/0054159 | A1 | 3/2005 | Manning et al. |
| 2006/0261440 | A1 | 11/2006 | Manning |
| 2008/0045034 | A1* | 2/2008 | Shea ................. H01L 21/31116 438/738 |
| 2009/0001516 | A1 | 1/2009 | Kim |
| 2009/0102017 | A1 | 4/2009 | Bae et al. |
| 2010/0009512 | A1* | 1/2010 | Fishburn ................. H01L 28/91 438/399 |
| 2010/0266962 | A1 | 10/2010 | Fishburn et al. |
| 2011/0159660 | A1 | 6/2011 | Kang et al. |
| 2012/0040507 | A1* | 2/2012 | Lee .................... H01L 27/0207 438/381 |

OTHER PUBLICATIONS

"Semiconductor Devices and Methods for Fabricating the Same" Specification, Drawings, Claims and Prosecution History of U.S. Appl. No. 14/570,365, filed Dec. 15, 2014 by JungWoo Seo.

\* cited by examiner

SEMICONDUCTOR DEVICES AND METHODS FOR FABRICATING THE SAME

CROSS-REFERENCE TO RELATED APPLICATIONS

This U.S. non-provisional patent application is a divisional of U.S. application Ser. No. 14/570,365, filed Dec. 15, 2014, which is a divisional of U.S. application Ser. No. 13/415,165, filed Mar. 8, 2012, now U.S. Pat. No. 8,912,629, which claims benefit under 35 U.S.C. §119 to Korean Patent Application No. 10-2011-0022440, filed on Mar. 14, 2011, in the Korean Intellectual Property Office, the entire contents of which are incorporated herein by reference.

BACKGROUND

Embodiments of the inventive concepts relate generally to semiconductor devices. More particularly, embodiments of the inventive concepts relate to semiconductor devices and methods of fabricating the same.

Dynamic random access memory (DRAM) devices employ capacitors as information storage elements. To meet the demands of high-capacity and high-density semiconductor memory devices, DRAM capacitors are continually subject to further miniaturization. However, with such miniaturization, in order for the capacitors to maintain adequate capacitance for proper device operation, lengthening of the capacitors in the vertical direction, and especially, lengthening of lower electrodes thereof, is required. With such vertical lengthening of the capacitor, a variety of technical problems in fabricating the DRAM devices can ensue, such as leaning or bending of the capacitor lower electrodes during or following fabrication.

SUMMARY

Embodiments of the inventive concepts provide semiconductor devices configured to prevent leaning or bending of capacitor lower electrodes.

Other embodiments of the inventive concepts provide fabricating methods that prevent capacitor lower electrodes from leaning or bending.

According to some embodiments of the inventive concepts, a capacitor lower electrode may be supported by a multi-layered supporting pattern. In some embodiments, at least one of layers constituting the multi-layered supporting pattern may be patterned without the requirement of additional or excessive photolithography processes.

In an aspect, a semiconductor device comprises: a substrate; a plurality of storage nodes on the substrate and extending in a vertical direction relative to the substrate; a lower support pattern in contact with the storage nodes between a bottom and a top of the storage nodes, the lower support pattern spaced apart from the substrate in the vertical direction; the lower support pattern having a first maximum thickness in the vertical direction; and an upper support pattern in contact with the storage nodes above the lower support pattern relative to the substrate, the upper support pattern spaced apart from the lower support pattern in the vertical direction, the lower support pattern having a second maximum thickness in the vertical direction that is greater than the first maximum thickness of the lower support pattern.

In some embodiments, a portion of the lower support pattern that extends between neighboring storage nodes has a substantially constant thickness.

In some embodiments, a portion of the upper support pattern that extends between neighboring storage nodes varies in thickness.

In some embodiments, the portion of the upper support pattern extending between neighboring storage nodes has an intermediate region of relatively greater thickness than first and second end regions thereof.

In some embodiments, the intermediate region has a thickness that is the second maximum thickness.

In some embodiments, the end regions correspond to contact portions of the upper support pattern at which the upper support pattern makes contact with the storage nodes and wherein the intermediate region corresponds to intermediate portions of the upper support pattern between neighboring storage nodes.

In some embodiments, the storage nodes each have a height in the vertical direction between a bottom and a top of the storage node; and the lower support pattern is positioned at a position in the vertical direction that is greater than or equal to a half of the height of the storage nodes.

In some embodiments, the lower support pattern has a first vertical cross-sectional profile; and the upper support pattern has a second vertical cross-sectional profile that is different than the first cross-sectional profile.

In some embodiments, the storage nodes are arranged in rows and columns; the lower support pattern has a plurality of openings, each opening extending between multiple pairs of neighboring storage nodes of the array of storage nodes, wherein multiple openings are present between neighboring rows of the array of storage nodes and wherein multiple openings are present between neighboring columns of the array of storage nodes; wherein the upper support pattern has a plurality of openings, each opening extending between multiple pairs of neighboring storage nodes of the array of storage nodes, wherein multiple openings are present between neighboring rows of the array of storage nodes and wherein multiple openings are present between neighboring columns of the array of storage nodes; and the openings of the lower support pattern and the openings of the upper support pattern correspond with each other in the vertical direction.

In some embodiments, at least one of the openings is elongated so as to have a width that corresponds to a distance between directly neighboring storage nodes arranged in neighboring rows and so as to have a length that corresponds to a distance between storage nodes arranged in the same column.

In some embodiments, the width of the at least one of the openings corresponds to a distance between centers of the storage nodes arranged in neighboring rows.

In some embodiments, the width of the at least one of the openings corresponds to a distance between sidewalls of the storage nodes arranged in neighboring rows.

In some embodiments, the openings are arranged in a zig-zag pattern wherein a set of first openings are arranged between first neighboring rows and a set of second openings are arranged between second neighboring rows, the set of first openings alternating with the second set of openings, and wherein the positions of the first openings and the second of openings are offset with regard to their column positions.

In some embodiments, the openings are arranged in a linear pattern wherein the openings extend between neighboring rows of storage nodes.

In some embodiments, each storage node comprises a capacitor including a lower electrode, a capacitor dielectric layer covering the lower electrode, and an upper electrode covering the dielectric layer.

In some embodiments, each storage node further comprises an insulative protective layer covering the upper electrode layer.

In some embodiments, the semiconductor device further comprises an etch stop layer at sidewalls of a portion proximal to the bottoms of the storage nodes.

In some embodiments, the semiconductor device further comprises a plurality of contact plugs, each in contact with a corresponding storage node.

In some embodiments, the lower support pattern comprises silicon nitride.

In some embodiments, the upper support pattern comprises silicon nitride.

In another aspect, a semiconductor device, comprises: a substrate; a plurality of storage nodes on the substrate and extending in a vertical direction relative to the substrate, the storage nodes each having a height in the vertical direction between a bottom and a top of the storage node; a lower support pattern in contact with the storage nodes between the bottom and the top of the plurality of storage nodes, the lower support pattern spaced apart from the substrate in the vertical direction; an upper support pattern in contact with the storage nodes above the lower support pattern relative to the substrate, the upper support pattern spaced apart from the lower support pattern in the vertical direction; and wherein the lower support pattern is positioned at a position in the vertical direction that is greater than or equal to a half of the height of the storage nodes.

In some embodiments, the lower support pattern has a first maximum thickness in the vertical direction; and wherein the lower support pattern has a second maximum thickness in the vertical direction that is greater than the first maximum thickness of the lower support pattern.

In another aspect, a semiconductor device comprises: a substrate; a plurality of storage nodes extending in a vertical direction relative to the substrate; a lower support pattern in contact with the storage nodes between a bottom and a top of the plurality of storage nodes, the lower support pattern spaced apart from the substrate in the vertical direction; the lower support pattern having a first vertical cross-sectional profile; and an upper support pattern in contact with the storage nodes above the lower support pattern relative to the substrate, the upper support pattern spaced apart from the lower support pattern in the vertical direction, the lower support pattern having a second vertical cross-sectional profile, wherein the second vertical cross-sectional profile is different than the first vertical cross-sectional profile.

In some embodiments, the lower support pattern has a thickness that is substantially constant.

In some embodiments, the upper support pattern has a thickness that varies substantially.

In some embodiments, a portion of the upper support pattern that extends between neighboring storage nodes varies in thickness.

In some embodiments, the portion of the upper support pattern extending between neighboring storage nodes has an intermediate region of relatively greater thickness than first and second end regions thereof.

In some embodiments, the end regions correspond to contact portions of the upper support pattern at which the upper support pattern makes contact with the storage nodes and wherein the intermediate region corresponds to intermediate portions of the upper support pattern between neighboring storage nodes.

In some embodiments, the lower support pattern has a first maximum thickness in the vertical direction; and wherein the lower support pattern has a second maximum thickness in the vertical direction that is greater than the first maximum thickness of the lower support pattern.

In another aspect, a semiconductor device comprises: a substrate; a plurality of storage nodes extending in a vertical direction relative to the substrate, the storage nodes being arranged in rows and columns; a lower support pattern in contact with the storage nodes between a bottom and a top of the plurality of the storage nodes, the lower support pattern spaced apart from the substrate; the lower support pattern having a plurality of openings, each opening extending between multiple pairs of neighboring storage nodes of the array of storage nodes, wherein multiple openings are present between neighboring rows of the array of storage nodes and wherein multiple openings are present between neighboring columns of the array of storage nodes; and an upper support pattern in contact with the storage nodes above the lower support pattern relative to the substrate, the upper support pattern spaced apart from the lower support pattern in the vertical direction, the upper support pattern having a plurality of openings, each opening extending between multiple pairs of neighboring storage nodes of the array of storage nodes, wherein multiple openings are present between neighboring rows of the array of storage nodes and wherein multiple openings are present between neighboring columns of the array of storage nodes, wherein the openings of the lower support pattern and the openings of the upper support pattern correspond with each other in the vertical direction.

In some embodiments, the openings of the lower support pattern each expose multiple storage nodes of the array of storage nodes, and wherein the openings of the upper support pattern each expose multiple storage nodes of the array of storage nodes.

In another aspect, a semiconductor device comprises: a substrate; a plurality of storage nodes extending in a vertical direction relative to the substrate, the storage nodes being arranged in rows and columns; a lower support pattern in contact with the storage nodes between a bottom and a top of the plurality of the storage nodes, the lower support pattern spaced apart from the substrate; the lower support pattern having a plurality of openings, each opening exposing multiple storage nodes of the array of storage nodes, wherein multiple openings are present between neighboring rows of the array of storage nodes and wherein multiple openings are present between neighboring columns of the array of storage nodes; and an upper support pattern in contact with the storage nodes above the lower support pattern relative to the substrate, the upper support pattern spaced apart from the lower support pattern in the vertical direction, the upper support pattern having a plurality of openings, each opening exposing multiple storage nodes of the array of storage nodes, wherein multiple openings are present between neighboring rows of the array of storage nodes and wherein multiple openings are present between neighboring columns of the array of storage nodes, wherein the openings of the lower support pattern and the openings of the upper support pattern correspond with each other in the vertical direction.

In another aspect, a method of forming a semiconductor device, comprises: forming a plurality of storage nodes in a vertical direction relative to a substrate through a mold stack, the mold stack comprising a lower mold layer on the substrate, a lower support layer on the lower mold layer, an upper mold layer on the lower support layer, and an upper support layer on the upper mold layer; patterning the upper support layer to form an upper support pattern having a plurality of openings, each opening extending between multiple pairs of neighboring storage nodes of the array of storage nodes, removing the upper mold layer; and patterning the lower support layer using the upper support pattern as an etch mask to form a lower support pattern having a plurality of openings.

In some embodiments, multiple openings are present between neighboring rows of the array of storage nodes and wherein multiple openings are present between neighboring columns of the array of storage nodes.

In some embodiments, patterning the lower support layer forms the lower support pattern to have a plurality of openings that correspond with the openings in the upper support layer in the vertical direction.

In some embodiments, removing the upper mold layer comprises performing a wet etch to remove the upper mold layer.

In some embodiments, removing the upper mold layer comprises removing the upper mold layer using the plurality of openings in the upper support layer.

In some embodiments, the method further comprises removing the lower mold layer.

In some embodiments, removing the upper mold layer comprises removing the upper mold layer using the plurality of openings in the upper support layer.

In some embodiments, removing the lower mold layer comprises performing a wet etch to remove the lower mold layer.

In some embodiments, the lower support pattern is in contact with the storage nodes and a portion of the lower support pattern that extends between neighboring storage nodes has a substantially constant thickness.

In some embodiments, the upper support pattern is in contact with the storage nodes and a portion of the upper support pattern that extends between neighboring storage nodes varies in thickness.

In some embodiments, the portion of the upper support pattern extending between neighboring storage nodes has an intermediate region of relatively greater thickness than first and second end regions thereof.

In some embodiments, the intermediate region has a thickness that corresponds to a maximum thickness of the upper support pattern, and wherein the maximum thickness of the upper support pattern is greater than a maximum thickness of the lower support pattern.

In some embodiments, the end regions correspond to contact portions of the upper support pattern at which the upper support pattern makes contact with the storage nodes and wherein the intermediate region corresponds to intermediate portions of the upper support pattern between neighboring storage nodes.

In some embodiments: the storage nodes each have a height in the vertical direction between a bottom and a top of the storage node; and the lower support pattern is positioned at a position in the vertical direction that is greater than or equal to a half of the height of the storage nodes.

In some embodiments, the lower support pattern has a first vertical cross-sectional profile; and the upper support pattern has a second vertical cross-sectional profile that is different than the first cross-sectional profile.

In some embodiments, the storage nodes are arranged in rows and columns; the lower support pattern has a plurality of openings, each opening extending between multiple pairs of neighboring storage nodes of the array of storage nodes, wherein multiple openings are present between neighboring rows of the array of storage nodes and wherein multiple openings are present between neighboring columns of the array of storage nodes; the upper support pattern has a plurality of openings, each opening extending between multiple pairs of neighboring storage nodes of the array of storage nodes, wherein multiple openings are present between neighboring rows of the array of storage nodes and wherein multiple openings are present between neighboring columns of the array of storage nodes; and the openings of the lower support pattern and the openings of the upper support pattern correspond with each other in the vertical direction.

In some embodiments, forming the plurality of storage nodes comprises: forming a plurality of lower electrodes, forming a capacitor dielectric layer on the plurality of lower electrodes; forming an upper electrode layer on the capacitor dielectric layer; and removing upper portions of the upper electrode layer to separate the upper electrode layer into a plurality of upper electrodes.

In some embodiments, patterning of the upper support layer to form the upper support pattern occurs following the forming of the plurality of lower electrodes and prior to forming the capacitor dielectric layer and forming the upper electrode layer.

In some embodiments, the patterning of the upper support layer to form the upper support pattern removes upper portions of the lower electrodes.

In some embodiments, the method further comprises forming an insulative protective layer on the storage nodes, following separation of the upper electrode layer into the plurality of upper electrodes.

In another aspect, a method of forming a semiconductor device, comprises: providing a first layer; providing a second layer on the first layer; providing a third layer on the second layer; providing vertical structures extending in a vertical direction through the second layer; patterning the third layer to form a third layer pattern having a plurality of openings; removing the second layer through the openings in the third layer using a wet etch process, exposing sidewalls of the vertical structures; and patterning the first layer using the third layer as an etch mask to form a plurality of openings in the first layer that correspond in the vertical direction with the openings in the third layer.

In another aspect, a memory system comprises: a memory controller that generates command and address signals; and a memory module comprising a plurality of memory devices, the memory module receiving the command and address signals and in response storing and retrieving data to and from at least one of the memory devices, wherein each memory device comprises: a substrate; a plurality of storage nodes on the substrate and extending in a vertical direction relative to the substrate; a lower support pattern in contact with the storage nodes between a bottom and a top of the storage nodes, the lower support pattern spaced apart from the substrate in the vertical direction; the lower support pattern having a first maximum thickness in the vertical direction; and an upper support pattern in contact with the storage nodes above the lower support pattern relative to the substrate, the upper support pattern spaced apart from the lower support pattern in the vertical direction, the lower support pattern having a second maximum thickness in the vertical direction that is greater than the first maximum thickness of the lower support pattern.

According to example embodiments of the inventive concepts, a semiconductor device may include a plurality of capacitors on a substrate, each of the capacitors comprising a lower electrode vertically extending from the substrate, a dielectric layer covering the lower electrode, and an upper electrode covering the dielectric layer and facing the lower electrode, and a supporting pattern being in contact with sidewalls of the lower electrodes and doubly supporting the lower electrodes at different levels. The supporting pattern may include an upper supporting pattern being in contact with sidewalls of upper end-portions of the lower electrodes, and a lower supporting pattern being in contact with sidewalls of the lower electrodes at a level downward spaced apart from the upper supporting pattern, the lower supporting pattern having the substantially same shape as the upper supporting pattern.

In some embodiments, the upper supporting pattern comprises upper line patterns extending parallel to a top surface of the substrate to cross each other, the upper line patterns partially surrounding the sidewalls of the upper end-portions of the lower electrodes.

In some embodiments, the upper supporting pattern is configured to have upper mesh openings, each of which is defined by the upper line patterns to expose some of the lower electrodes, wherein the upper mesh openings are arranged in a zigzag manner.

In some embodiments, the lower supporting pattern comprises lower line patterns extending along the upper line patterns to cross each other, the lower line patterns partially surrounding the sidewalls of the lower electrodes at the level downward spaced apart from the upper supporting pattern.

In some embodiments, the lower supporting pattern is configured to have lower mesh openings defined by lower upper line patterns, wherein the lower mesh openings are vertically aligned with the upper mesh openings and arranged in a zigzag manner.

In some embodiments, the upper line pattern has an uneven top surface, compared with the lower line pattern.

In some embodiments, the lower electrode comprises a recessed portion positioned under the upper mesh opening, wherein the lower electrodes with the recessed portions are alternatingly arranged along a direction on the substrate.

In some embodiments, the lower supporting pattern is provided at the same level as a center point of the lower electrode or at a level intermediate between the center point of the lower electrode and the upper supporting pattern.

In some embodiments, the upper supporting pattern has a thickness equivalent to or greater than the lower supporting pattern.

In some embodiments, the dielectric layer and the upper electrode are disposed to further cover the lower and upper supporting patterns.

According to other example embodiments of the inventive concepts, a semiconductor device may include at least one capacitor including a lower electrode electrically connected to a substrate, an upper electrode facing the lower electrode, and a dielectric layer interposed between the lower and upper electrodes to cover the lower electrode, and a multi-layered supporting pattern including upper and lower supporting patterns vertically spaced apart from each other to support the lower electrode at different levels. The upper supporting pattern has upper mesh openings exposing some of the lower electrodes, and the lower supporting pattern has the substantially same planar shape as the upper supporting pattern and has lower mesh openings vertically aligned with the upper mesh openings.

In some embodiments, the upper supporting pattern has an uneven top surface and the lower supporting pattern has an even top surface, compared with the upper supporting pattern.

In some embodiments, the upper supporting pattern comprises at least one thick portion and at least one thin portion, the thick portion being greater than the thin portion in terms of a width given by a distance between a pair of the lower electrodes adjacent to the thick or thin portion.

In some embodiments, the lower mesh openings have the same shape as the upper mesh openings.

In some embodiments, the lower electrode comprises a recessed portion under the upper mesh opening, thereby having an 'L'-shaped vertical section.

In some embodiments, the upper and lower supporting patterns are formed to have a line structure including a plurality of first patterns disposed parallel to each other on the substrate to support the lower electrode, or a mesh structure including the first patterns and a plurality of second patterns disposed between the first patterns to connect the first patterns with each other.

In some embodiments, the upper supporting pattern and the lower supporting pattern are aligned with each other in plan view.

According to other example embodiments of the inventive concepts, a semiconductor device may include a semiconductor substrate, a plurality of capacitors, each of which includes a lower electrode vertically standing up on the semiconductor substrate, an upper electrode facing the lower electrode, and a dielectric layer interposed between the lower and upper electrodes to cover the lower electrode, an upper supporting pattern being in contact with sidewalls of upper end-portions of the lower electrodes to support the capacitors, and a lower supporting pattern being in contact with sidewalls of the lower electrodes at a level downward spaced apart from the upper supporting pattern to support the capacitors. The lower supporting pattern has the substantially same planar shape as the upper supporting pattern and has an uneven top surface, compared with the lower supporting pattern.

In some embodiments, the upper supporting pattern comprises the same material as the lower supporting pattern and has a thickness equivalent to or greater than the lower supporting pattern.

In some embodiments, the lower electrode is shaped like a cup or cylinder having inner and outer sidewalls, and the upper and lower supporting patterns are in direct contact with the outer sidewall of the lower electrode.

According to still example embodiments of the inventive concepts, a method of fabricating a semiconductor device may include forming a mold stack on semiconductor substrate, forming a lower electrode vertically penetrating the mold stack to be electrically connected to the semiconductor substrate, and patterning the mold stack to form a multi-layered supporting pattern including upper and lower supporting patterns vertically spaced apart from each other to support the lower electrode. The lower supporting pattern may be patterned using the upper supporting pattern as an etching mask and have the substantially same shape as the upper supporting pattern.

In some embodiments, the forming of the mold stack includes sequentially stacking a lower mold layer, a lower supporting layer, an upper mold layer, and an upper supporting layer on the semiconductor substrate, and each of the upper and lower mold layers includes an insulating layer having an etch selectivity with respect to the upper and lower supporting layers.

In some embodiments, the forming of the mold stack further includes forming an etch stop layer between the lower mold layer and the semiconductor substrate.

In some embodiments, the forming of the multi-layered supporting pattern includes patterning the upper supporting layer to form the upper supporting pattern partially surrounding and supporting an upper sidewall of the lower electrode, and patterning the lower supporting layer by an etching process using the upper supporting pattern as an etch mask to form the lower supporting pattern partially surrounding and supporting a lower sidewall of the lower electrode.

In some embodiments, the forming of the upper supporting pattern includes patterning the upper supporting layer to form an upper mesh opening penetrating the upper supporting layer and exposing a portion of the upper mold layer disposed below the upper supporting layer.

In some embodiments, the method may further include removing the upper mold layer by supplying an etchant through the upper mesh opening to form an upper space separating the upper supporting pattern from the lower supporting layer, before the limning of the lower supporting pattern.

In some embodiments, the method may further include forming a protection layer to cover a portion of the lower electrode exposed by at least one of the upper mesh opening and the upper space, after the forming of the upper space.

In some embodiments, the forming of the lower supporting pattern includes patterning the lower supporting layer to form a lower mesh opening penetrating the lower supporting layer and exposing a portion of the lower mold layer disposed below the lower supporting layer.

In some embodiments, the lower mesh opening may be formed to have the substantially same shape as the upper mesh opening.

In some embodiments, the method may further include removing the lower mold layer by supplying an etchant through the lower mesh opening to form a lower space separating the lower supporting pattern from the semiconductor substrate, after the forming of the lower supporting pattern.

In some embodiments, the forming of the upper supporting pattern may be performed to etch a portion of the lower electrode exposed by the upper mesh opening, during the forming of the upper mesh opening.

In some embodiments, the forming of the lower supporting pattern may be performed to partially remove the upper supporting pattern during the patterning of the lower supporting layer, such that the upper supporting pattern has an uneven top surface profile.

In some embodiments, the method may further include forming a dielectric layer covering at least one of the lower electrode or the multi-layered supporting pattern, and forming an upper electrode covering the dielectric layer. The lower electrode, the dielectric layer, and the upper electrode constitute a capacitor electrically connected to the semiconductor substrate.

According to example embodiments of the inventive concepts, a method of fabricating a semiconductor device may include sequentially stacking a lower mold layer, a lower supporting layer, an upper mold layer, and an upper supporting layer on a semiconductor substrate to form a mold stack; forming a lower electrode vertically penetrating the mold stack to be electrically connected to the semiconductor substrate; patterning the upper supporting layer to form an upper supporting pattern partially surrounding and supporting an upper sidewall of the lower electrode, the upper supporting pattern having an upper mesh opening exposing a portion of the lower electrode; removing the upper mold layer through the upper mesh opening to expose the lower mold layer; patterning the lower supporting layer to form a lower supporting pattern partially surrounding and supporting a lower sidewall of the lower electrode, the lower supporting pattern having an lower mesh opening exposing the lower mold layer; removing the lower mold layer exposed by the lower mesh opening; and sequentially forming a dielectric layer and an upper electrode to form a capacitor electrically connected to the semiconductor substrate.

In some embodiments, the forming of the lower supporting pattern comprises patterning the lower supporting layer by an etching process using the upper supporting pattern as an etch mask to form the lower supporting pattern having the same planar shape as the upper supporting pattern.

In some embodiments, the forming of the lower supporting pattern is performed to partially etch the upper supporting pattern, such that the upper supporting pattern has an uneven top surface profile.

In some embodiments, the forming of the capacitor may include forming the dielectric layer covering a surface of the lower electrode, and forming an upper electrode covering the dielectric layer. The dielectric layer is formed to further cover surfaces of the lower and upper supporting patterns.

BRIEF DESCRIPTION OF THE DRAWINGS

The accompanying drawings are included to provide a further understanding of the inventive concept, and are incorporated in, and constitute a part of, this specification. The drawings illustrate exemplary embodiments of the inventive concept and, together with the description, serve to explain principles of the inventive concept. In the drawings.

Figure 1A:
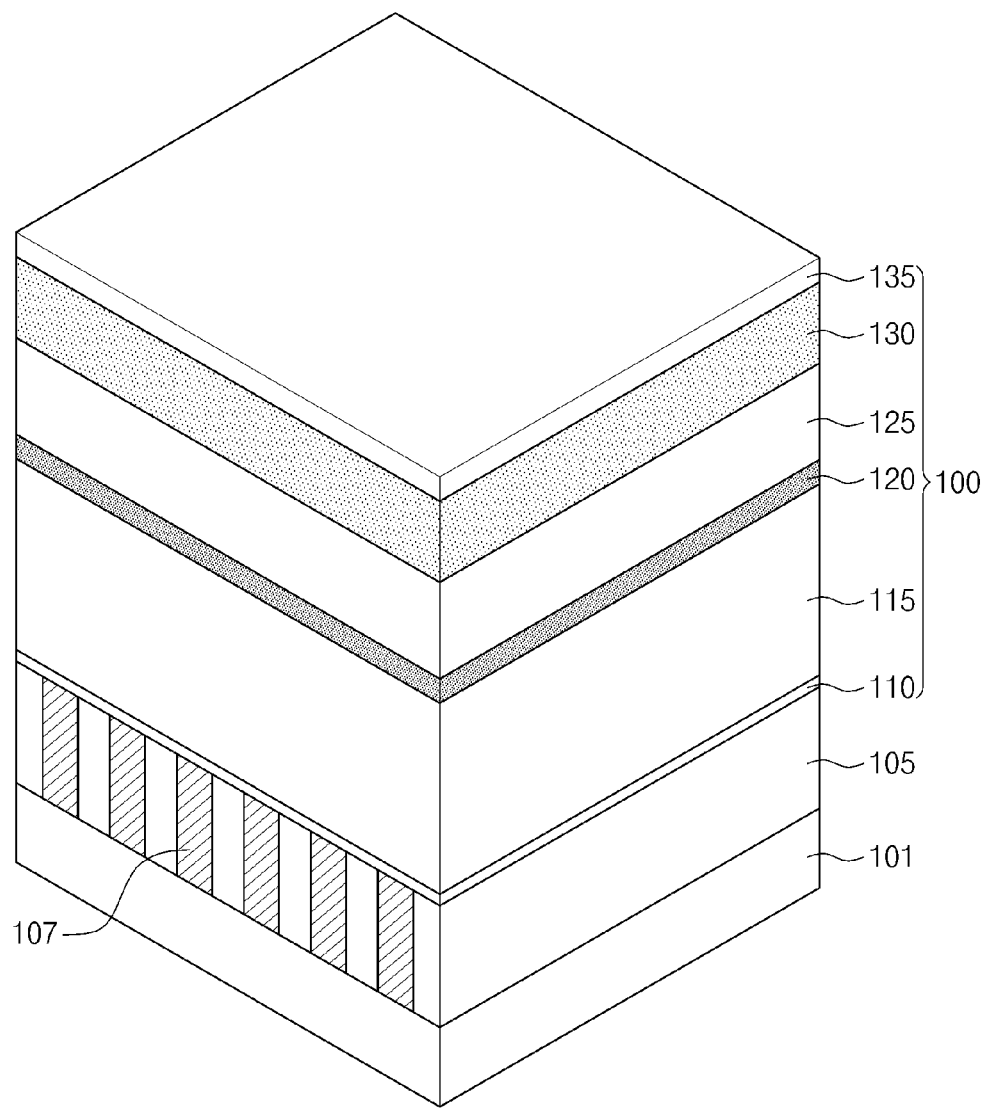
FIGS. 1A through 1M are perspective views illustrating a method of fabricating a semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 1M are perspective views illustrating a method of fabricating a semiconductor device according to example embodiments of the inventive concepts. Here, FIG. 1J is a perspective view selectively illustrating some elements of the structure shown in FIG. 1I, and FIG. 1M is a perspective view selectively illustrating some elements of the structure shown in FIG. 1K.

Referring to FIG. 1A, an interlayer dielectric layer 105 may be formed on a semiconductor substrate 101, and a mold stack 100 may be formed on the interlayer dielectric layer 105. Although not depicted in FIG. 1A, a plurality of word lines and a plurality of bit lines may be formed on the semiconductor substrate 101. In some embodiments, the word and bit lines may be disposed to cross each other, from a plan-view perspective, and be covered by the interlayer dielectric layer 105. Junction regions may be formed in the semiconductor substrate 101 at both sides of the word line, and contact plugs 107 may penetrate vertically through the interlayer dielectric layer 105 to be connected to the junction regions.

The formation of the mold stack 100 may include the depositing of a plurality of insulating layers. Here, at least two of the insulating layers may have an etch selectivity with respect to each other; this enables the selective etching of the various insulating layers of the mold stack 100. In some embodiments, the mold stack 100 may include a lower mold layer 115, a lower supporting layer 120, an upper mold layer 125, and an upper supporting layer 130. The lower and upper mold layers 115 and 125 may be formed of oxide and the lower and upper supporting layers 120 and 130 may be formed of nitride, or vice versa. In some embodiments, the lower and upper mold layers 115 and 125 may be formed of silicon oxide, and the lower and upper supporting layers 120 and 130 may be formed of silicon nitride. In some embodiments, a vertical height of a capacitor lower electrode 155 shown in FIG. 1D may be determined by a vertical height of the mold stack 100.

In other embodiments, the mold stack 100 may further include an etch stop layer 110 and/or a buffer layer 135. For example, the etch stop layer 110 may be formed between the lower mold layer 115 and the interlayer dielectric layer 105. The buffer layer 135 may be formed on the upper supporting layer 130. At least one of the etch stop layer 110 and the buffer layer 135 may be formed of oxide or nitride. In some embodiments, the etch stop layer 110 may be formed of silicon nitride, and the buffer layer 135 may be formed of silicon oxide.

Figure 1B:
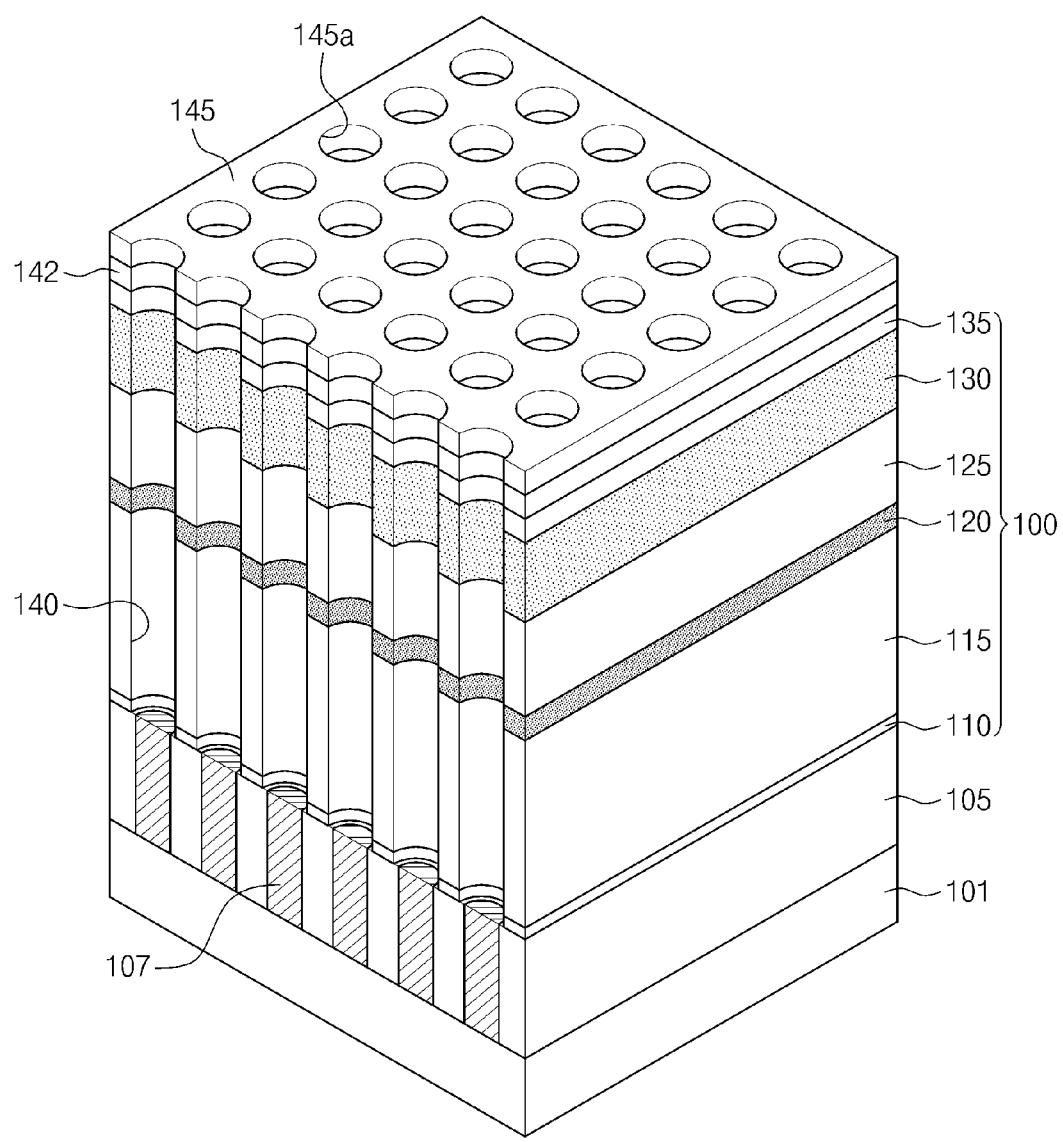

Referring to FIG. 1B, a plurality of capacitor holes 140 may be formed to vertically penetrate the mold stack 100 and to expose an upper portion of the contact plugs 107. The formation of the capacitor hole 140 may be performed using at least one of a wet etching process, a dry etching process, a mechanical drilling process, and a laser drilling process. In some embodiments, the formation of the capacitor hole 140 may include depositing a silicon nitride layer on the buffer layer 135 to form a first hard mask layer 142, forming a first photoresist pattern 145 on the first hard mask layer 142, and patterning the mold stack 100 to form the capacitor hole 140. Here, the first photoresist pattern 145 may be formed by coating and patterning a photoresist film and have a plurality of first openings 145a, each defining a position of the capacitor hole 140. In some embodiments, the first openings 145a may be vertically aligned to the contact plug 107 and have a circular shape in a plan view orientation. The patterning of the mold stack 100 may include a dry or wet etching process using the first photoresist pattern 145 as an etch mask. Accordingly, a planar section of the capacitor hole 140 may be dependent on the shape of the first opening 145a. In some embodiments, the capacitor hole 140 may be shaped like a circular cylinder. In other embodiments, the capacitor hole 140 may be shaped like a square pillar, when the first opening 145a is formed to have a square shape. The first photoresist pattern 145 and the first hard mask layer 142 may be removed after the formation of the capacitor hole 140.

Figure 1C:
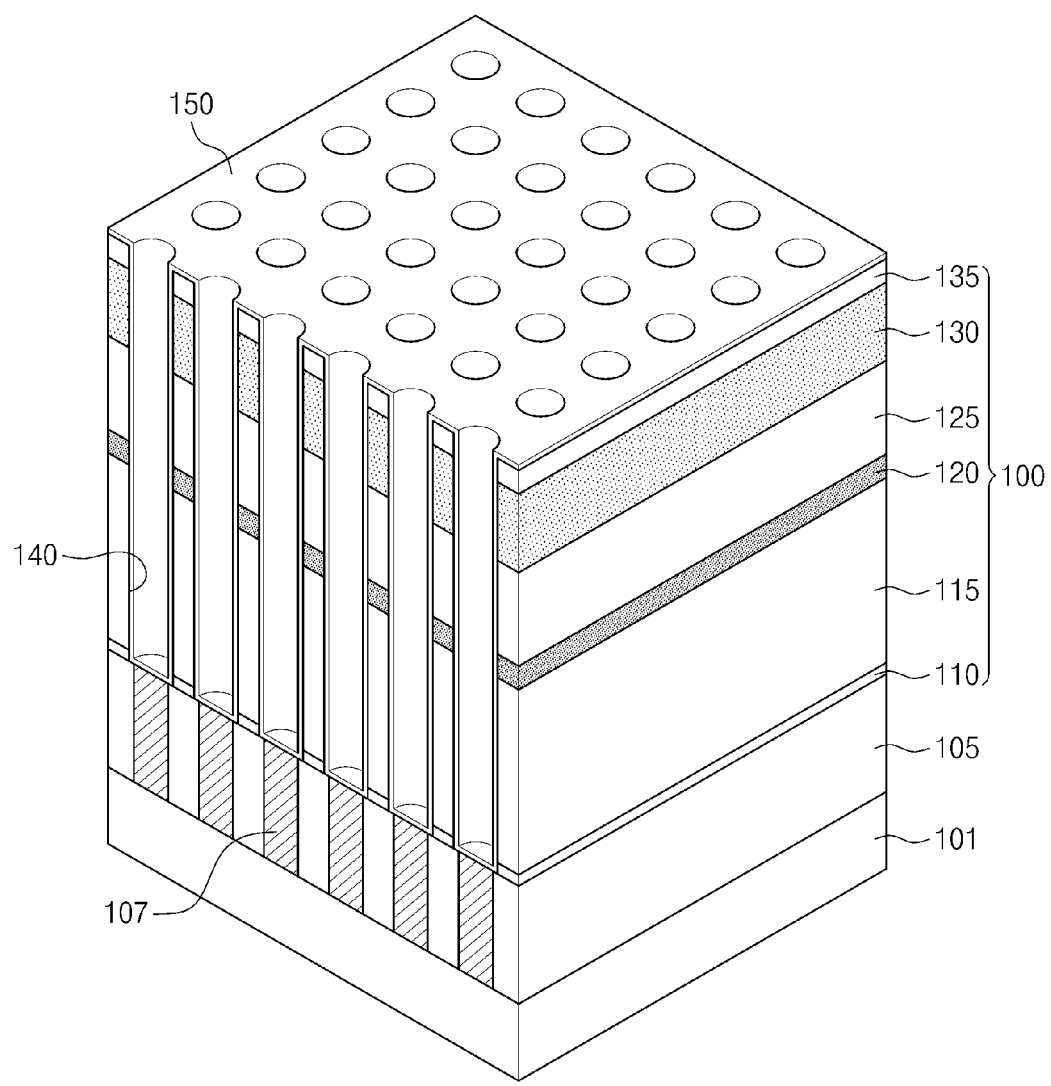

Referring to FIG. 1C, a lower electrode layer 150 may be formed on the resultant structure provided with the capacitor hole 140. In some embodiments, the lower electrode layer 150 may be conformally formed on the mold stack 100 using a chemical vapor deposition or a physical vapor deposition. The lower electrode layer 150 may be formed to cover a top surface of the mold stack 100 as well as an inner wall and a bottom surface of the respective capacitor holes 140. The lower electrode layer 150 may be formed of polysilicon, metal, or metal nitride. In some embodiments, the lower electrode layer 150 may be a titanium nitride (TiN) layer formed using a chemical vapor deposition process.

Figure 1D:
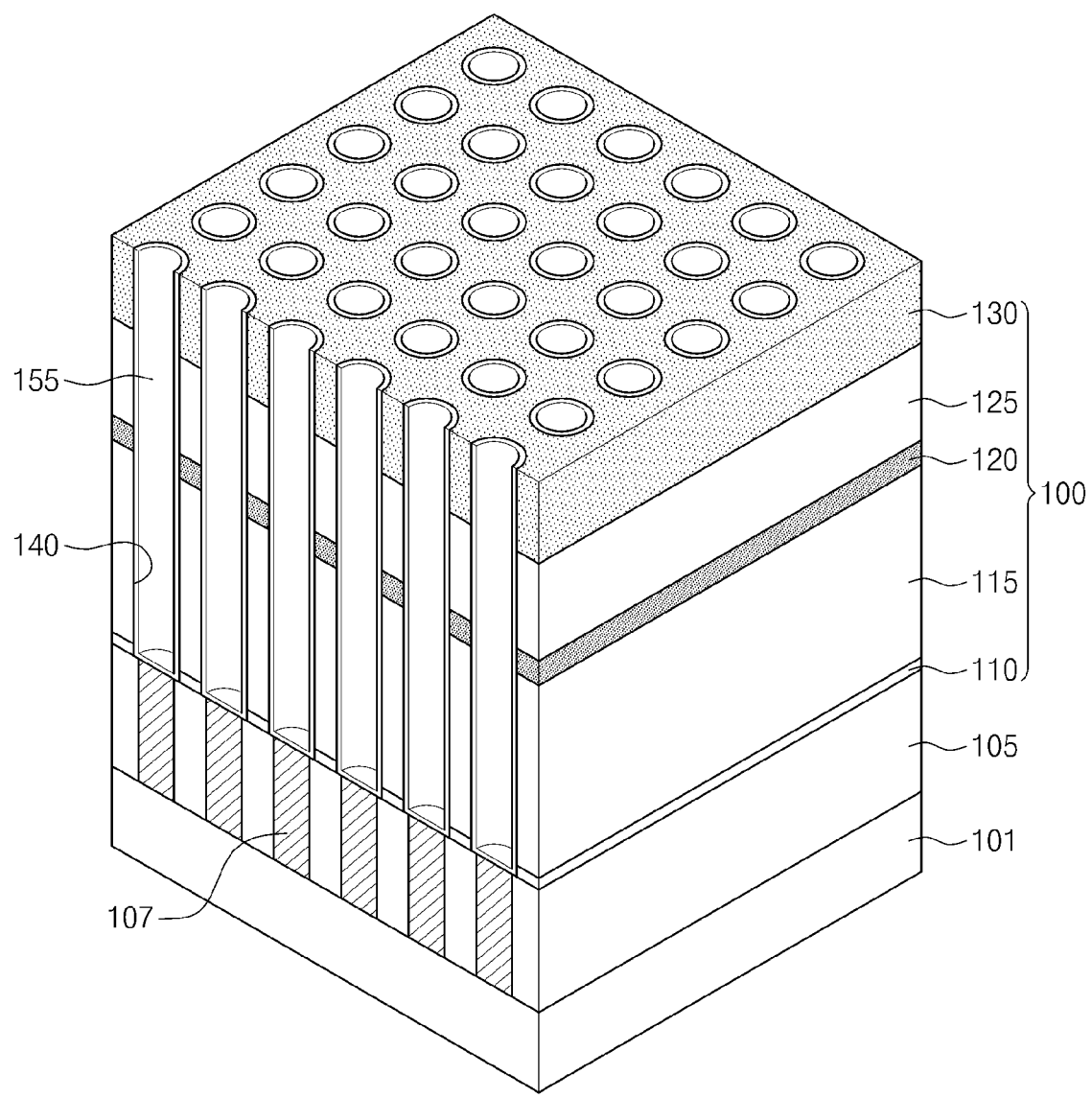

Referring to FIG. 1D, a node separation process may be performed to form a plurality of lower electrodes 155, each one to correspond with one of the plurality of contact plugs 107. The node separation process may include etching or polishing the lower electrode layer 150 to expose the top surface of the mold stack 100. In some embodiments, during the node separation process, the buffer layer 135 may be removed to expose a top surface of the upper supporting layer 130. In some embodiments, the lower electrode 155 may have a cup shape or a bottom-closed cylinder shape and have the substantially same vertical height as the mold stack 100.

Figure 1E:
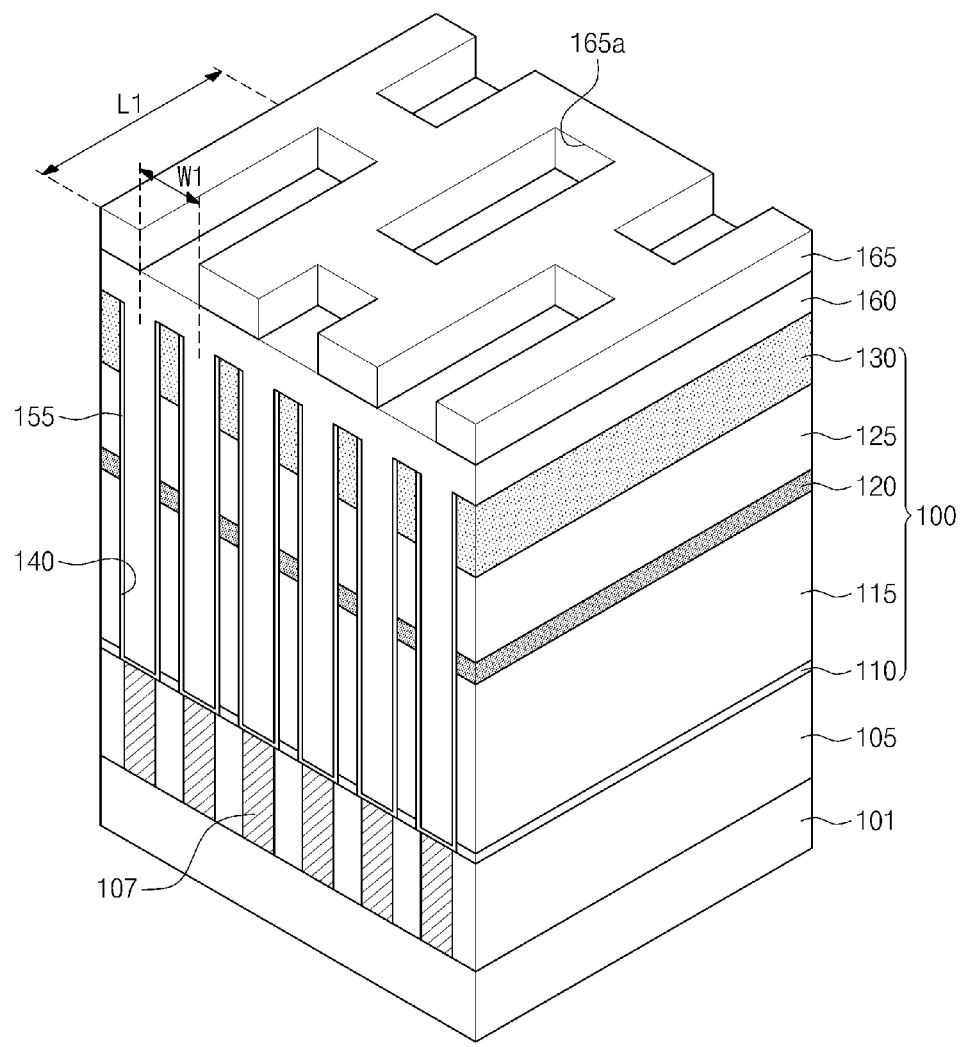

Referring to FIG. 1E, a second hard mask layer 160 may be formed to cover the mold stack 100. The second hard mask layer 160 may be formed on the mold stack 100 and a portion thereof may extend to fill inner spaces of the capacitor holes 140 and their corresponding lower electrodes 155. In some embodiments, the second hard mask layer 160 may be formed of oxide (e.g., a silicon oxide layer) or nitride (e.g., a silicon nitride layer), and the formation thereof may be performed using a deposition technique such as physical vapor deposition or a chemical vapor deposition. Thereafter, a second photoresist pattern 165 may be formed on the second hard mask layer 160 to have a plurality of second openings 165a. The second photoresist pattern 165 may be formed by coating and patterning a photoresist film. In some embodiments, the second openings 165a may be configured in a zig-zag arrangement. In some embodiments, each of the second openings 165a may be elongated in a generally rectangular shape having a first width W1 and a first length L1 in plan view, where the first width W1 may be equivalent to a space between centers of adjacent two of the lower electrodes 155 and the first length L1 may be equivalent to a maximum distance between centers of adjacent four of the lower electrodes 155. However, example embodiments of the inventive concepts may not be limited thereto, as will be described in more detail with reference to FIGS. 1F through 1I. In some embodiments, the number of the lower electrodes 155 to be exposed by the second openings 165a, when the second hard mask layer 160 is later patterned, may vary, depending on an area of the second opening 165a.

In some embodiments, the openings are elongated so as to have a width W1 that corresponds to a distance between directly neighboring lower electrodes 155 arranged in neighboring rows, and to have a length L1 that corresponds to a distance between storage nodes arranged in the same column.

In some embodiments, the second openings 165a are arranged in zig-zag pattern such that a first set of the openings 165a are arranged between first neighboring rows and a second set of openings are arranges between second neighboring rows. The set of first openings alternates with the second set of openings, such that the positions of openings of the first set and the positions of openings of the second set are offset with regard to their column positions.

Figure 1F:
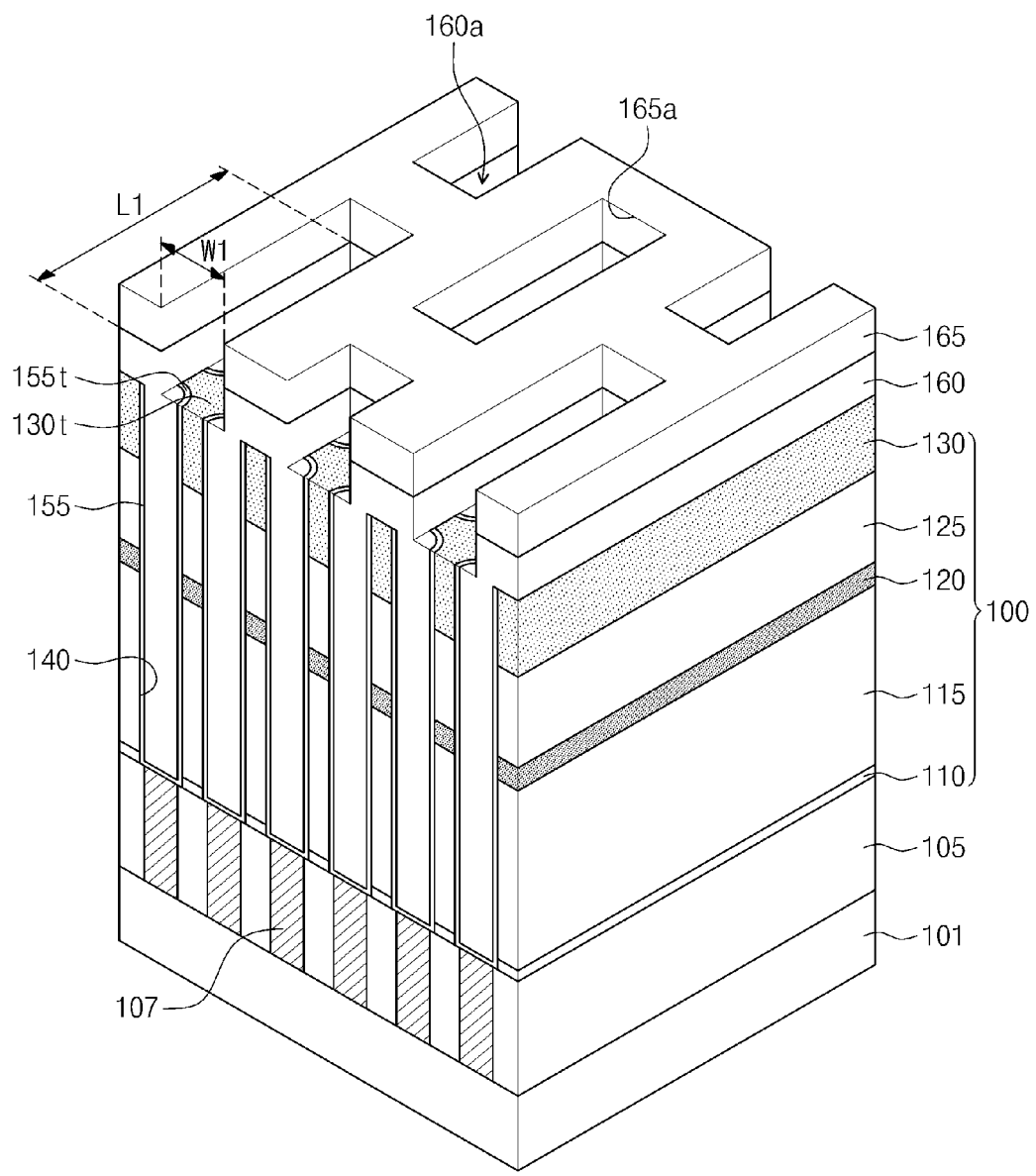

Referring to FIG. 1F, the second hard mask layer 160 may be patterned by an etching process using the second photoresist pattern 165 as an etch mask. For instance, in the case where the second hard mask layer 160 may be formed of a silicon oxide layer, the second hard mask layer 160 may be patterned by a wet etch or dry etch process using an etchant capable of selectively removing the silicon oxide layer. As a result of the patterning, the second hard mask layer 160 may be formed to have a plurality of open holes 160a exposing top surfaces 155t, or top portions, of the lower electrodes 155 and a top surface 130t of the upper supporting layer 130. Similar to the second openings 165a, the open holes 160a may be arranged in a zig-zag configuration and each of them may be generally rectangular in shape having the first width W1 and the first length L1 in plan view. After the formation of the open hole 160a, the second photoresist pattern 165 may be removed using an ashing process.

Figure 1G:
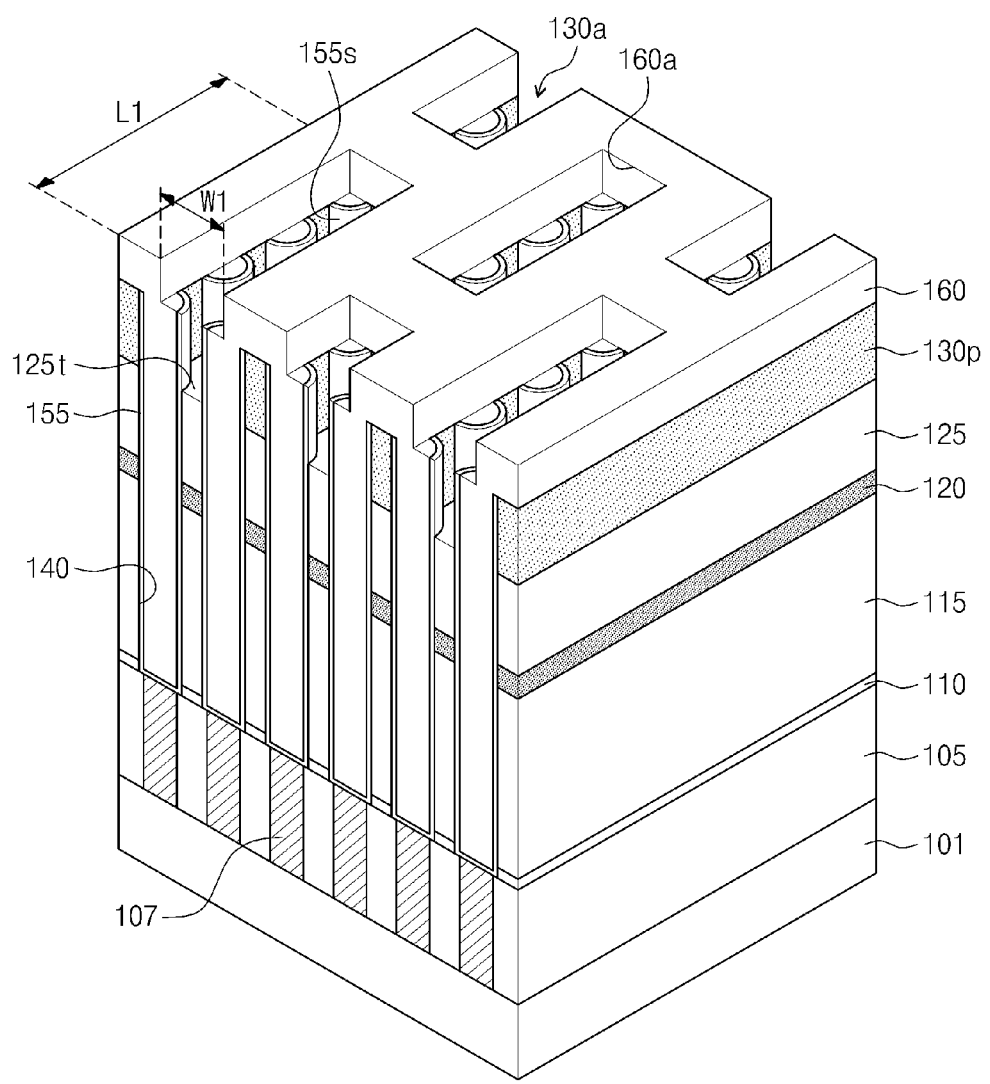

Referring to FIG. 1G, an etching process may be performed to selectively remove a portion of the upper supporting layer 130 exposed by the open hole 160a of the second hard mask layer 165. In some embodiments, the etching of the upper supporting layer 130 may be performed after or before the removal of the second photoresist pattern 165. As the result of the etching process, the upper supporting layer 130 may become an upper supporting pattern 130p having a plurality of upper mesh openings 130a. In some embodiments, the upper mesh openings 130a may be formed to partially expose sidewalls 155s of upper portions of the lower electrodes 155 and a top surface 125t of the upper mold layer 125, as shown in FIG. 1G. For instance, in a case where the upper supporting layer 130 is formed of a silicon nitride layer, the formation of the upper supporting pattern 130p may include etching the upper supporting layer 130 in a wet etch or dry etch process using an etchant capable of selectively removing the silicon nitride layer.

Figure 1H:
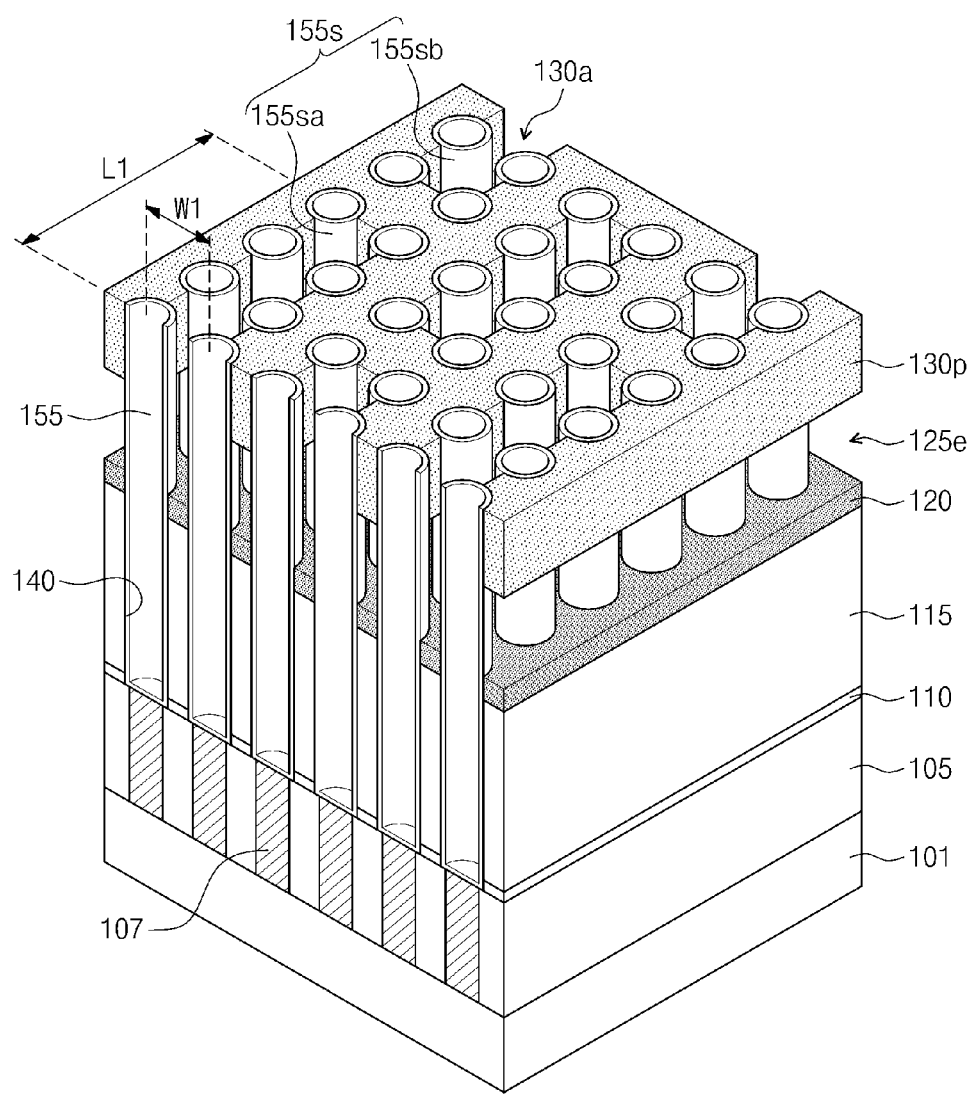
Figure 1I:
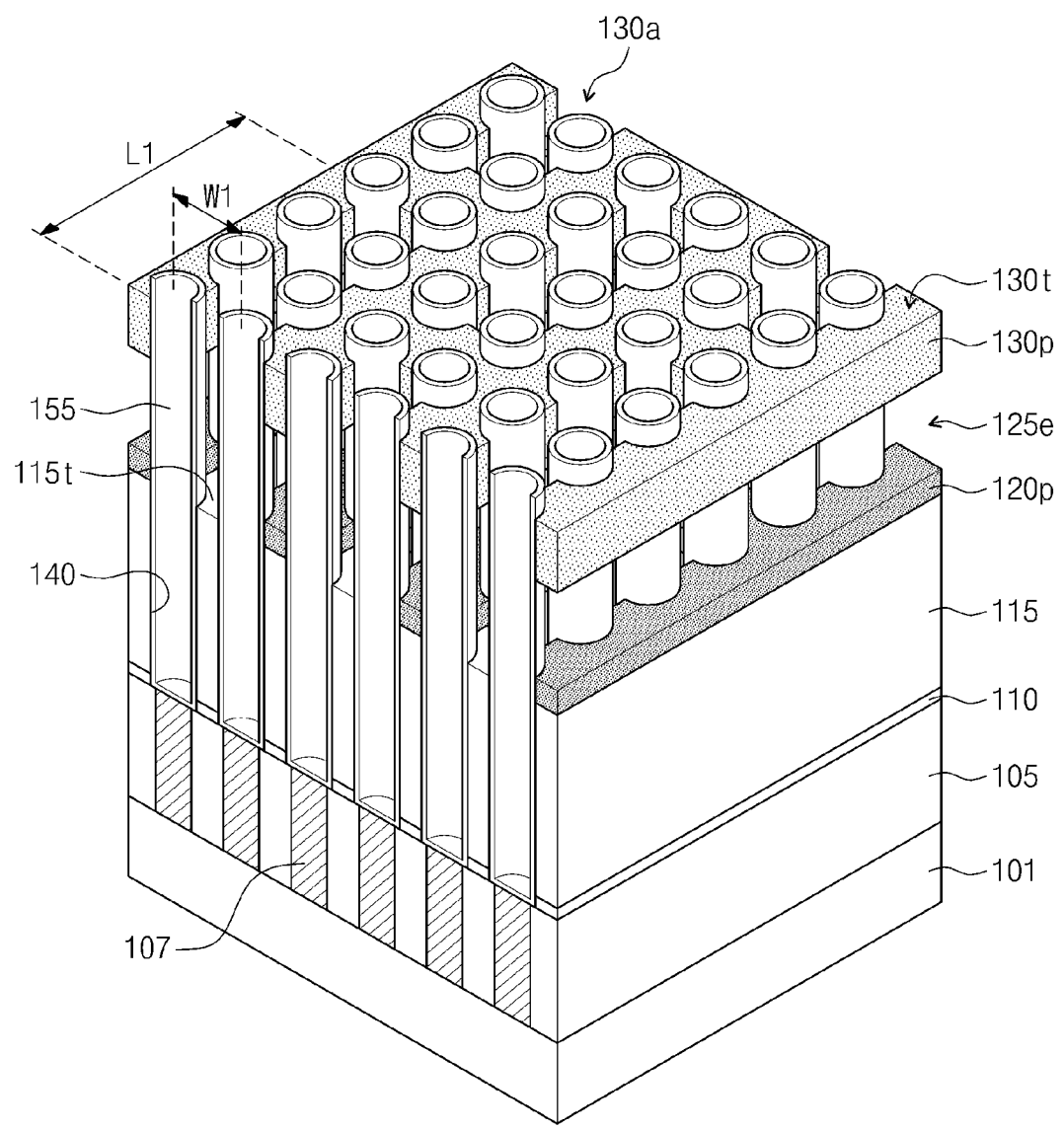
Figure 1J:
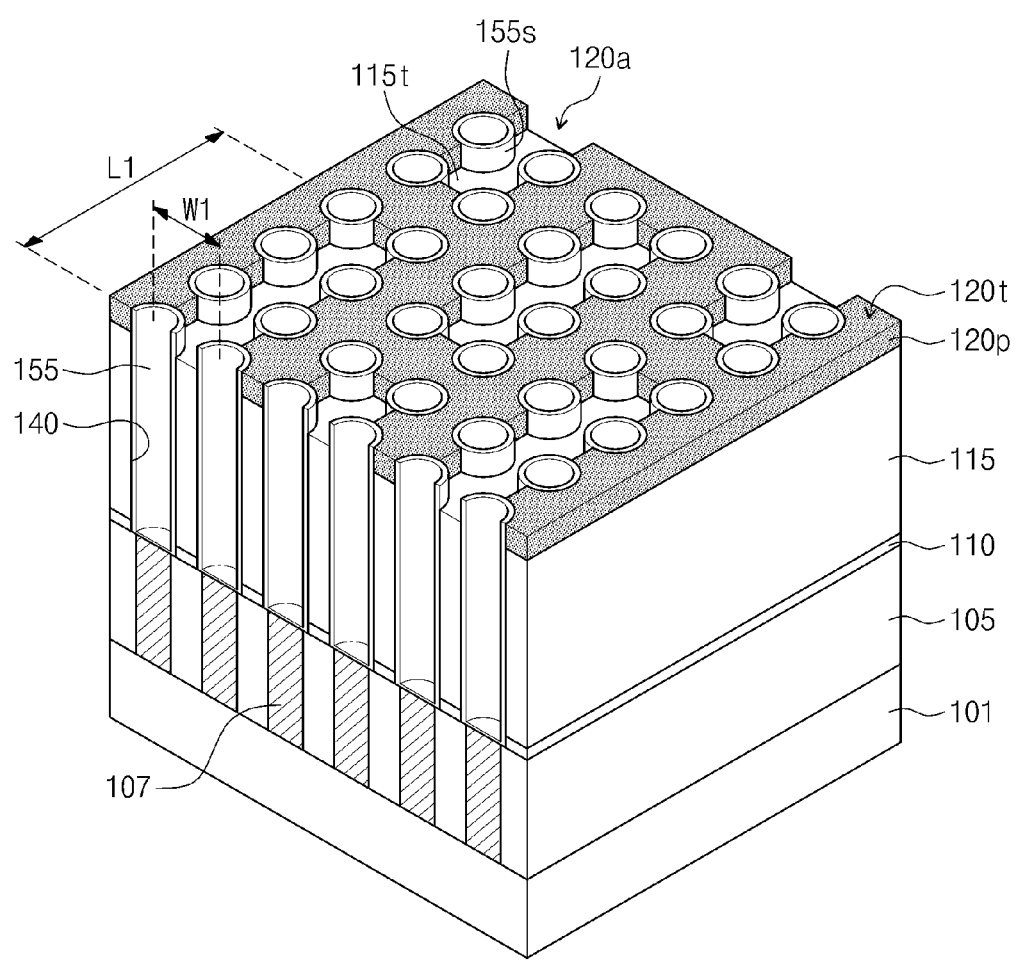

Referring to FIG. 1H, the second hard mask layer 160 and the upper mold layer 125 may be removed. In a case where the second hard mask layer 160 is formed of a silicon oxide layer, the second hard mask layer 160 may be removed in a wet or dry etch procedure using an etchant capable of selectively removing the silicon oxide layer. The upper mold layer 125 may be removed by supplying an etchant through the upper mesh opening 130a, following the removal of the second hard mask layer 160, or contemporaneous with the removal of the second hard mask layer 160. For instance, in a case that the upper mold layer 125 is formed of a silicon oxide layer, the upper mold layer 125 may be removed using a wet or dry etch procedure using an etchant capable of selectively removing the silicon oxide layer. In some embodiments, the second hard mask layer 160 and the upper mold layer 125 may be formed of an oxide (e.g., silicon oxide), and in this case, the second hard mask layer 160 and the upper mold layer 125 may be concurrently removed by a LAL lift-off process using a LAL solution containing ammonium fluoride ($NH_4F$), hydrogen fluoride (HF), and a water. In some embodiments, the upper mold layer 125 is removed through the openings 130a in the upper support pattern 130a.

As the result of the LAL lift-off process, an upper space 125e may be formed to separate the upper supporting pattern 130p from the lower supporting layer 120 so that they are spaced apart in a vertical direction. The lower electrodes 155 may be supported by the upper supporting pattern 130p, and sidewalls 155s of the lower electrodes 155 may be partially exposed by the upper mesh openings 130a. Similar to the open holes 160a of the second hard mask layer and/or the second openings 165a of the second photomask layer, the upper mesh openings 130a may be arranged in a zigzag configuration, and each of them may be shaped in a rectangular form, for example in the manner described above having the first width W1 and the first length L1 in plan view. In some embodiments, an amount or area of the sidewalls of the lower electrodes 155 exposed by the upper mesh opening 130a may vary, depending on the position thereof. For instance, in terms of the area exposed by the upper mesh opening 130a, the area of exposed sidewall of the lower electrodes 155 located at corners of the upper mesh openings 130a may be smaller than the area of exposed sidewall of the lower electrodes located at sides of the upper mesh openings 130a. The upper mesh opening 130a may expose a plurality of (for example, 4 or more) the lower electrodes 155. In some (for embodiments, such as the embodiment depicted at FIG. 1I, sidewall portions of eight lower electrodes 155 may be exposed by the upper mesh opening 130a. However, example embodiments of the inventive concepts are not necessarily limited thereto, and the number of the lower electrodes 155 exposed by the upper mesh opening 130a may vary depending on the area of the upper mesh opening 130a. For instance, the larger the upper mesh opening 130a, the greater the number of lower electrodes 155 exposed by the upper mesh opening 130a.

Referring to FIGS. 1I and 1J, the lower supporting layer 120 may be patterned to form a lower supporting pattern 120p. The patterning of the lower supporting layer 120 may include supplying an etchant through the upper mesh opening 130a to remove a portion of the lower supporting layer 120 exposed by the upper mesh opening 130a. In some embodiments, the patterning of the lower supporting layer 120 may be performed using a wet or dry etch procedure. As described herein with reference to FIGS. 2A and 2B, the lower supporting pattern 120p may be formed to have a substantially same or similar shape or pattern as that of the upper supporting pattern 130p. According to example embodiments of the inventive concepts, the shape of the upper supporting pattern 130p can be transferred to the lower supporting layer 120, without the need for an additional photolithography process. A lower pattern 12p, an upper pattern 13p, an empty space 14, and a supporting layer 15 in FIGS. 2A and 2B may correspond to the lower supporting pattern 120p, the upper supporting pattern 130p, the upper space 125e, and the lower electrode 155 in FIG. 1I, respectively.

The lower supporting pattern 120p may be formed to have a plurality of lower openings 120a. In some embodiments, the openings 120a can be formed in a mesh configuration, similar to those of the upper supporting pattern 130p. Similar to the upper mesh openings 130a of the upper supporting pattern 130p, the lower mesh openings 120a may have a rectangular shape having the first width W1 and the first length L1 in plan view, as shown in FIG. 1J. The lower mesh openings 120a may be formed to partially expose a top surface 115t of the lower mold layer 115 and the sidewalls 155s of the lower electrodes 155. The lower mesh openings 120a may be aligned to, or otherwise correspond with, the upper mesh openings 130a, in the vertical direction.

The upper supporting pattern 130p may become partially etched during the formation of the lower supporting pattern 120p. For instance, a portion of the upper supporting pattern 130p (e.g., an upper portion thereof) may be etched. In this case, the upper supporting pattern 130p may be caused to have a reduced thickness, as compared with an original thickness thereof. The etching amount of the upper supporting pattern 130p may vary depending on the etch rate of the upper supporting pattern 130p, relative to the etch rate of the lower supporting pattern 120p. In this sense, a thickness of the upper supporting layer 130, shown in FIG. 1A, may be determined in due consideration of the subordinate etching of the upper supporting pattern 130p, which may occur during the patterning (e.g., an etch-back process) of the lower supporting layer 120. As the result of the subordinate etching of the upper supporting pattern 130p, the lower electrode 155 may protrude in an upward, vertical, direction from a top surface of the upper supporting pattern 130p as shown in FIG. H.

In some embodiments, in a case where the upper supporting pattern 130p has an etch rate equivalent to, or similar to, that of the lower supporting layer 120 with respect to a specific etchant, the upper supporting layer 130 may be formed to have a thickness greater than the lower supporting layer 120. In other embodiments, in a case where the upper supporting pattern 130p has an etch rate that is less than that of the lower supporting layer 120 with respect to a specific etchant, the upper supporting layer 130 may be formed to have a thickness equivalent to or less than that of the lower supporting layer 120.

The difference in etch rate between the lower and upper supporting layers 120 and 130 may result in a change in thickness of the lower and upper supporting patterns 120p and 130p. Accordingly, in the case where the lower and upper supporting layers 120 and 130 are formed of the same material, the upper supporting layer 130 may be formed to have a thickness greater than the lower supporting layer 120, in consideration of the anticipated amount of etching, the etching margin, and so forth. In this case, the resulting upper supporting pattern 130p may have a thickness equivalent to, or greater than, the lower supporting pattern 120p.

In some embodiments, the top surface 130t of the upper supporting pattern 130p may be substantially flat. In other embodiments, the upper supporting pattern 130p may be partially etched during the formation of the lower supporting pattern 120p as described above, and, in this case, the upper supporting pattern 130p may have a generally uneven top surface 130t as will be described with reference to FIGS. 3A through 3C. Furthermore, the top surface 120t of the lower supporting pattern 120p may be relatively flat, planar, or even, as compared with the top surface 130t of the upper supporting pattern 130p.

Figure 1K:
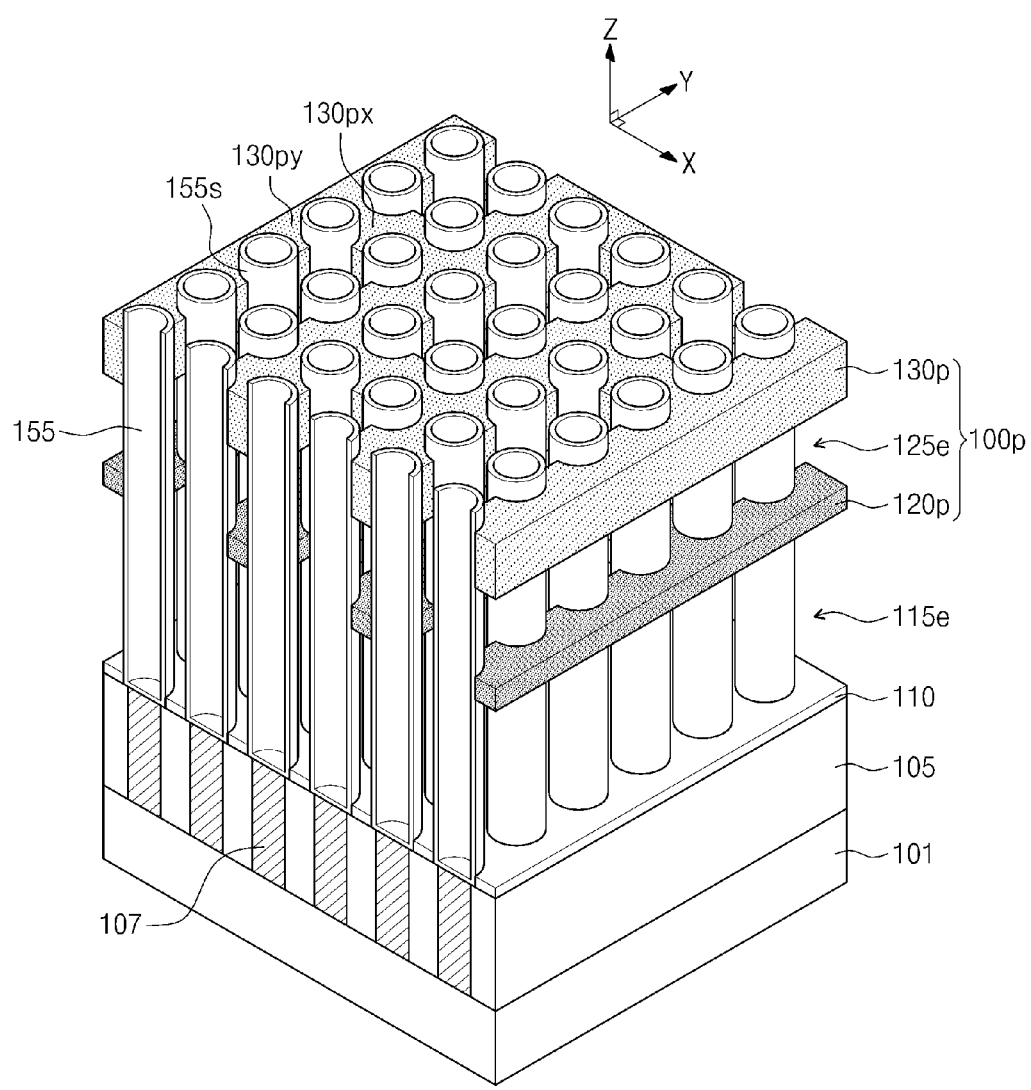

Referring to FIG. 1K, the lower mold layer 115 may be removed. The removal of the lower mold layer 115 may include supplying an etchant through the lower mesh opening 120a. In some embodiments, the lower mold layer 115 may be removed by a LAL lift-off process.

As the result of the removal of the lower mold layer 115, a lower space 115e may be formed to separate the lower supporting pattern 120p from the etch stop layer 110 so that they are spaced apart in the vertical direction. In other words, the lower space 115e may be formed between the lower supporting pattern 120p and the etch stop layer 110 or the ILD layer 105, and the upper space 125e may be formed between the lower supporting pattern 120p and the upper supporting pattern 130p. According to some embodiments of the inventive concepts, the lower and upper spaces 115e and 125e may be formed by twice-performing the LAL lift-off process.

The lower and upper supporting patterns 120p and 130p may be vertically spaced apart from each other by the upper space 125e to constitute a double-layered supporting pattern 100p supporting the lower electrodes 155. In some embodiments, each of the lower and upper supporting patterns 120p and 130p may be shaped in a mesh pattern as shown in FIG. 1K, and the lower and upper supporting patterns 120p and 130p may be in direct contact with lower and upper portions, respectively, of the lower electrode 155 vertically spaced apart from each other. Furthermore, the lower and upper supporting patterns 120p and 130p may be vertically aligned relative to each other in a z-direction, or vertical direction, that is parallel to a longitudinal axis of the lower electrodes 155. The upper supporting pattern 130p may include Y line patterns 130py and X line patterns 130px, which extend along y- and x-directions, respectively. Here, the x- and y-directions may be substantially orthogonal to each other and may be parallel to the top surface of the semiconductor substrate 101. The Y line patterns 130py may be in contact with the lower electrodes 155 to support the lower electrodes 155, and the X line patterns 130px may support the lower electrodes 155 and connect the Y line patterns 130py to each other. As a result, the upper supporting pattern 130p can robustly support or fasten the lower electrodes 155. The lower supporting pattern 120p can have the same technical features and effects as the upper supporting pattern 130p. For instance, the lower supporting pattern 120p may include line patterns extending parallel to Y and X line patterns 130py and 130px.

The upper supporting pattern 130p may be formed near an uppermost portion of the lower electrode 155, and the lower supporting pattern 120p may be formed thereunder. In some embodiments, the lower supporting pattern 120p may be formed at a level equivalent to or adjacent to a center point (or half height) of the lower electrode 155. In other embodiments, the lower supporting pattern 120p may be formed at a level intermediate between the center point of the lower electrode 155 and the upper supporting pattern 130p. In other embodiments, the lower support pattern 120p is positioned at a position in the vertical direction that is greater than or equal to one-half of a height of the lower electrodes, or storage nodes, wherein the storage nodes each have a height in the vertical direction that is between a bottom and a top of the storage nodes.

In order to reduce complexity in the drawings and to provide better understanding of example embodiments of the inventive concepts, the double-layered supporting pattern 100p is exemplarily described above. However, example embodiments of the inventive concepts may not be limited thereto; for instance, embodiments employing a three or more support pattern layers on the basis of the embodiments described above are equally applicable to the present inventive concepts.

Figure 1L:
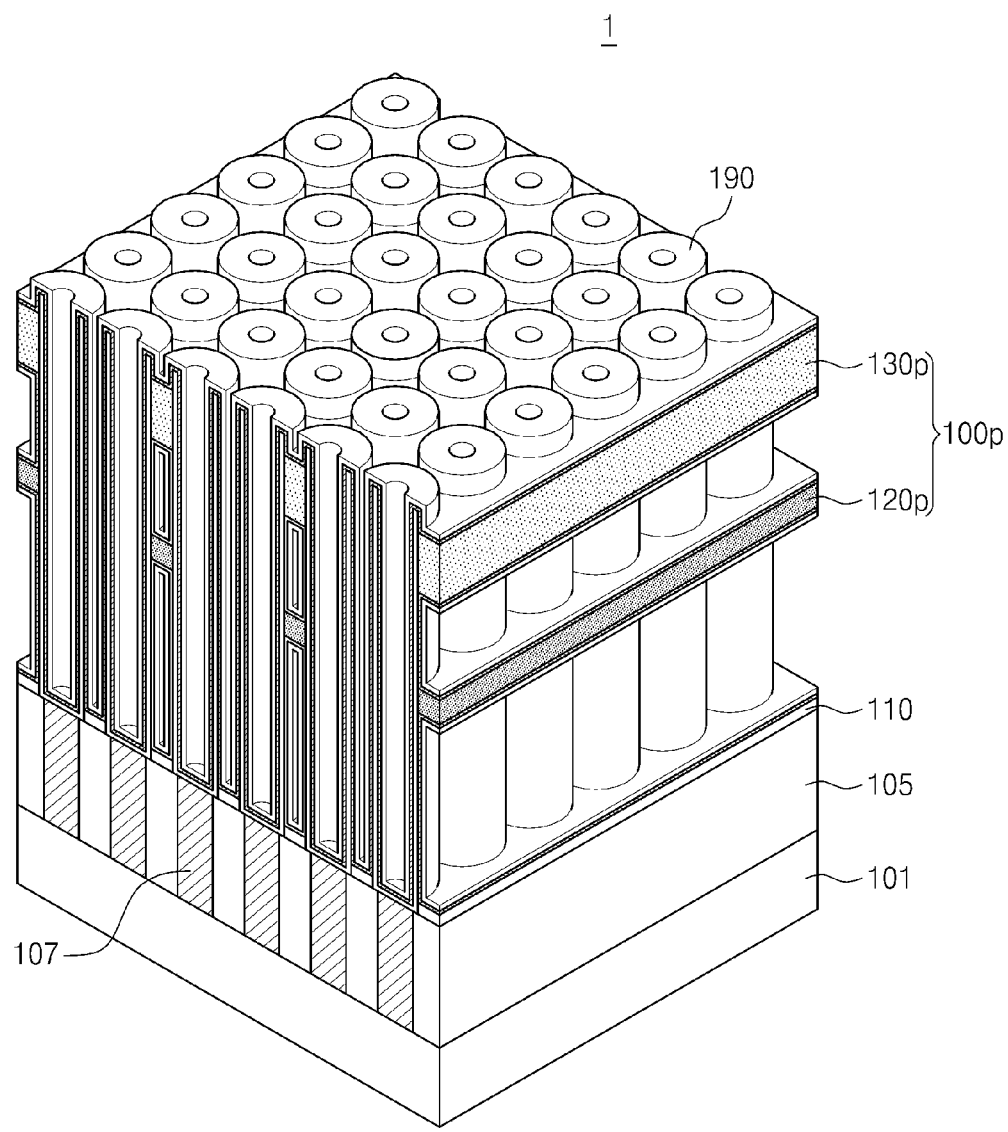
Figure 1M:
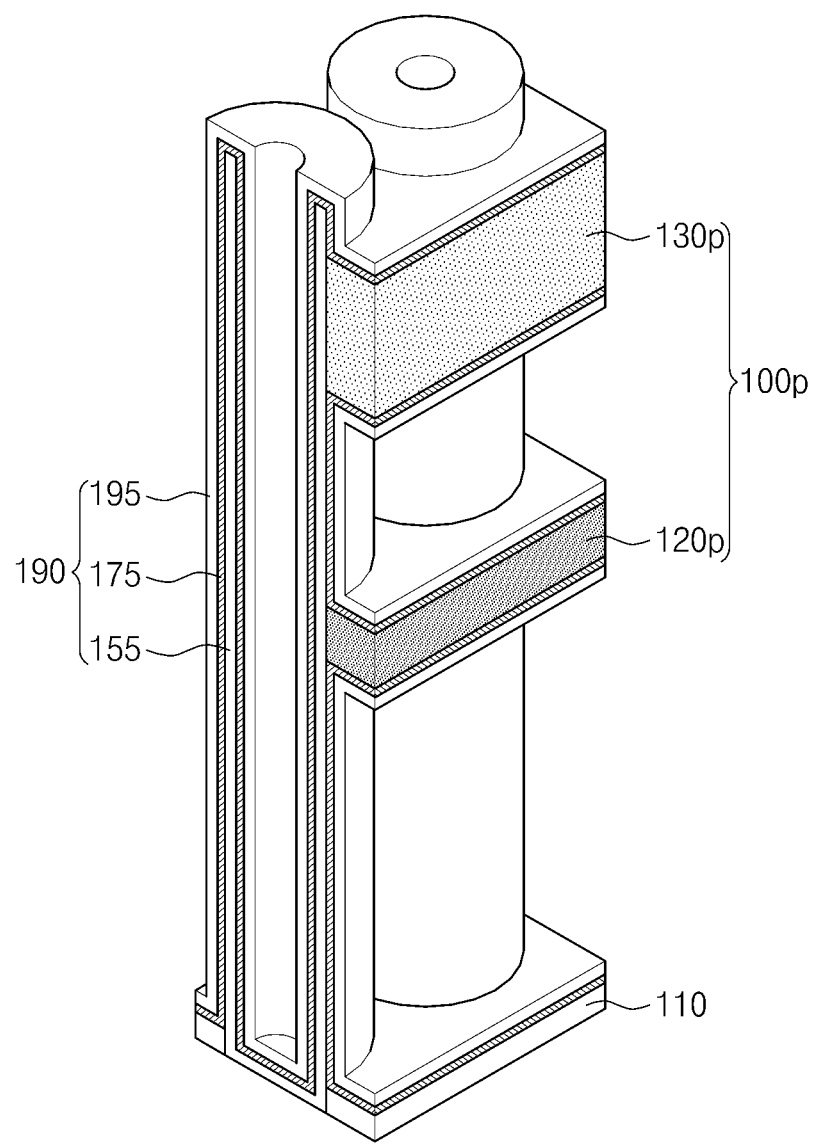

Referring to FIGS. 1L and 1M, a dielectric layer 175 and an upper electrode 195 may be sequentially formed on the resultant structure provided with the double-layered supporting pattern 100p. The dielectric layer 175 and the upper electrode 195 may be applied to sequentially cover exposed surfaces of the double-layered supporting pattern 100p and exposed surfaces of the lower electrodes 155. The lower electrode 155, the upper electrode 195, and the dielectric layer 175 interposed between the lower and upper electrodes 155 and 195 may constitute a capacitor 190, or storage node, disposed on the semiconductor substrate 101. In some embodiments, each capacitor 190 may be structurally supported by the double-layered supporting pattern 100p and may be used as a memory element of a semiconductor memory device 1 such as a dynamic random access memory (DRAM). In various embodiments, the dielectric layer 175 may be formed of at least one of oxide-nitride, oxide-nitride-oxide, and metal oxide, which may be deposited using a chemical vapor deposition, an atomic layer deposition, and so forth. For instance, the dielectric layer 175 may be formed of hafnium oxide ($HfO_2$). In other embodiments, the dielectric layer 175 can be formed of another suitable dielectric material.

Similar to the lower electrode 155, the upper electrode 195 may be formed by depositing a layer of polysilicon, metal, or metal nitride. In some embodiments, the upper electrode 195 may comprise a titanium nitride (TiN) layer deposited by a chemical vapor deposition. The capacitor 190 may include the cylindrical lower electrode 155, and thus, the capacitor 190 can have a relatively high capacitance. According to example embodiments of the inventive concepts, the lower electrode 155 may be supported in two places by the double-layered supporting pattern 100p. A first support is provided at an intermediate position of the storage node, and a second support is provided at an upper position of the storage node. This configuration can prevent or suppress leaning by the lower electrodes 155, even in cases where the lower electrodes 155 have relatively great length in the vertical direction.

Sidewall surfaces of the lower electrodes 155 may be partially contacted by the lower and upper supporting patterns 120p and 130p. Although this would otherwise lead to a reduction in the capacitance of capacitors including the lower electrodes 155, such a reduction can more than adequately be compensated for in accordance with embodiments of the present inventive concepts, since the electrodes can be formed to much greater heights in consideration of the support provided by the lower and upper supporting patterns 120p and 130p. As a result, the resulting semiconductor device 1 can enjoy reliable operation, without the technical problems associated with the reduction in capacitance.

Figure 2A:
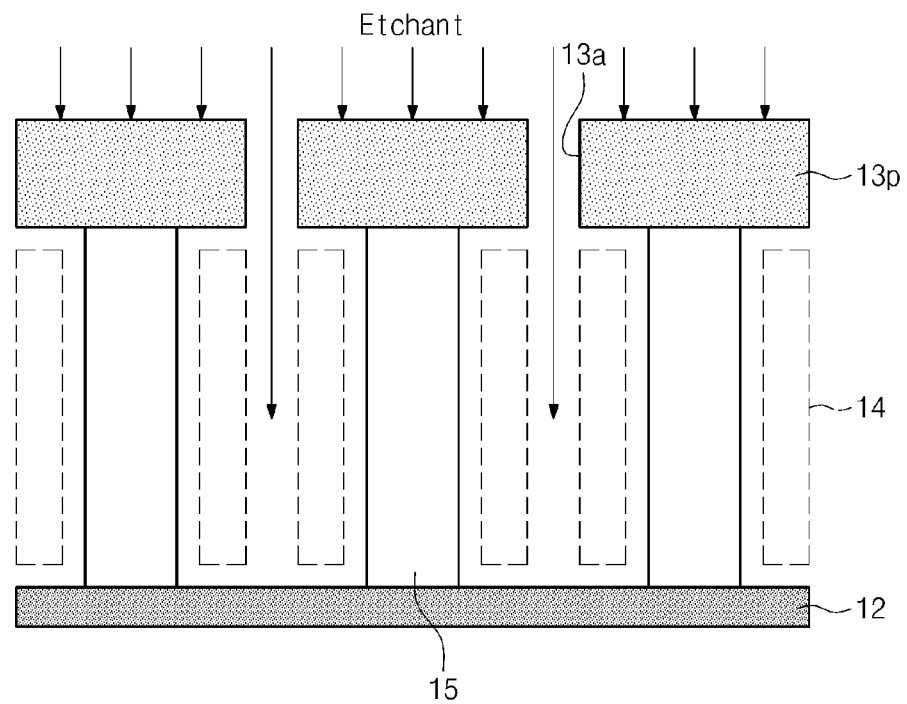
FIGS. 2A and 2B are sectional views illustrating a patterning method used in fabricating a semiconductor device according to embodiments of the inventive concepts.
Figure 2B:
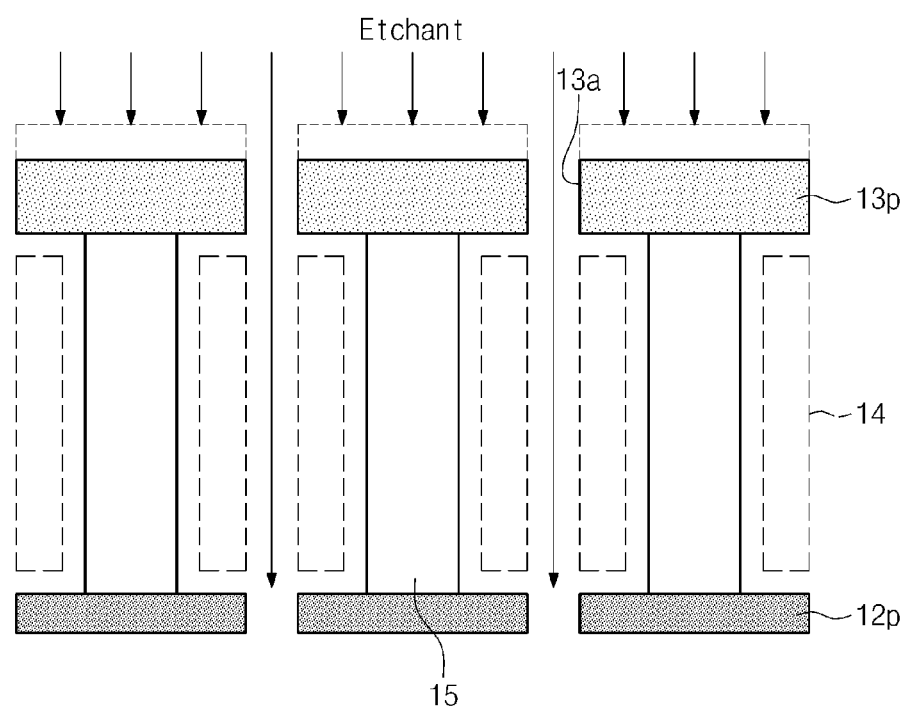

FIGS. 2A and 2B are sectional views illustrating a patterning method, which may be used to fabricate the semiconductor device according to embodiments of the inventive concepts.

Referring to FIG. 2A, a lower layer 12 and an upper pattern 13p may be formed spaced apart from each other in a vertical direction, and a supporting layer 15 may be formed on the lower layer 12 to support the upper pattern 13p. In some embodiments, the lower layer 12 may be formed to have a different shape from the upper pattern 13p and the supporting layer 15. For instance, the upper pattern 13p may be formed to define gaps 13a penetrating the upper pattern 13p, and the lower layer 12 may be shaped like a plate, and the supporting layer 15 may be shaped like a pillar. In addition, there may be an empty space 14, which is not occupied by the supporting layer 15, between the upper pattern 13 and the lower layer 12. The lower layer 12 can be patterned by an etchant supplied through the gaps 13a, in an etch process that is performed through the gaps 13a in the upper pattern.

Referring to FIG. 2B, the lower layer 12 may be patterned to form a lower pattern 12p. The patterning of the lower layer 12 may include the step of supplying an etchant to the lower layer 12 via the gaps 13a and the empty space 14. In this case, the upper pattern 13p may operate as an etching mask for transferring a shape of the upper pattern 13p into the lower layer 12; that is, the lower pattern 12p may be formed to have the substantially same shape of the upper pattern 13p. In this manner, the lower pattern 12p can be formed without the need for an additional photolithography process. In some embodiments, a top surface of the upper pattern 13p may be partially recessed during the formation of the lower pattern 12p. An etching amount of the upper pattern 13p may vary, depending on an etch rate of the upper pattern 130. In this sense, in a case where the upper pattern 13p is formed of a material having an etch rate equivalent to the lower layer 12, the upper pattern 13p may be formed to have a thickness greater than the lower layer 12, as shown in FIG. 2B. However, in a case where the upper pattern 13p has an etch rate smaller than the lower layer 12, the upper pattern 13p may be formed to have a thickness smaller than or equivalent to the lower layer 12. In other embodiments, where more than two support patterns are employed, the patterning process may be performed to transfer the shape of the upper pattern 13p into two or more lower layers 12, in a manner similar to the manner described herein.

Figure 3A:
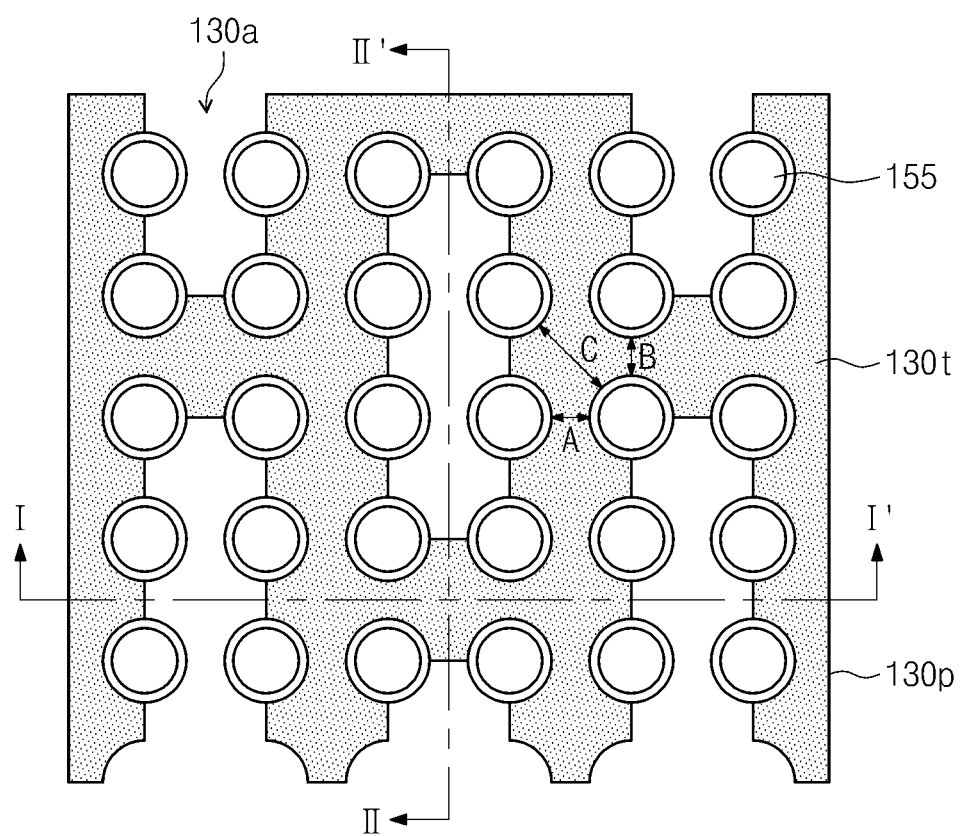
FIG. 3A is a plan view of FIG. 1I.
Figure 3B:
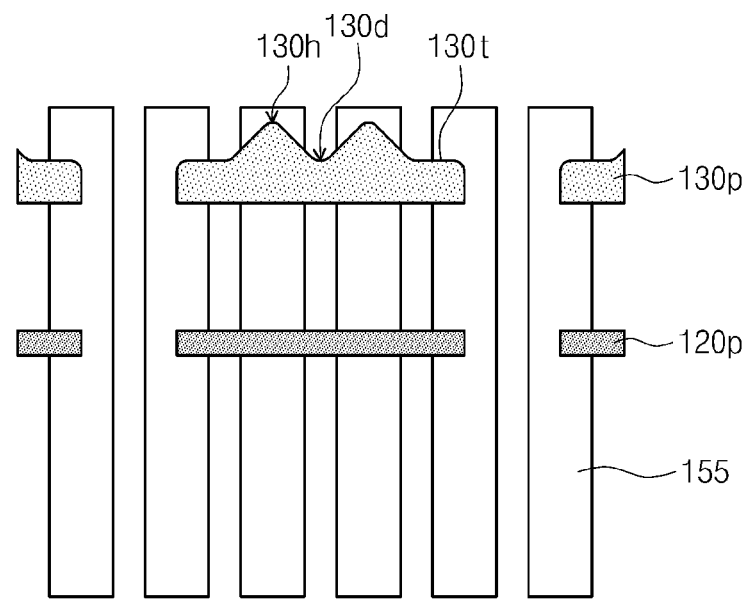
FIG. 3B is a sectional view taken along a line I-I' of FIG. 3A.

FIG. 3A is a plan view of FIG. H. FIG. 3B is a sectional view taken along a line I-I' of FIG. 3A, and FIG. 3C is a sectional view taken along a line of FIG. 3A.

Figure 3C:
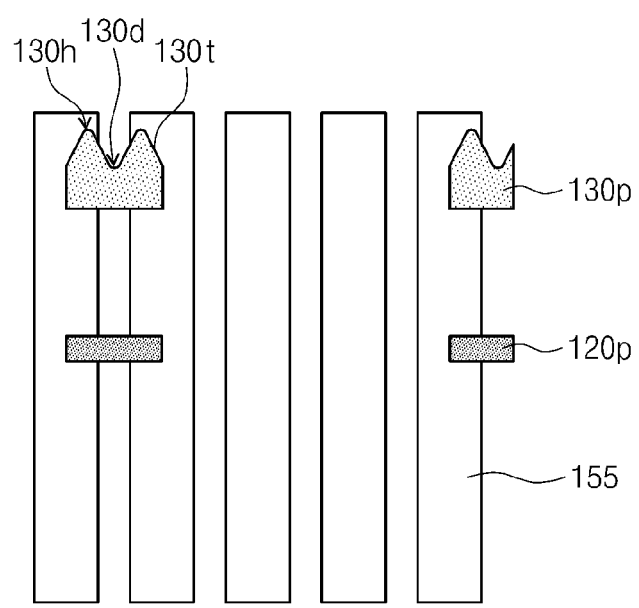
FIG. 3C is a sectional view taken along a line II-If of FIG. 3A.

Referring to FIGS. 3A through 3C, the upper supporting pattern 130p may include a first portion between sidewalls of transversally adjacent ones of the lower electrodes 155, a second portion between sidewalls of longitudinally adjacent ones of the lower electrodes 155, and a third portion between sidewalls of diagonally adjacent ones of the lower electrodes 155. A width A of the first portion may be substantially the same as a width B of the second portion and may be shorter than a width C of the third portion. Accordingly, the third portion of the upper supporting pattern 130p may be etched to a greater degree, as compared with the etching amounts of the first and second portions of the upper supporting pattern 130p. This is because the etchant can be more readily supplied to a wide region (i.e., the third portion), as compared with narrow regions (i.e., the first and second portions). As the result of the difference in the amount of etching, as shown in FIGS. 3B and 3C, the upper supporting pattern 130p may be formed to have an uneven top surface 130t. For example, the top surface 130t of the upper supporting pattern 130p may be positioned at a relatively lower level 130d on the third portion having width C and at a relatively higher level 130h on the first and second portions having widths A and B.

In this manner, the upper support pattern 130p may have a vertical cross-sectional profile that is different than that of the lower support pattern 120p. In some embodiments, the lower support pattern 120p may have a thickness that is relatively constant, while the upper support pattern 130p may have a thickness that varies substantially. In some embodiments, portions of the upper support pattern 130p that extend between neighboring storage nodes vary in thickness. Also, portions of the upper support pattern 130p that extend between neighboring storage nodes may have an intermediate region of relatively greater thickness than first and second end regions thereof. In this case, the end regions correspond to contact portions of the upper support patterns, at which the upper support pattern 130p makes contact with the storage nodes, and the intermediate regions correspond to intermediate portions of the upper support pattern that lie between neighboring storage nodes.

In the formation of the semiconductor device 1 shown in FIG. 1L, the lower electrode 155 and the double-layered supporting pattern 100 may be formed using one of various methods, as will be described below. In the description that follows, a discussion of features identical to those of FIGS. 1A through 1M, 2A, 2B, and 3A through 3C will be minimized in order to avoid redundancy.

Figure 4A:
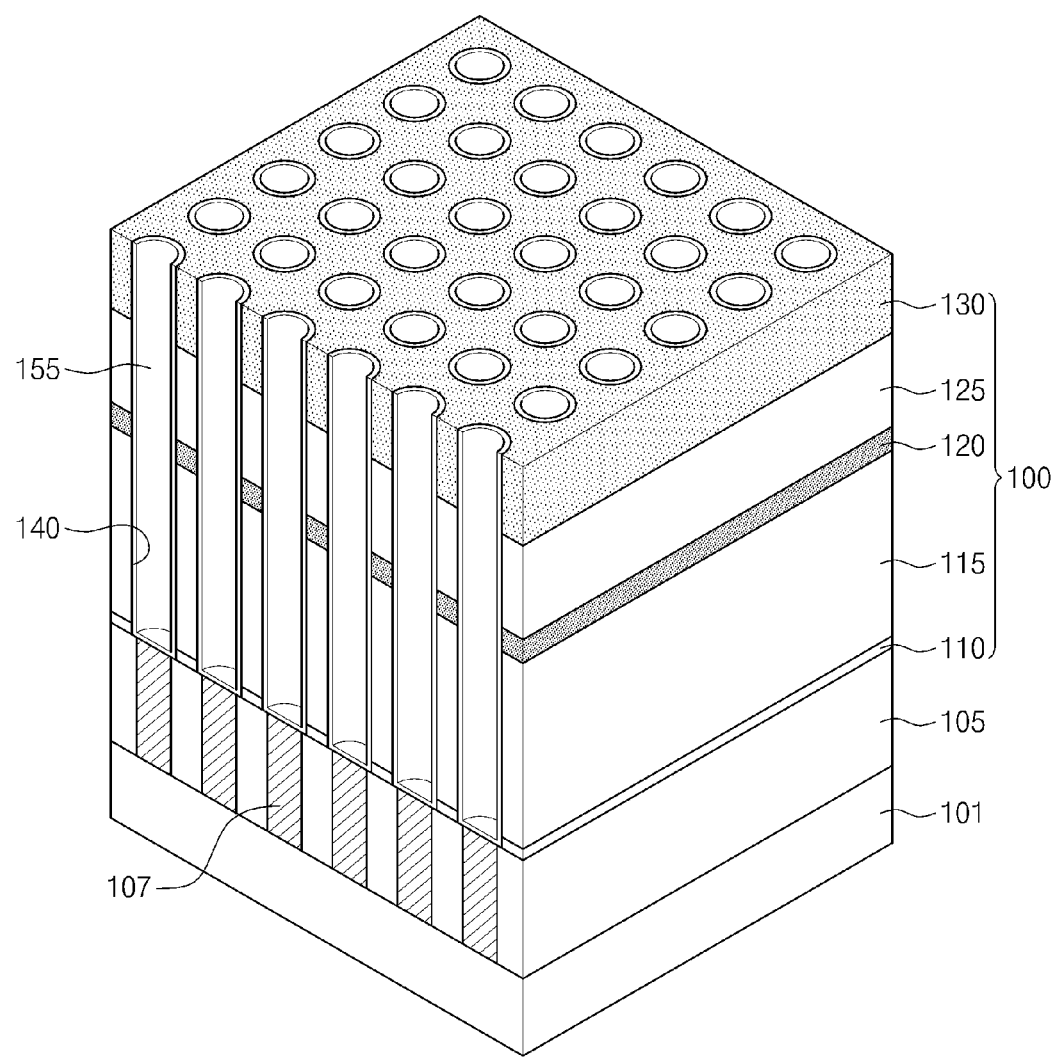
FIGS. 4A through 4H are perspective views illustrating a method of fabricating a semiconductor device according to other example embodiments of the inventive concepts.
Figure 4B:
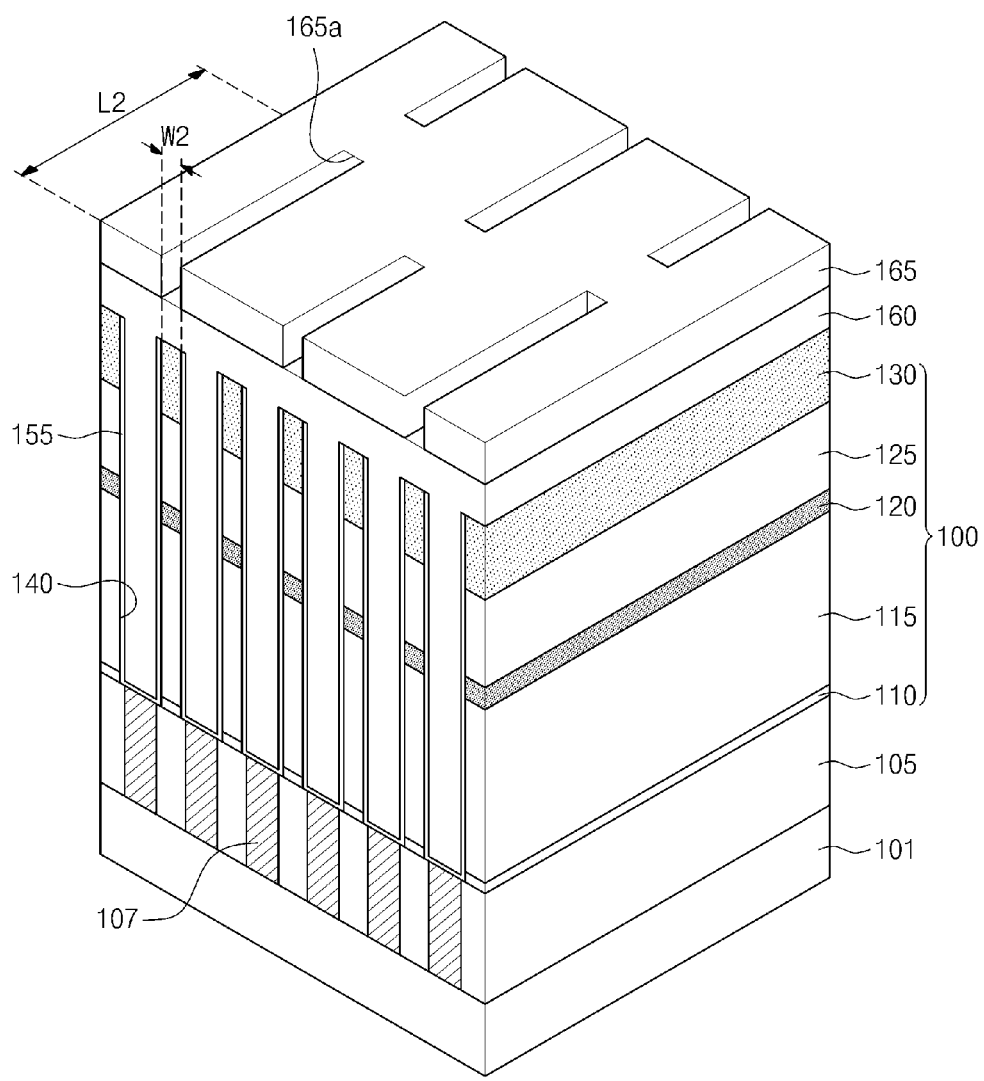
Figure 4C:
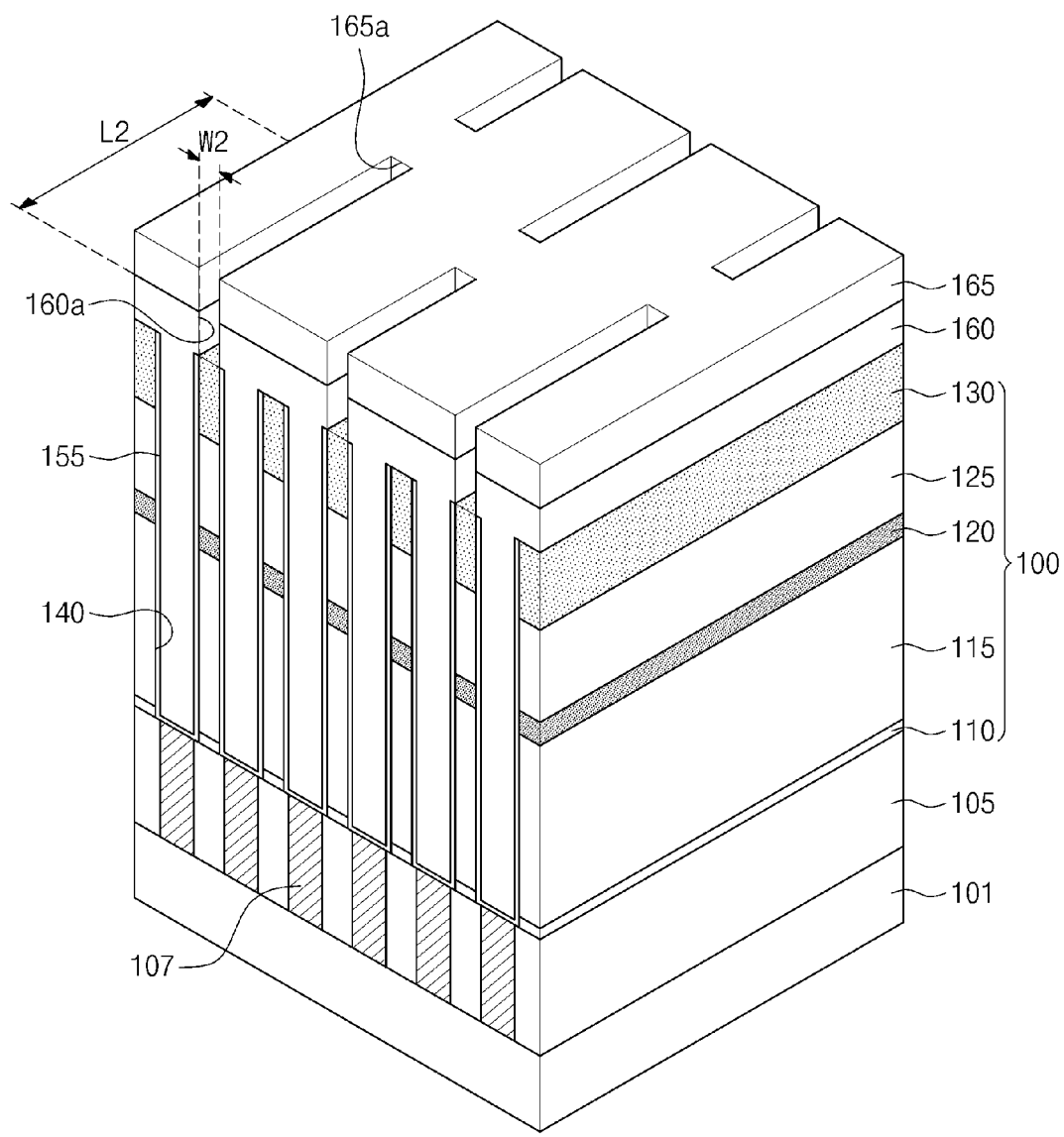
Figure 4D:
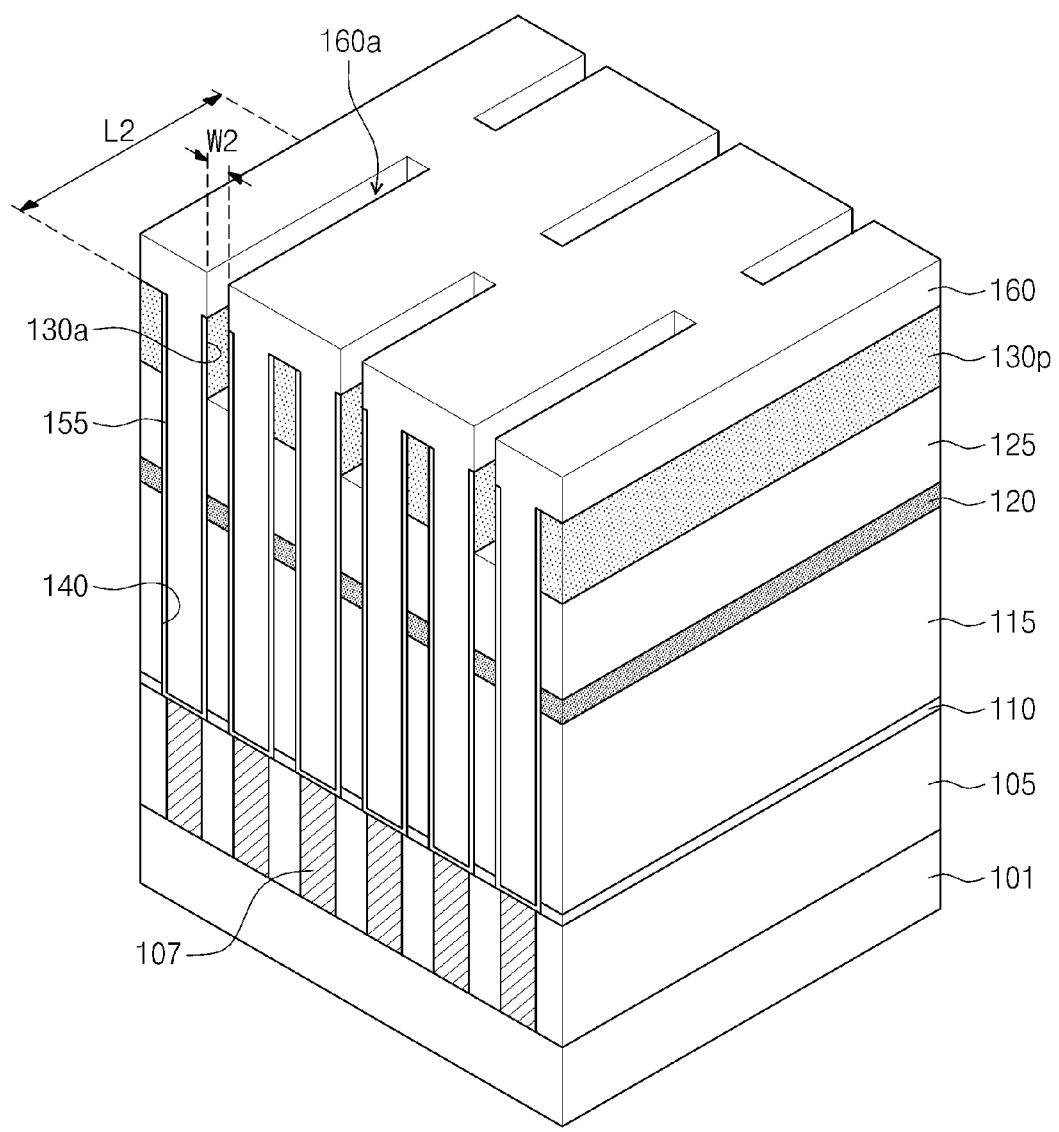
Figure 4E:
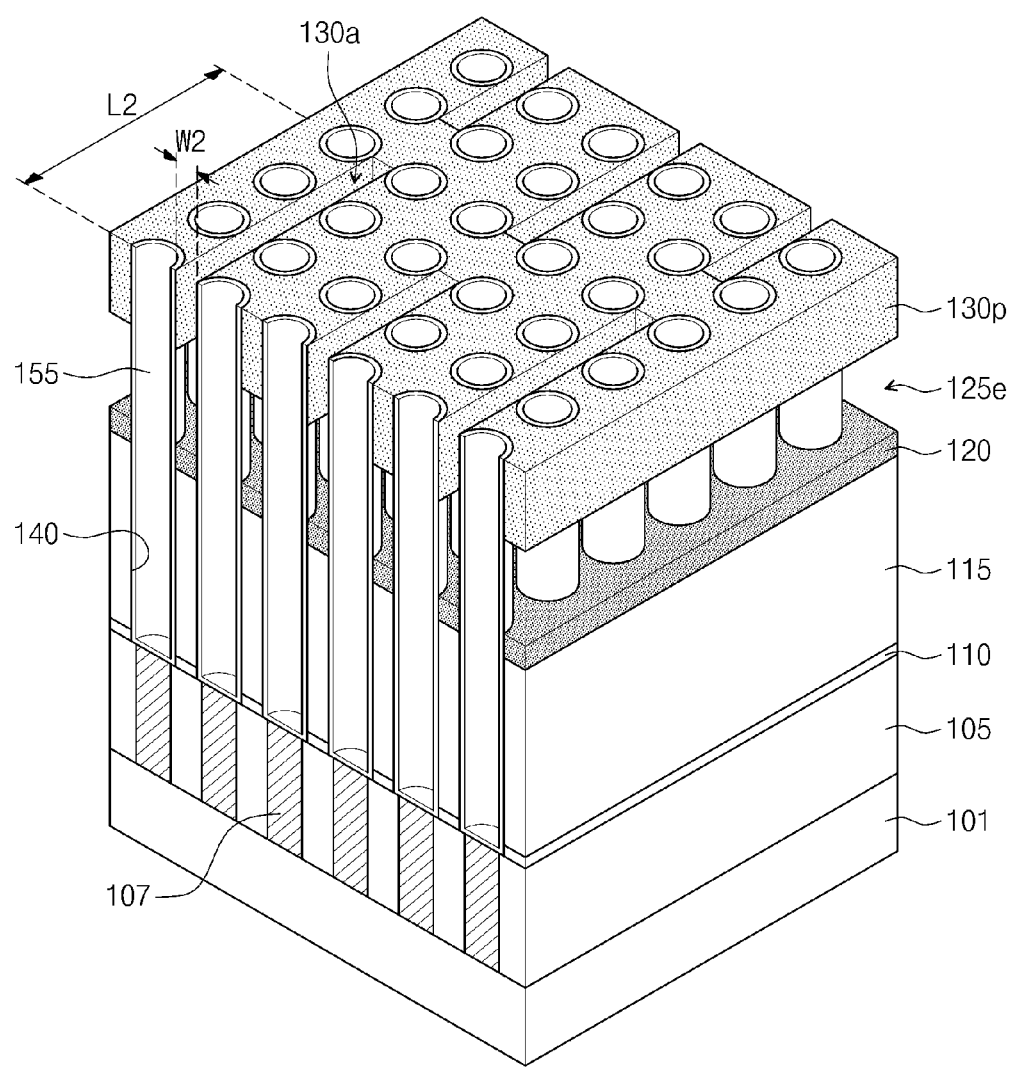
Figure 4F:
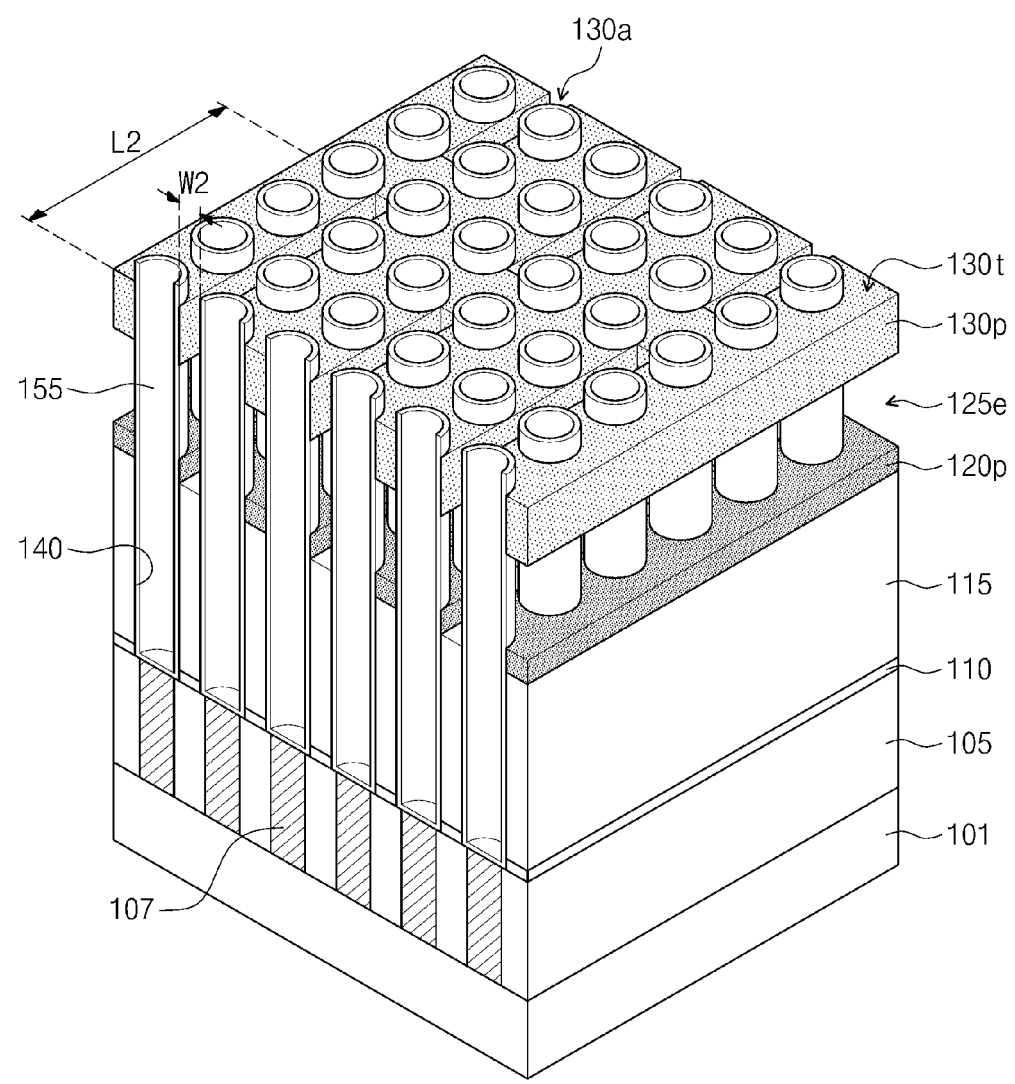
Figure 4G:
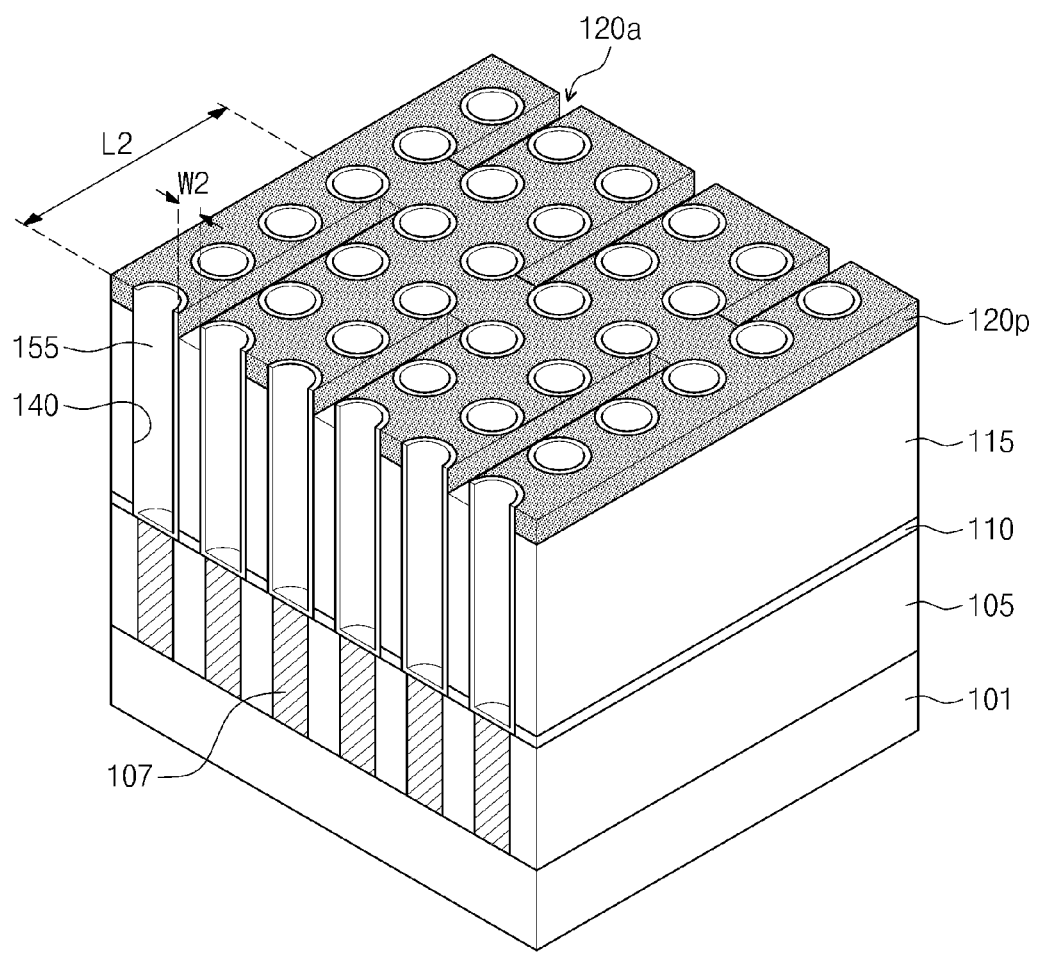

FIGS. 4A through 4H are perspective views illustrating a method of fabricating a semiconductor device according to other example embodiments of the inventive concepts. Here, FIG. 4G is a perspective view selectively illustrating some elements of the structure shown in FIG. 4F.

Referring to FIG. 4A, the capacitor holes 140 may be formed through the mold stack 100 to expose the contact plugs 107, respectively. A conductive layer (e.g., of titanium nitride) may be deposited on the resultant structure provided with the capacitor holes 140, and then the node separation process may be performed to form the lower electrodes 155, each of which is connected to the corresponding one of the contact plugs 107 and is disposed in the corresponding one of the capacitor holes 140.

Referring to FIG. 4B, a hard mask layer 160 (e.g., of silicon oxide) may be deposited on the resultant structure provided with the lower electrodes 155, and then, a photoresist pattern 165 may be formed on the hard mask layer 160 to have a plurality of openings 165a. The photoresist pattern 165 may be formed by coating and patterning a photoresist film, and the openings 165a may be arranged in a zigzag configuration. The hard mask layer 160 may be partially exposed by the openings 165a. Each of the openings 165a may be shaped in the general form of a rectangle, or elongated shape, having a second width W2 and a second length L2 in plan view. In some embodiments, with regard to the second width W2, the opening 165a may be formed so as not to cover a portion of the upper supporting layer 130, which is disposed between two adjacent ones of the lower electrodes 155; that is, the second width W2 may be smaller than the first width W1 depicted in FIG. 1E. The second length L2 may be equivalent to, or greater than, a maximum distance between centers of adjacent four of the lower electrodes 155.

Referring to FIG. 4C, portions of the hard mask layer 160 exposed by the opening 165a may be selectively removed. As the result of the selective removal of the hard mask layer 160, open holes 160a may be formed in the hard mask layer 160 to partially expose the upper supporting layer 130. Similar to the openings 165a in the photoresist patter 165, the open holes 160a in the hard mask layer 160 may have the general shape of rectangles having the second width W2 and the second length L2 in plan view. The photoresist pattern 165 may then be removed using an ashing process. In some embodiments, the open holes 160a may be formed so as not to expose upper portions of the lower electrode 155.

Referring to FIG. 4D, portions of the upper supporting layer 130 exposed by the open holes 160a in the hard mask layer 160 may be selectively removed. As a result, the upper supporting pattern 130p may be formed to have a plurality of upper mesh openings 130a penetrating the upper supporting layer 130 and partially exposing top portions of the upper mold layer 125. Similar to the open holes 160a in the hard mask layer 160, the upper mesh openings 130a in the upper supporting layer may have the general shape of rectangles having the second width W2 and the second length L2 in plan view.

Referring to FIG. 4E, the hard mask layer 160 and the upper mold layer 125 may be removed by a first LAL lift-off process. As a result, the upper space 125e may be formed to separate the upper supporting pattern 130p from the lower supporting layer 120, so that they are spaced apart in the vertical direction. In some embodiments, the upper supporting pattern 130p may be formed to cover mostly or fully sidewall portions of the lower electrodes 155 located at the same level of the upper supporting pattern 130p, thereby robustly supporting upper portions of the lower electrodes 155.

Referring to FIGS. 4F and 4G, the lower supporting layer 120 may be patterned by an etching process using the upper supporting pattern 130p as a hard mask to form the lower supporting pattern 120p. In some embodiments, the upper supporting pattern 130p may be partially etched during the process of etching the lower supporting layer 120, and as a result, the top surface 130t of the upper supporting pattern 130p may have an uneven surface profile, for example in accordance with the manner described in connection with FIGS. 3B and 3C. According to the present embodiments, the shape of the upper supporting pattern 130p can be transferred onto the lower supporting layer 120, without the need for an additional photolithography process. Similar to the upper supporting pattern 130p, the lower supporting pattern 120p may be formed to have the lower mesh openings 120a, each of which may be shaped in the general shape of a rectangle having a second width W2 and a second length L2 in plan view. In this manner, the lower supporting pattern 120p may be formed to have a mesh structure. In some embodiments, the lower supporting pattern 120p may be formed to cover mostly or fully the sidewalls of portions of the lower electrodes 155 located at the same level of the lower supporting pattern 120p. Moreover, the lower supporting pattern 120p may be formed to partially expose the lower mold layer 115.

Figure 4H:
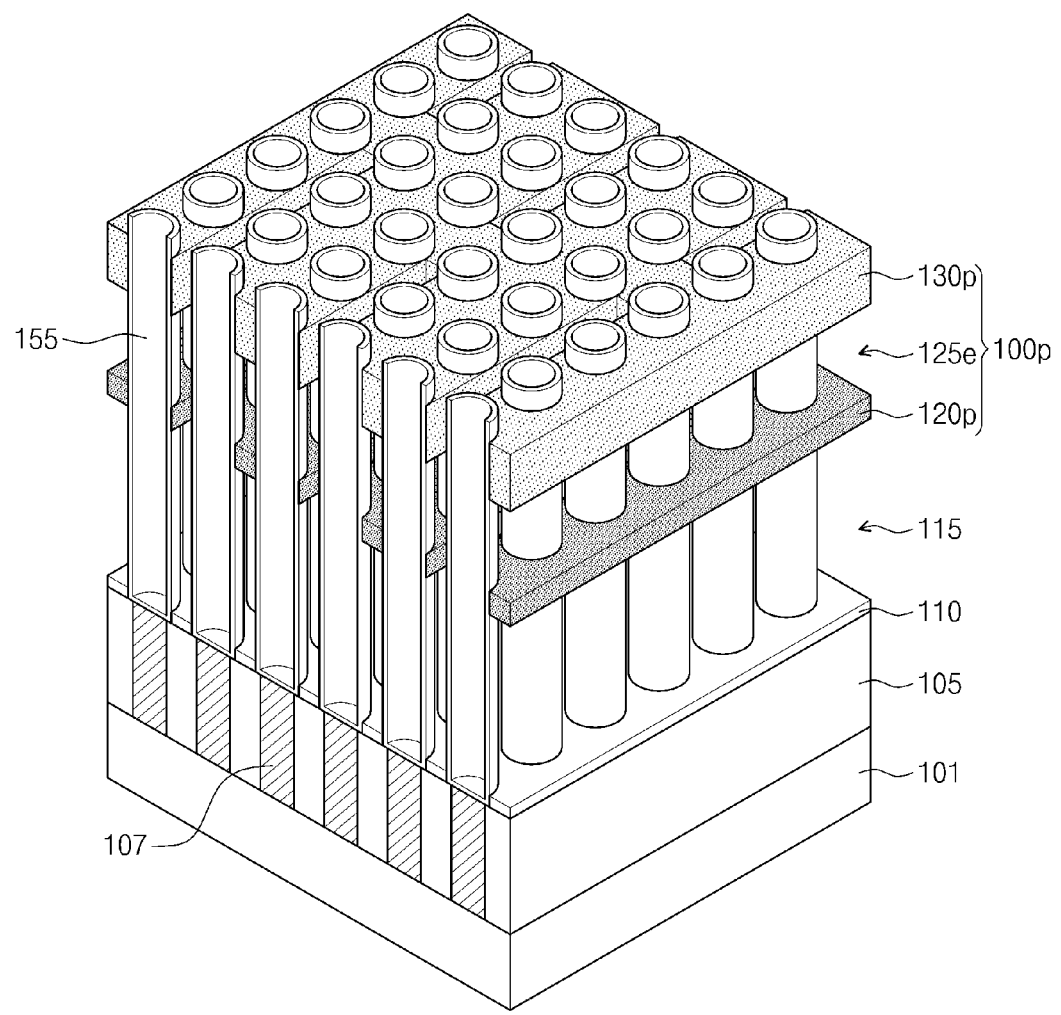

Referring to FIG. 4H, the lower mold layer 115 may be removed by a second LAL lift-off process. As a result, the lower space 115e may be formed to separate the lower supporting pattern 120p from the etch stop layer 110. The lower and upper supporting patterns 120p and 130p may be vertically spaced apart from each other by the upper space 125e to support lower and upper portions, respectively, of the lower electrode 155 that are vertically spaced apart from each other. The lower and upper supporting patterns 120p and 130p may comprise a double-layered supporting pattern 100p structurally supporting the lower electrodes 155, and each of them may be shaped in a mesh pattern. Thereafter, as shown in FIGS. 1L and 1M, the dielectric layer 175 and the upper electrode 195 may be sequentially formed on the resultant structure provided with the double-layered supporting pattern 100p. The lower electrode 155, the upper electrode 195, and the dielectric layer 175 therebetween may constitute the capacitor 190 which operates as a memory element of the semiconductor memory device 1.

Figure 5A:
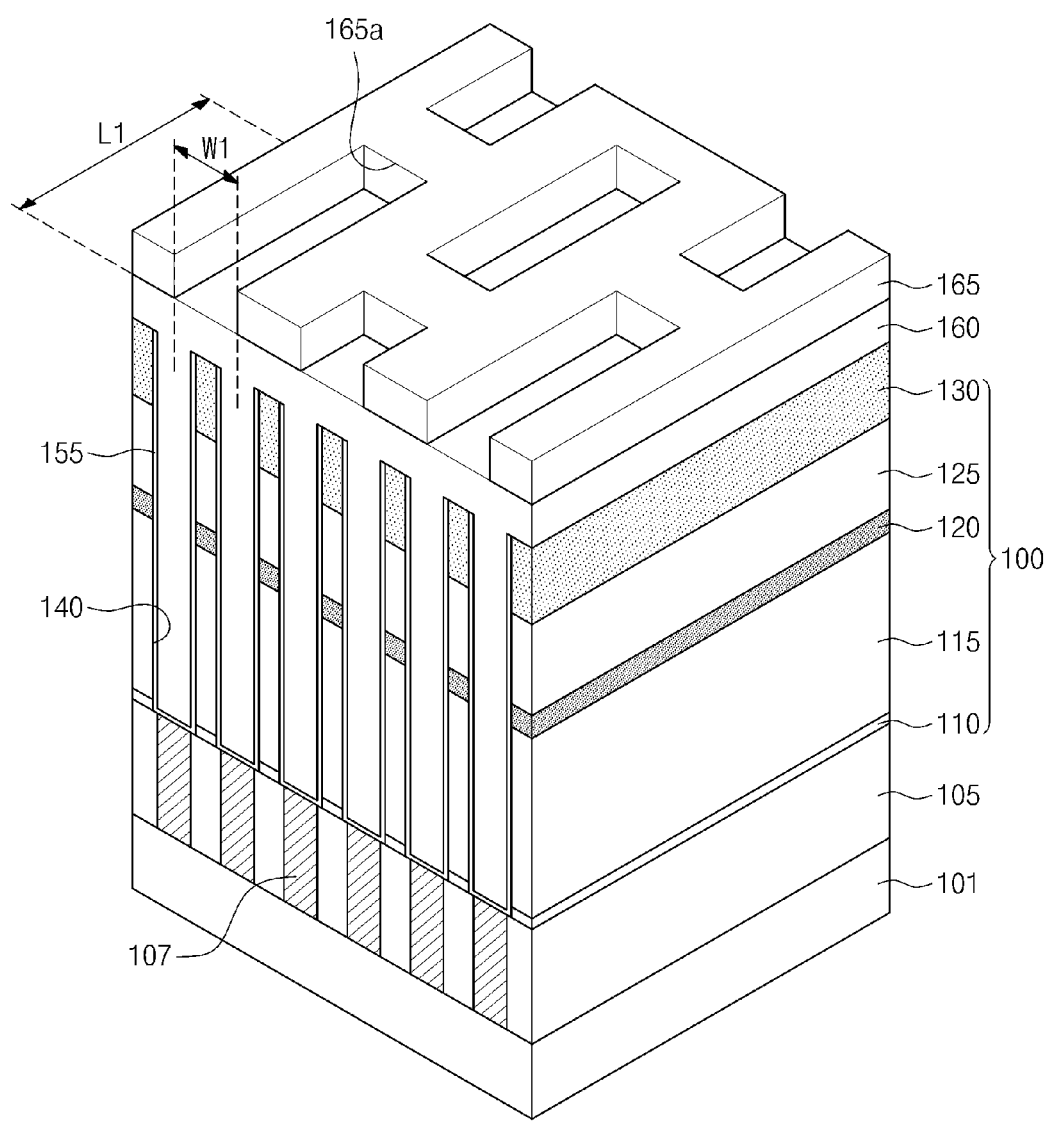
FIGS. 5A through 5I are perspective views illustrating a method of fabricating a semiconductor device according to other example embodiments of the inventive concepts.
Figure 5B:
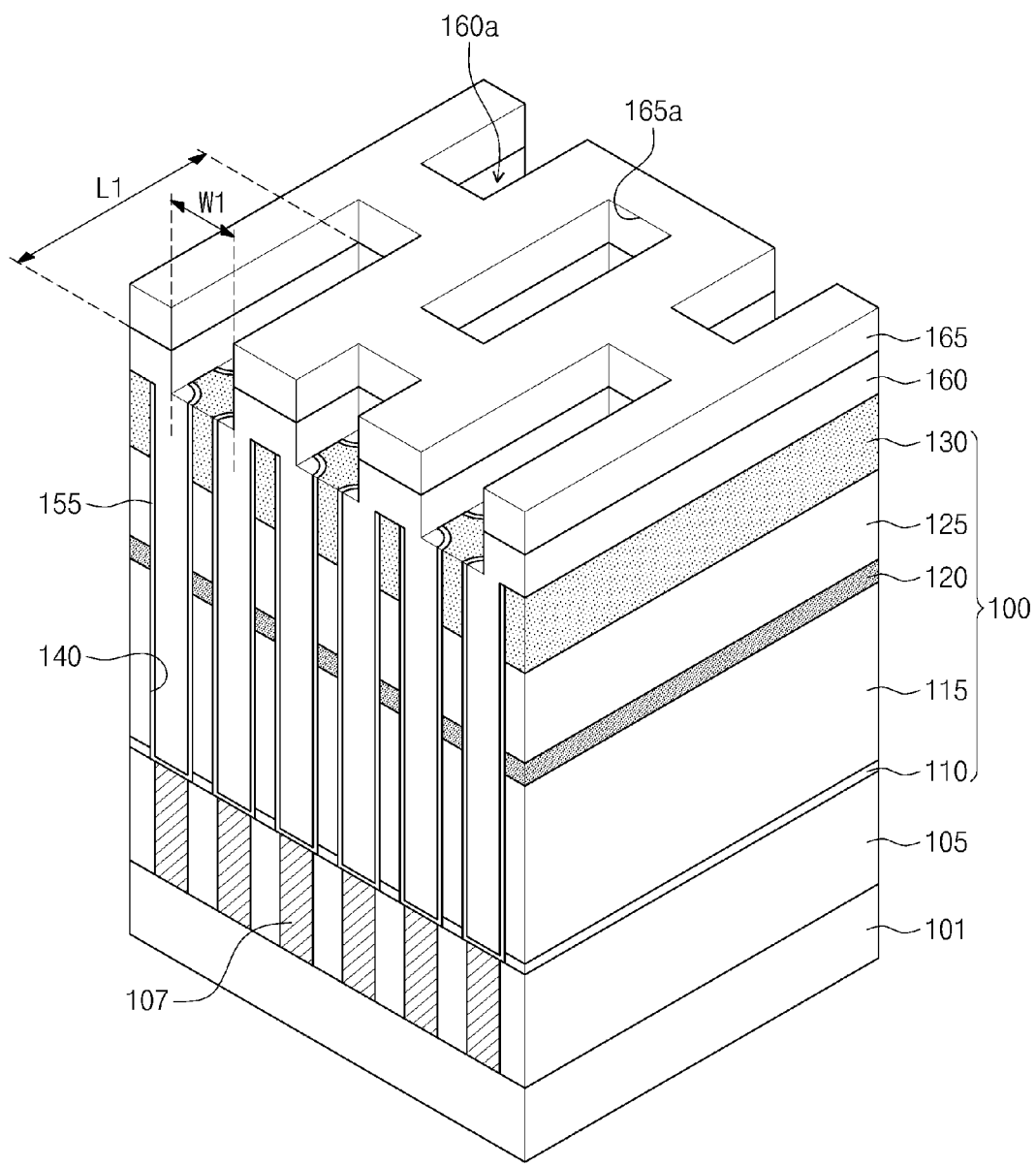
Figure 5C:
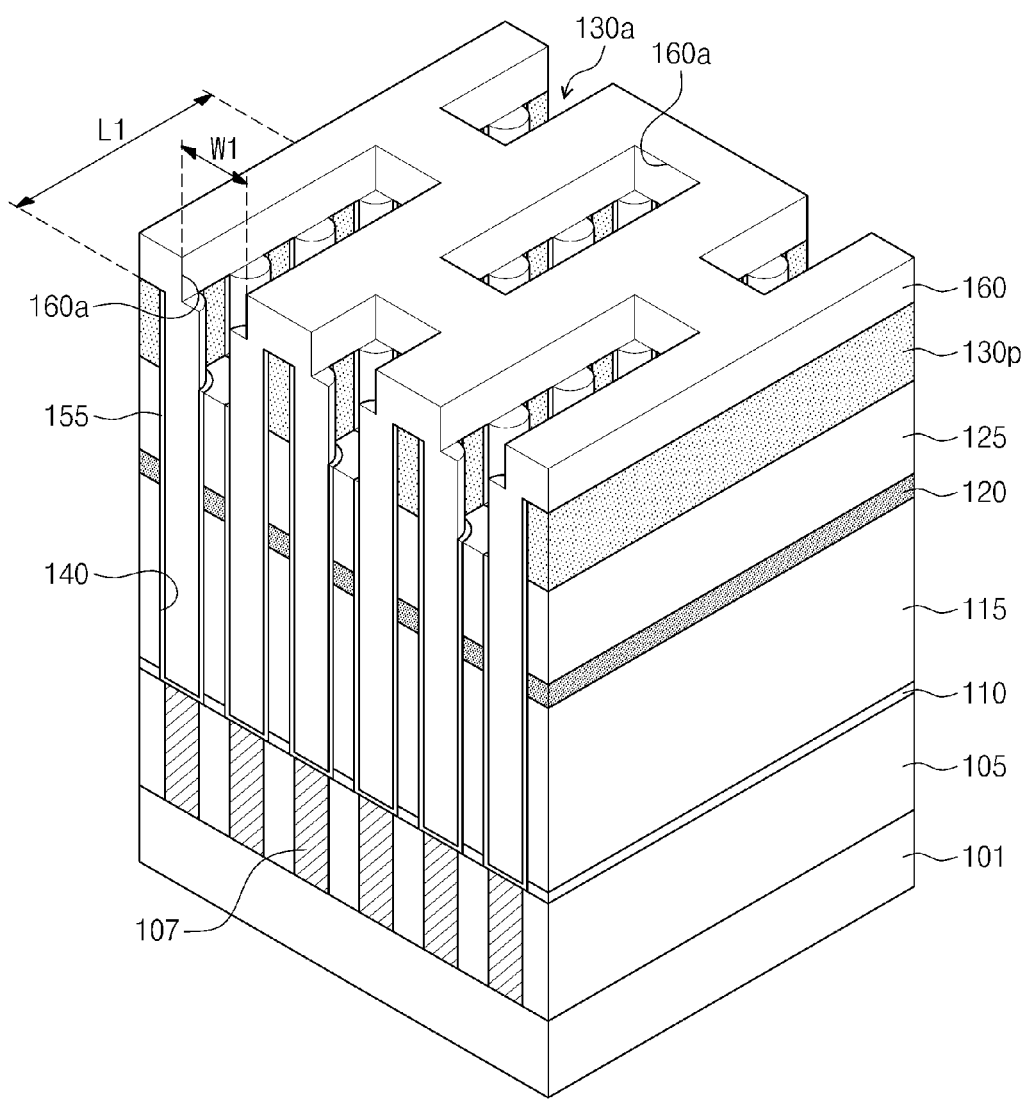
Figure 5D:
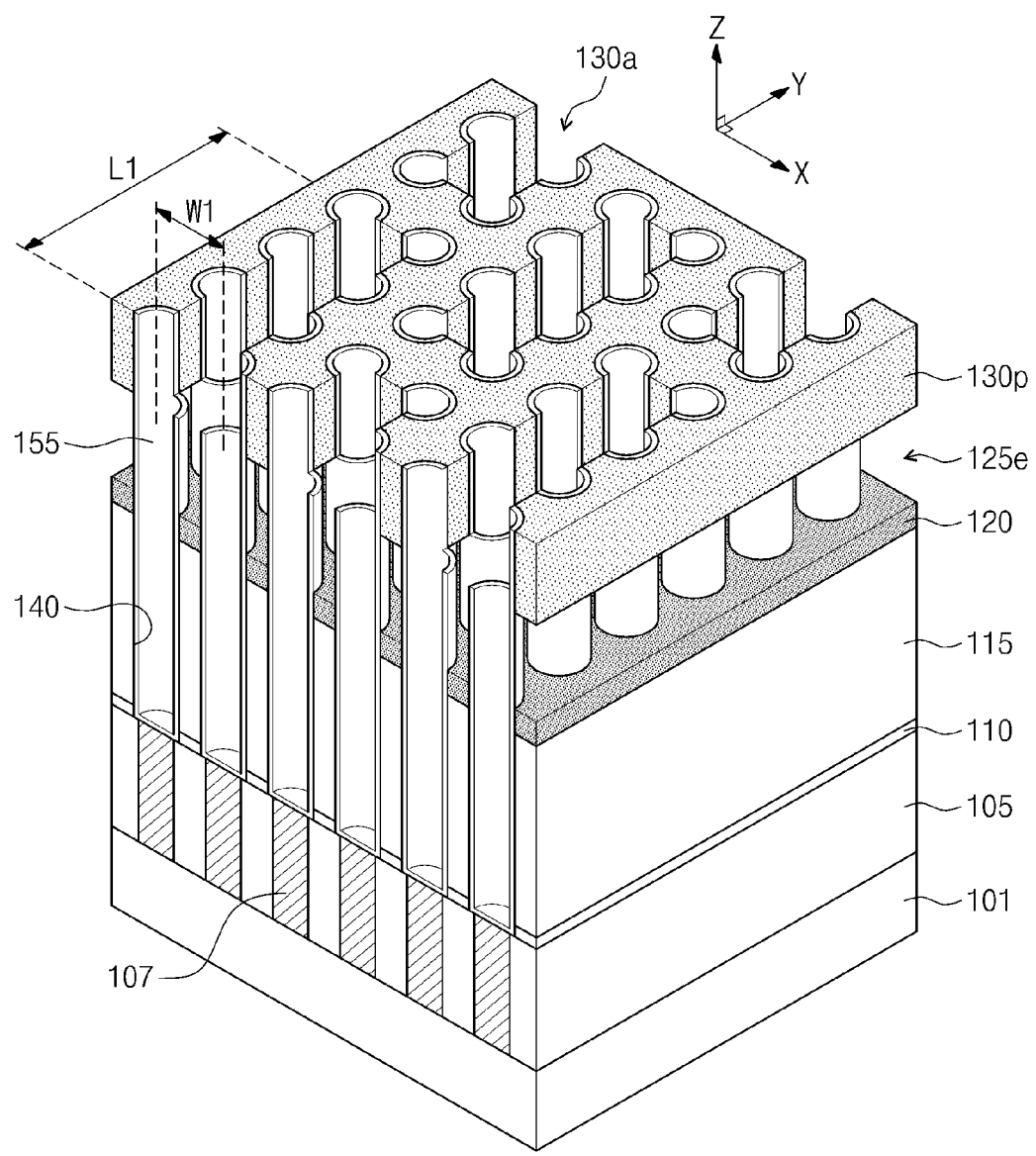
Figure 5E:
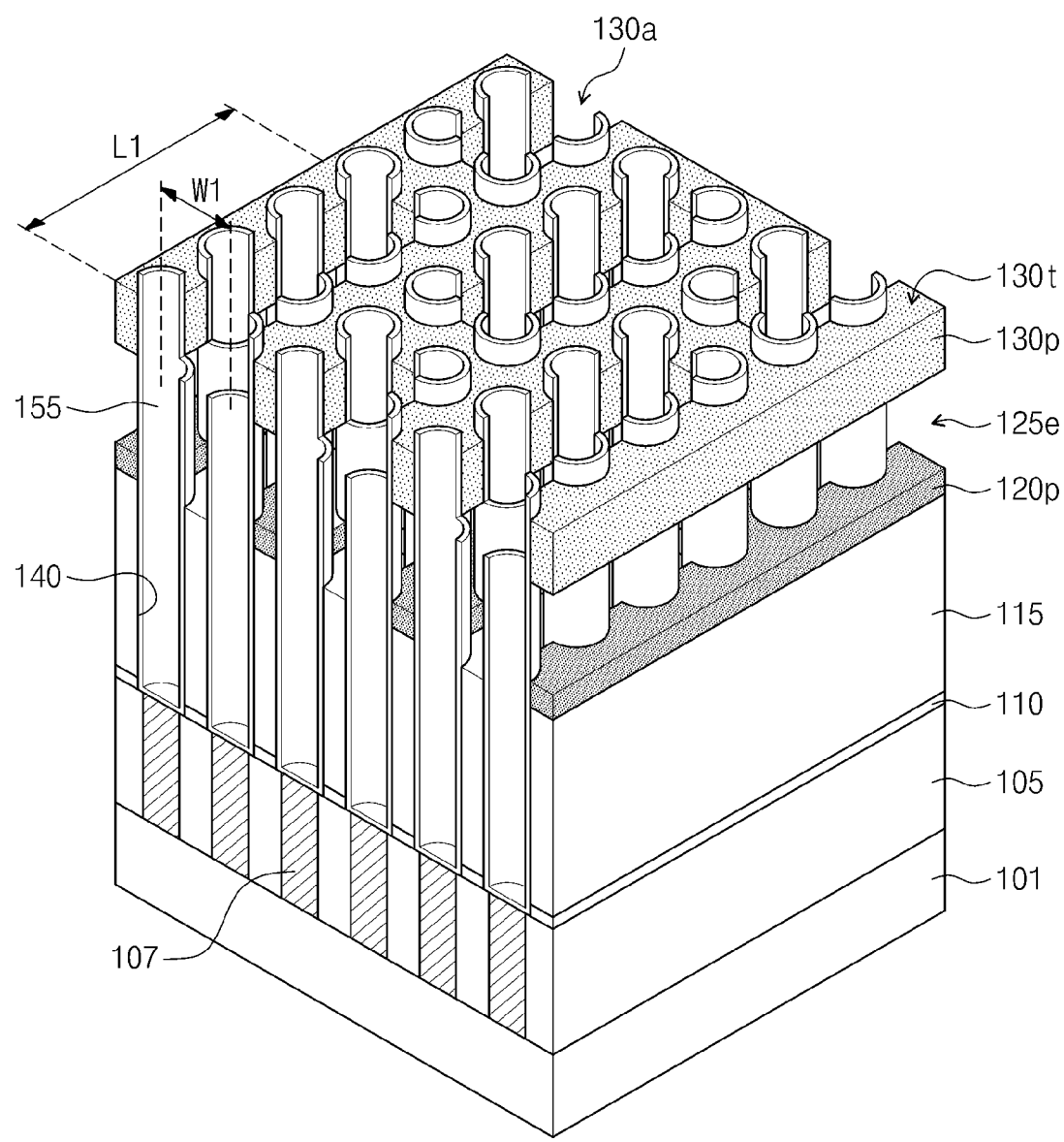
Figure 5F:
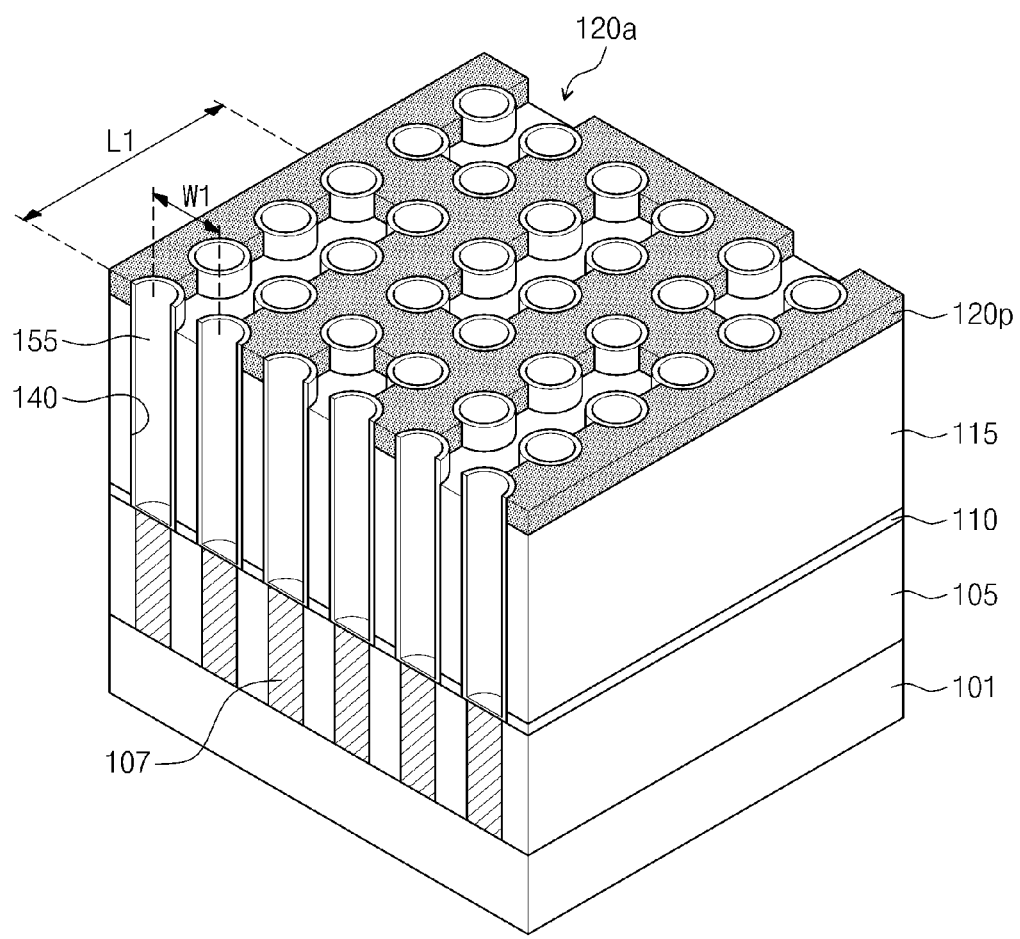
Figure 5G:
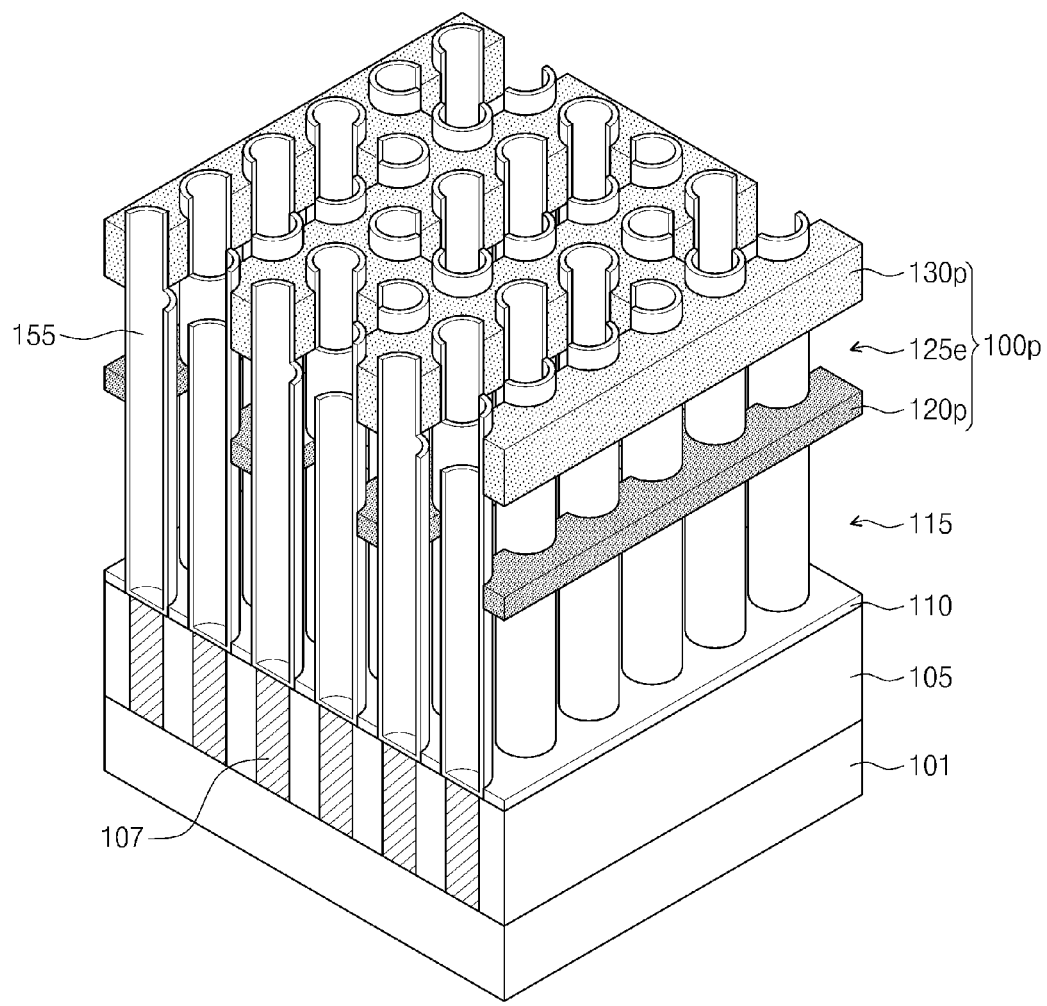
Figure 5H:
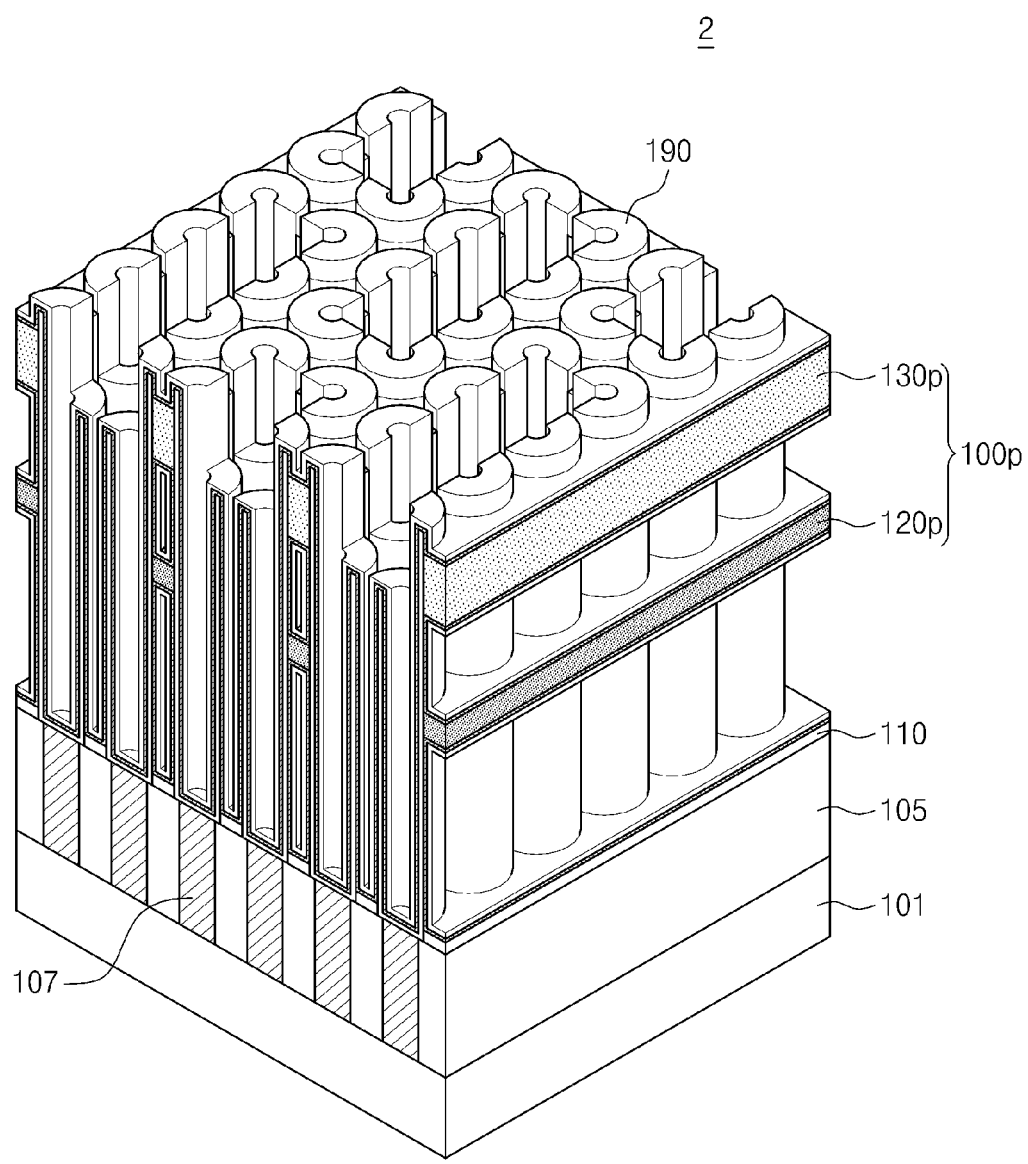
Figure 5I:
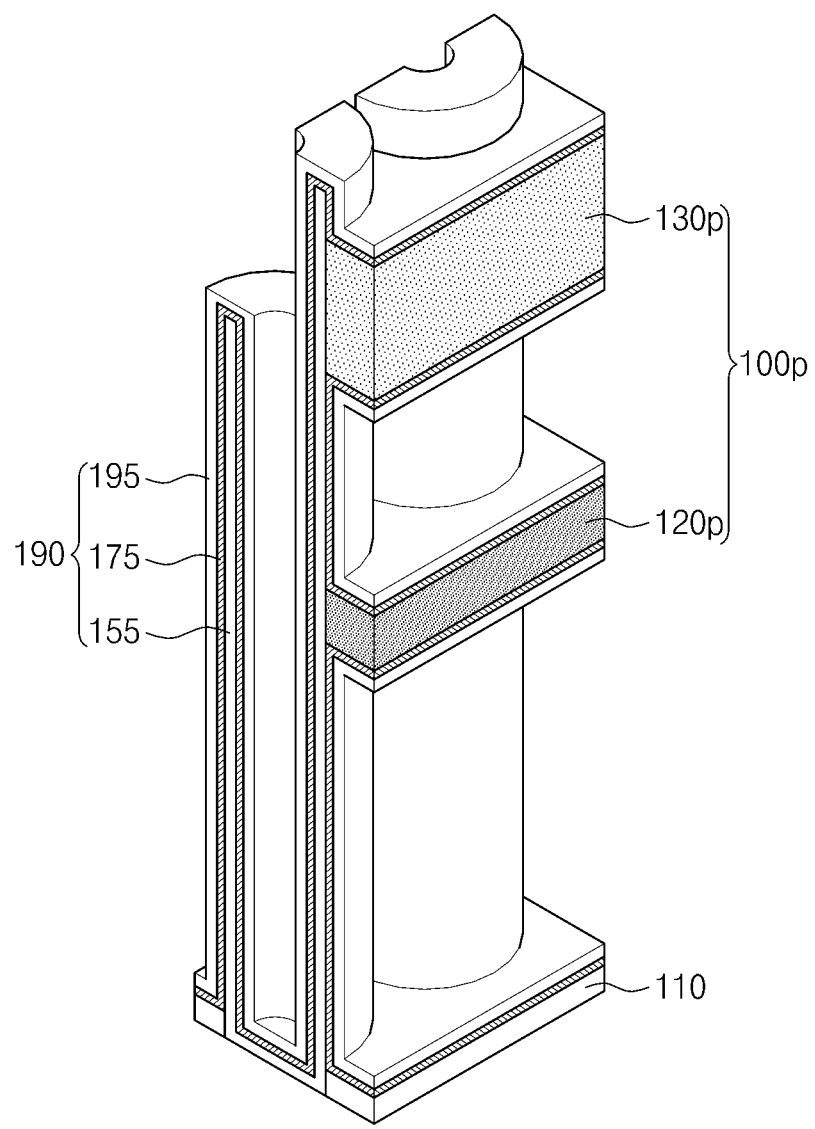

FIGS. 5A through 5I are perspective views illustrating a method of fabricating a semiconductor device according to still other example embodiments of the inventive concepts. Here, FIG. 5I is a perspective view selectively illustrating some elements of the structure shown in FIG. 5H.

Referring to FIG. 5A, capacitor holes 140 and the cylindrical lower electrodes 155 may be formed to penetrate the mold stack 100. Thereafter, the hard mask layer 160 may be formed on the resultant structure, and the photoresist pattern 165 may be formed on the hard mask layer 160 to have the openings 165a. Each of the openings 165a may be shaped like a rectangle having the first width W1 and the first length L1 in plan view.

Referring to FIG. 5B, the hard mask layer 160 may be patterned by an etching process using the photoresist pattern 165 as an etch mask to form the open holes 160a. Each of the open holes 160a may be formed to expose a portion of the upper supporting layer 130 and portions of the lower electrodes 155. Each open hole 160a may be shaped to have a generally rectangular shape having a first width W1 and a first length L1 in plan view. The photoresist pattern 165 may be removed using an ashing process.

Referring to FIG. 5C, portions of the upper supporting layer 130 exposed by the open holes 160a may be selectively removed by supplying an etchant through the open hole 160a. As the result of the etching process, the upper supporting layer 130 is patterned to become the upper supporting pattern 130p having the upper mesh openings 130a. The upper mesh openings 130a may each have the general shape of a rectangle having the first width W1 and the first length L1 in plan view. In some embodiments, during the formation of the upper supporting pattern 130p, upper portions of the lower electrodes 155 may be partially removed, in accordance with the time of etch, or in accordance with the etchant used for removing the upper supporting layer 130. Here, any difference in the exposed surface area of the lower electrode 155 may result in a difference in the degree to which the lower electrode may become etched. For instance, a lower electrode 155 positioned at a corner of the upper mesh opening 130a may be etched to a relatively lower degree, as compared with others of the lower electrodes 155 positioned at sides of the upper mesh opening 130a. The partially etched lower electrodes 155 may have a variety of shapes or structures, according to the spatial difference in the etching amount, and these modifications will be described in more detail with reference to FIG. 5D.

Referring to FIG. 5D, the hard mask layer 160 and the upper mold layer 125 may be removed by a first LAL lift-off process. As a result, the upper space 125e may be formed between the upper supporting pattern 130p and the lower supporting layer 120 so that the upper and lower patterns 130p, 125e are spaced apart from each other in the vertical direction. In some embodiments, the lower electrode 155 may be partially removed to have an 'L'-shaped vertical section. In some embodiments, the lower electrodes 155, which are arranged along the X-direction and are disposed at both sides of the upper mesh openings 130a to face each other, may have a mirror-symmetry and the 'L'-shaped vertical sections thereof may face each other. Like this, the lower electrodes 155, each of which has a recessed portion under the upper mesh opening 130a, may be alternatingly arranged along the X-direction.

Referring to FIGS. 5E and 5F, the lower supporting layer 120 may be patterned by an etching process using the upper supporting pattern 130p as a hard mask to form the lower supporting pattern 120p. The openings of the lower supporting pattern 120p may have the same or similar shape as those of the upper supporting pattern 130p in plan view, or may otherwise correspond with the openings of the upper supporting pattern 130p. For instance, the lower supporting pattern 120p may have the lower mesh openings 120a, each of which may be shaped generally in the form of a rectangle having a first width W1 and the first length L1 in plan view and may partially expose upper portions of the lower mold layer 115. In some embodiments, the top surface 130t of the upper supporting pattern 130p may have an uneven surface profile, as shown in FIGS. 3B and 3C.

Referring to FIG. 5G, the lower mold layer 115 may be removed by a second LAL lift-off process to form the lower space 115e separating the lower supporting pattern 120p from the etch stop layer 110 in the vertical direction. According to the present embodiments, the lower and upper supporting patterns 120p and 130p of mesh shape may be vertically spaced apart from each other by the upper space 125e and constitute the double-layered supporting pattern 100p structurally supporting the lower electrodes 155.

Referring to FIGS. 5H and 5I, the dielectric layer 175 and the upper/electrode 195 may be sequentially formed to cover exposed surfaces of the lower electrodes 155. The lower electrode 155, the upper electrode 195, and the dielectric layer 175 therebetween may constitute a capacitor 190 serving as a memory element of a semiconductor memory device 2. According to the present embodiments, the capacitor 190 may include the lower electrode 155, having a vertical section that is generally in an 'L'-shaped configuration.

In a case where an etching amount of the lower electrode 155 has a spatial dependence, as described with reference to FIG. 5C, surface areas of the lower electrodes 155 may have the substantially same spatial dependence as shown in FIG. 5D. This may lead to a spatially varying capacitance property and a deterioration of electric reliability of the semiconductor device 2. According to the herein-described embodiments of the inventive concepts, the lower electrodes 155 can be formed to have sufficient and enhanced vertical length so as to neglect the difference in surface area of the lower electrodes 155, when compared to the total surface area, since the lower electrodes 155 can be robustly supported by the double-layered supporting pattern 100p. As a result, the semiconductor device 2 can be operated reliably without being limited by certain technical problems otherwise associated with the spatially varying capacitance property.

Figure 6A:
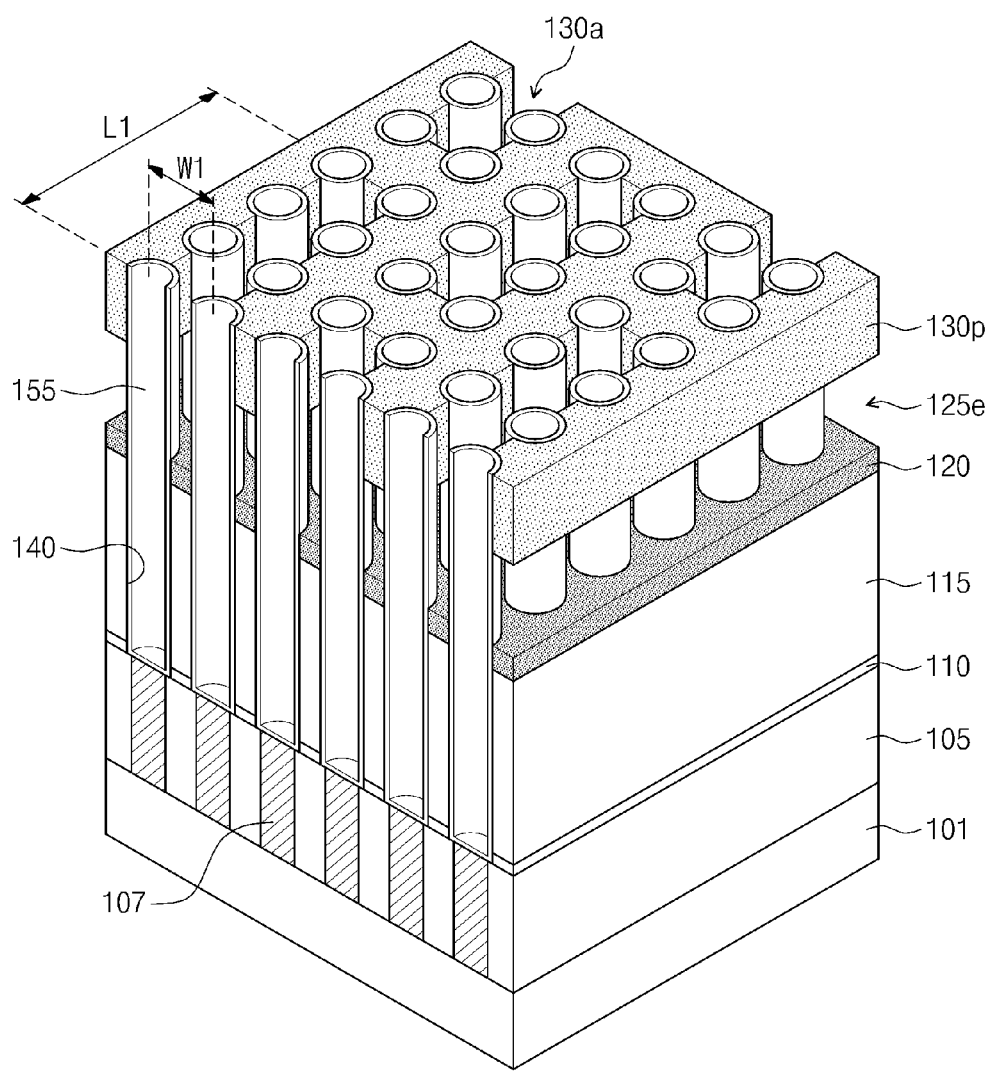
FIGS. 6A through 6E are perspective views illustrating a method of fabricating a semiconductor device according to other example embodiments of the inventive concepts.
Figure 6B:
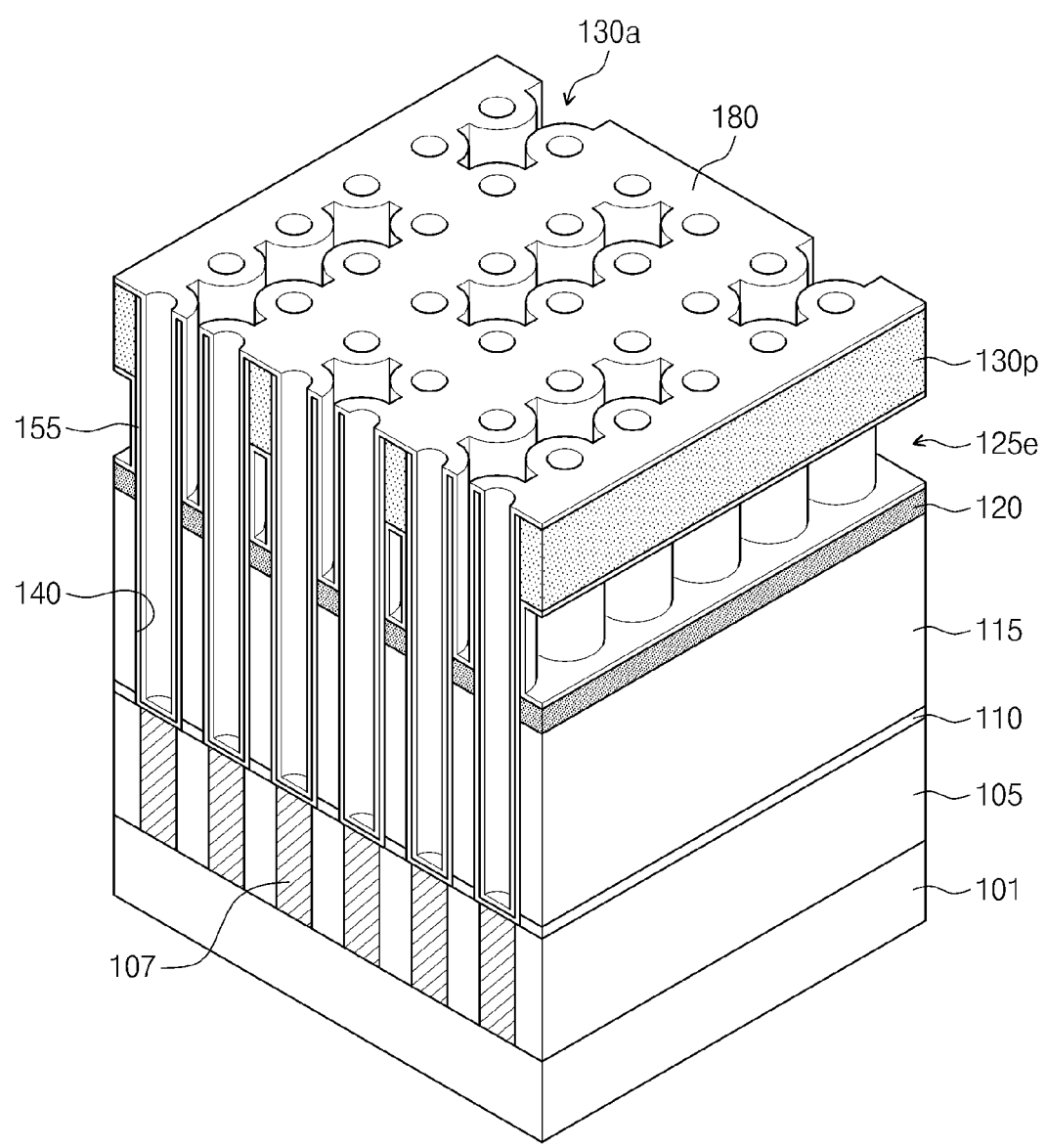
Figure 6C:
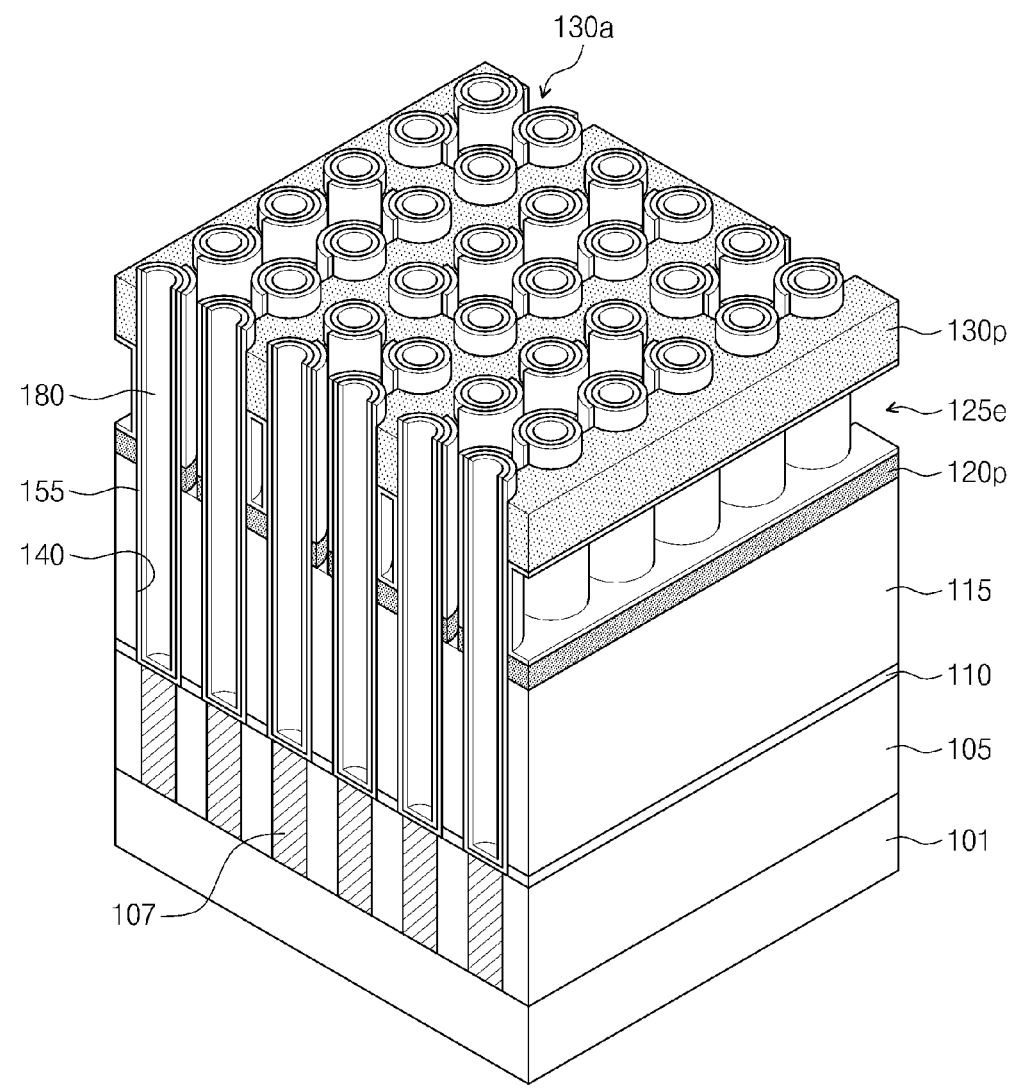
Figure 6D:
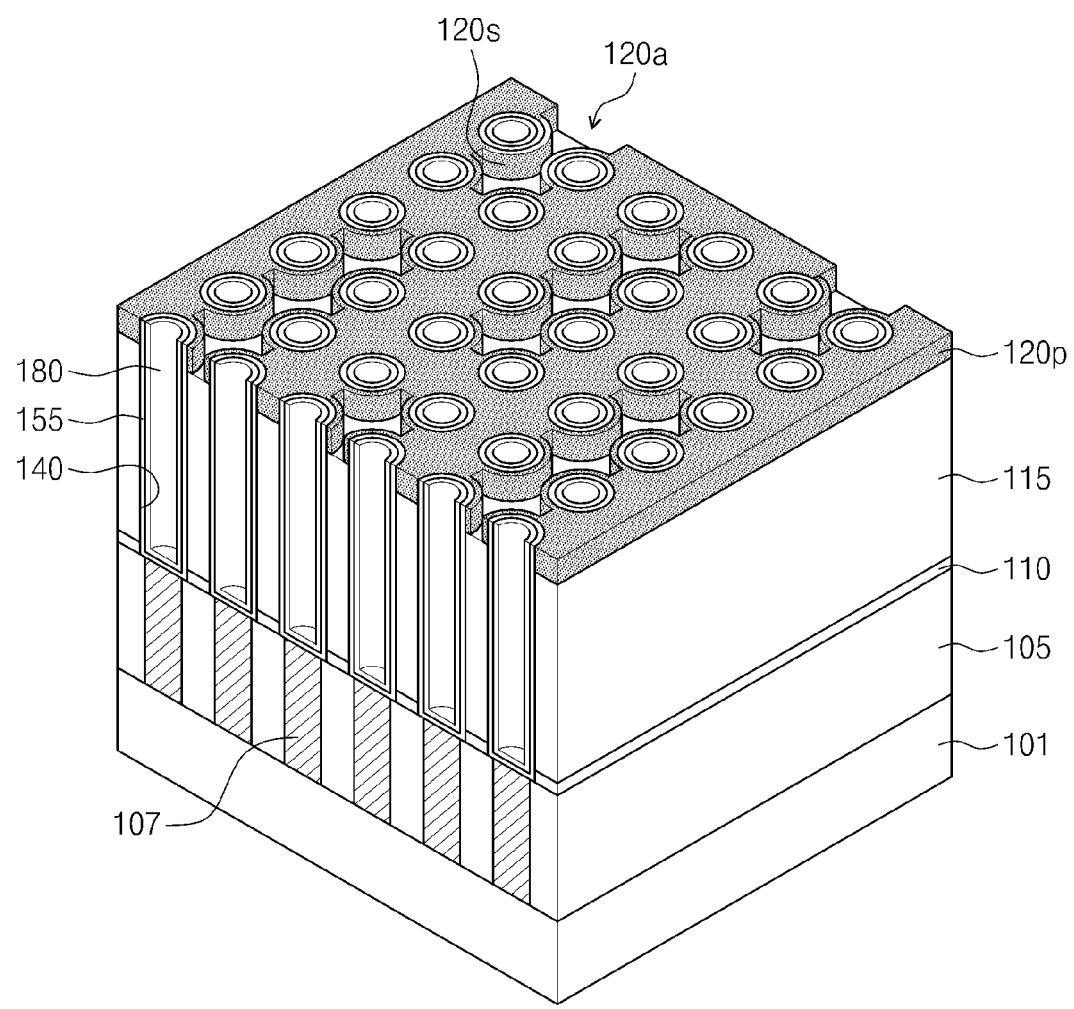

FIGS. 6A through 6E are perspective views illustrating a method of fabricating a semiconductor device according to even other example embodiments of the inventive concepts. Here, FIG. 6D is a perspective view selectively illustrating some elements of the structure shown in FIG. 6C.

Referring to FIG. 6A, the upper supporting pattern 130p may be formed using the fabricating method described with reference to FIGS. 1A through 1H. As a result, the upper supporting pattern 130p may be vertically spaced apart from the lower supporting layer 120 by the upper space 125e and be formed to include the upper mesh openings 130a. Furthermore, each of the upper mesh openings 130a may be formed to have the first width W1 and the first length L1. In other embodiments, the upper mesh opening 130a may be formed to have the second width W2 smaller than the first width W1, as shown in FIG. 4E; that is, the upper supporting pattern 130p may be formed to mostly surround or fully surround portions of the lower electrodes 155 located at the same level of the upper supporting pattern 130p.

Referring to FIG. 6B, a protection layer 180 may be formed to cover the lower electrode 155. Due to the presence of the protection layer 180, it is possible to prevent the lower electrode 155 from becoming damaged during the subsequent processes of etching the lower supporting layer 120 and/or the lower mold layer 125 and to prevent an etching by-product (e.g., polymers) from being excessively generated from a reaction between the lower electrode 155 and an etchant used in the fabrication processes. The protection layer 180 may be formed of a material capable of preventing etching attacks against the lower electrode 155. For example, the protection layer 180 may be formed by depositing at least one of an oxide layer, such as a silicon oxide layer, or a nitride layer.

Referring to FIGS. 6C and 6D, the lower supporting layer 120 may be patterned by an etching process using the upper supporting pattern 130p as a mask to form the lower supporting pattern 120p. During the etching of the lower supporting layer 120, the protection layer 180 may protect the lower electrode 155 from an etching attack caused by an etchant supplied through the upper mesh openings 130a. In some embodiments, the protection layer 180 may be partially removed from a top surface of the upper supporting pattern 130p. The resultant protection layer 180 may be formed to cover inner surfaces of the lower electrode 155 and, partially, outer surfaces of the lower electrode 155 positioned above the lower supporting layer 120. In some embodiments, the lower supporting pattern 120p may be formed to have a different shape than that of the upper supporting pattern 130p. In some embodiments, the lower supporting pattern 120p may further include an arch-shaped portion 120s protruding toward the lower mesh opening 120a, as shown in FIG. 6D.

Figure 6E:
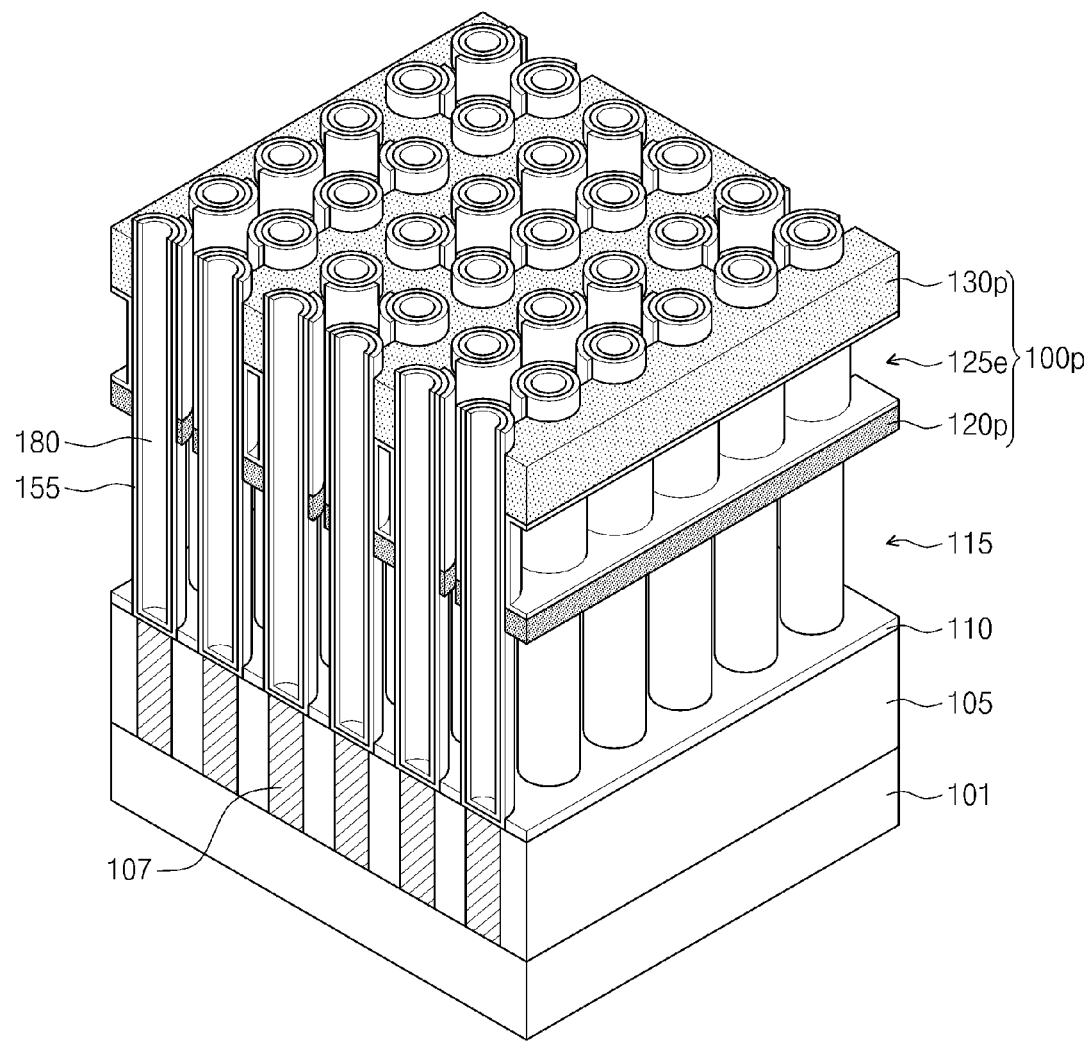

Referring to FIG. 6E, the lower mold layer 115 may be removed by a LAL lift-off process to form the lower space 115e. According to the present embodiments, the lower and upper supporting patterns 120p and 130p of mesh shape may be vertically spaced apart from each other by the upper space 125e and constitute the double-layered supporting pattern 100p structurally supporting the lower electrodes 155. Thereafter, as shown in FIGS. 1L and 1M, the dielectric layer 175 and the upper electrode 195 may be sequentially formed to cover the lower electrode 155. The lower electrode 155, the upper electrode 195, and the dielectric layer 175 therebetween may constitute the capacitor 190 serving as a memory element of the semiconductor memory device 1. In some embodiments, the protection layer 180 may be removed before the formation of the dielectric layer 175. In other embodiments, the protection layer 180 may operate as a portion of a capacitor dielectric layer of the capacitor 190.

Figure 7A:
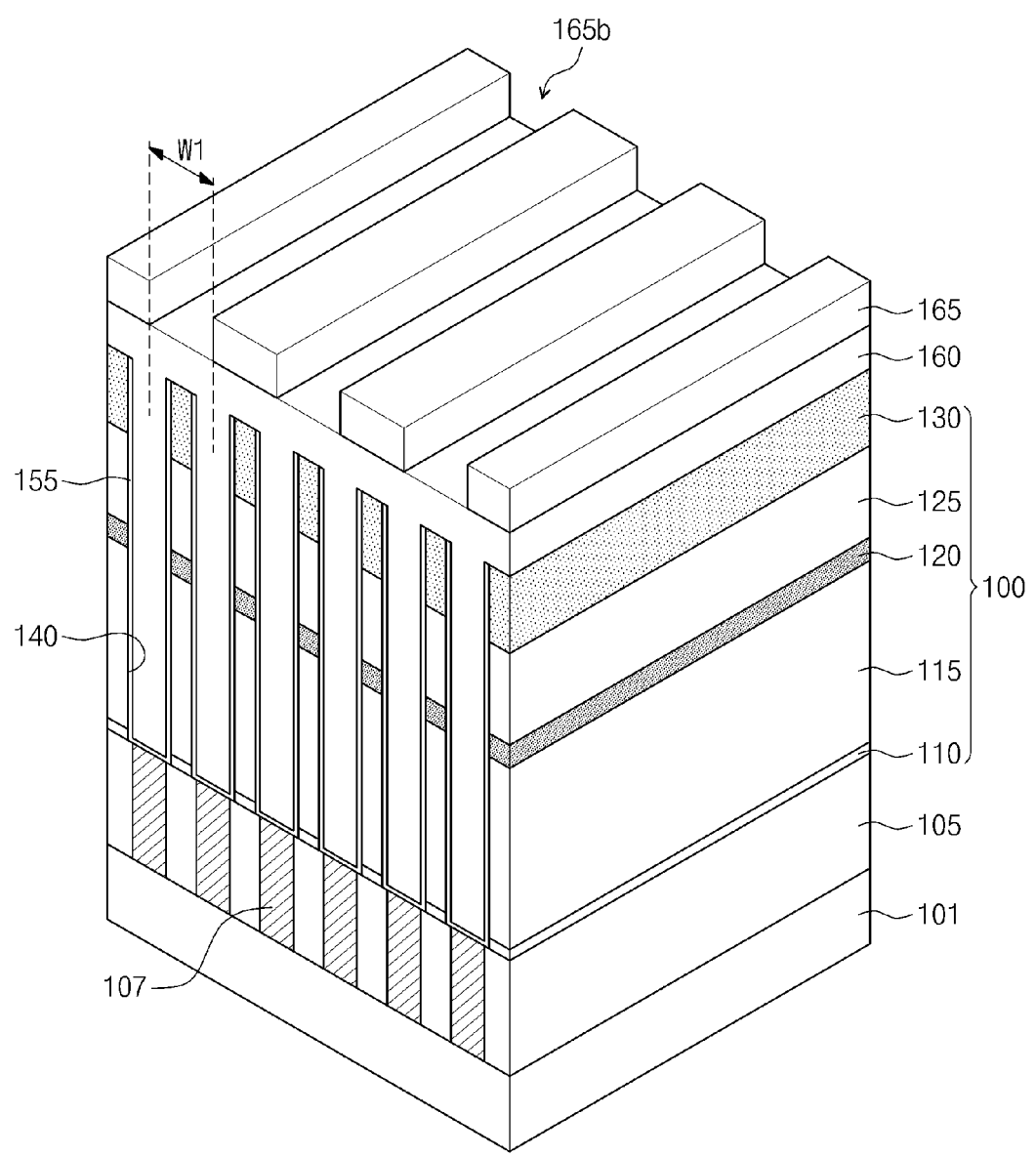
FIGS. 7A through 7G are perspective views illustrating a method of fabricating a semiconductor device according to other example embodiments of the inventive concepts.
Figure 7B:
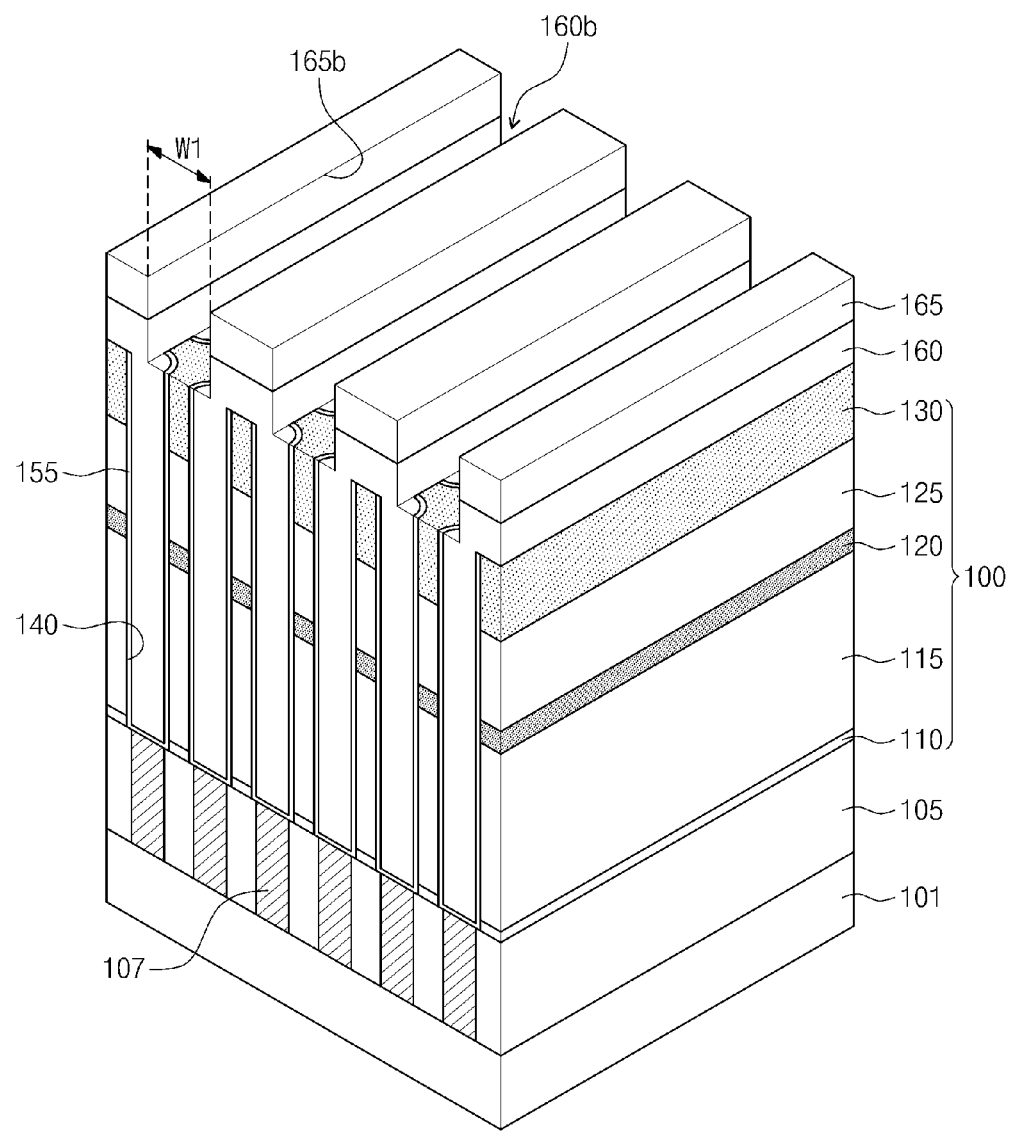
Figure 7C:
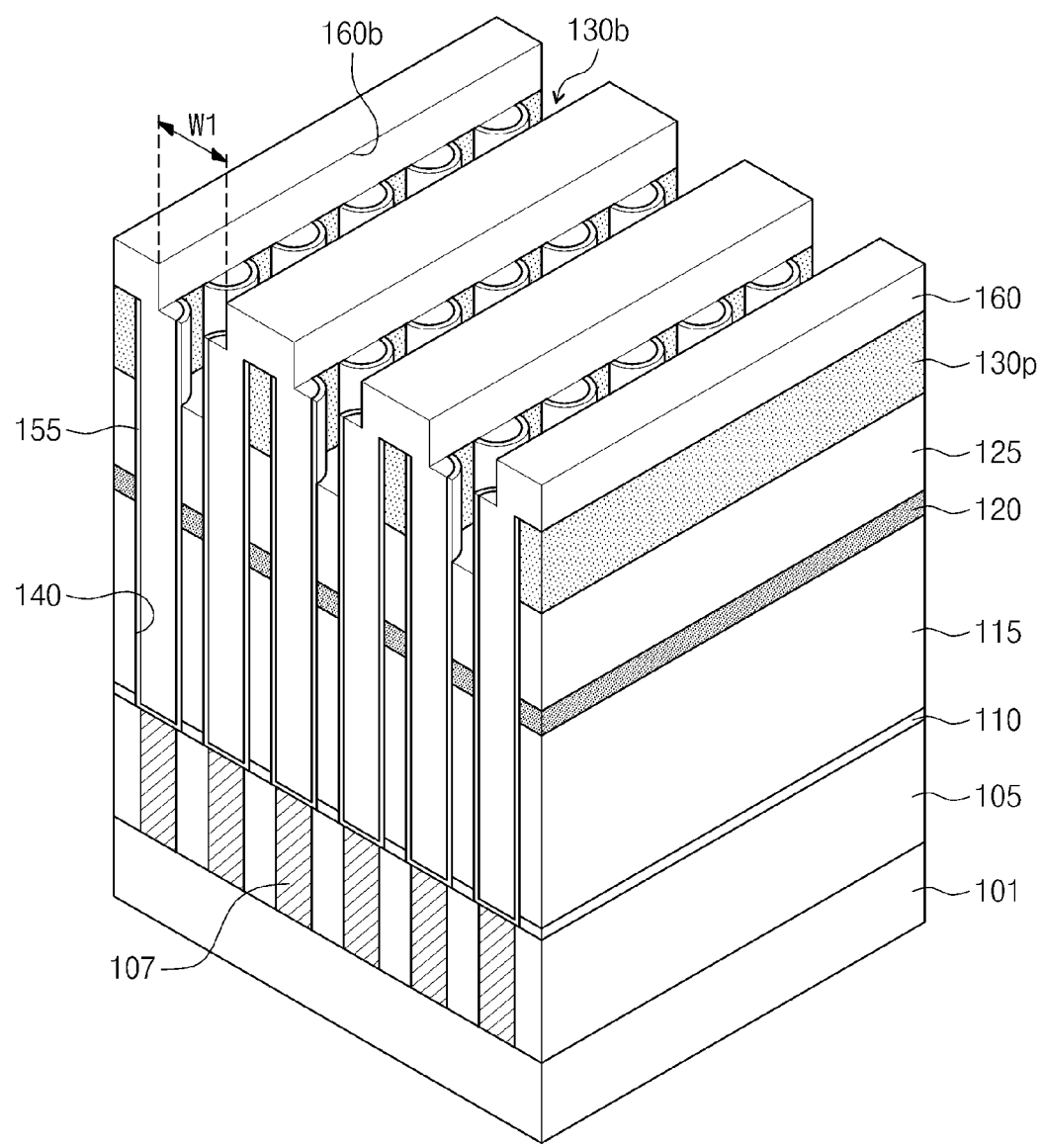
Figure 7D:
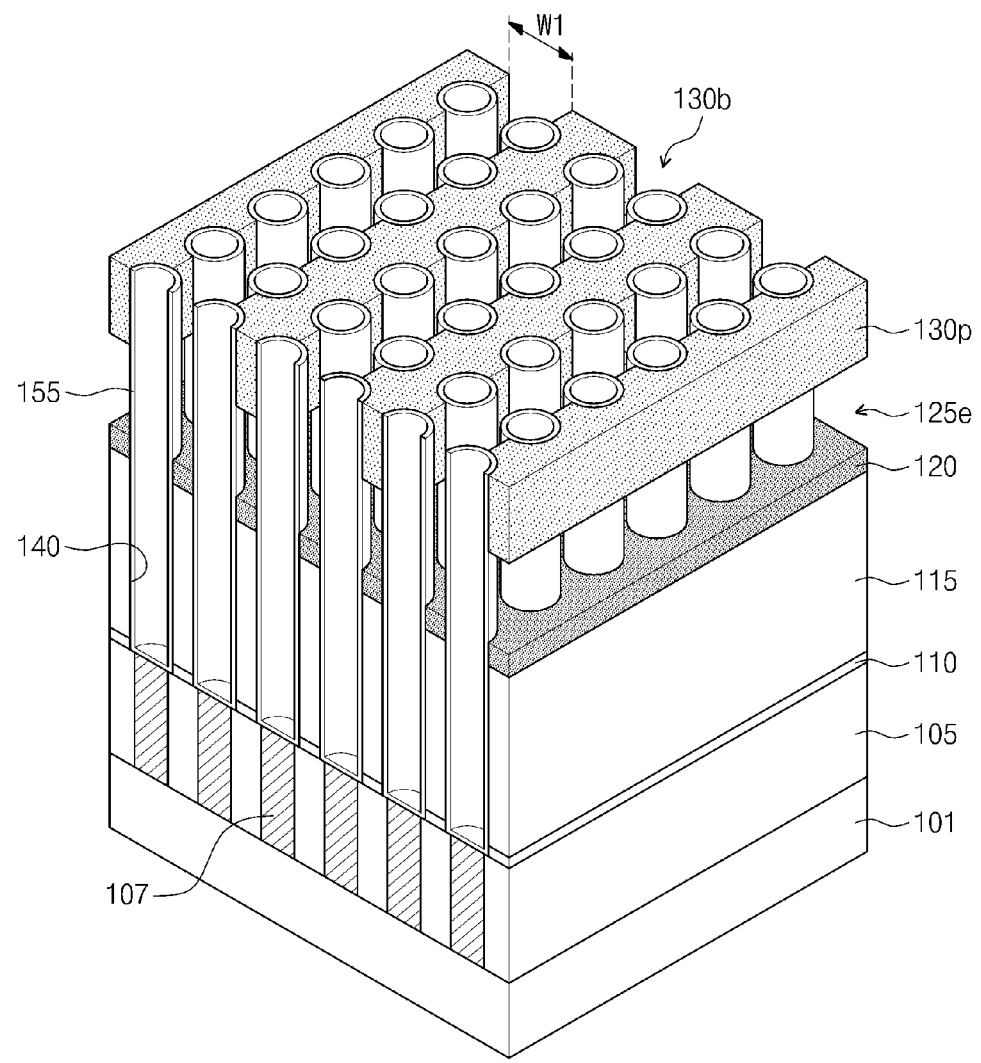
Figure 7E:
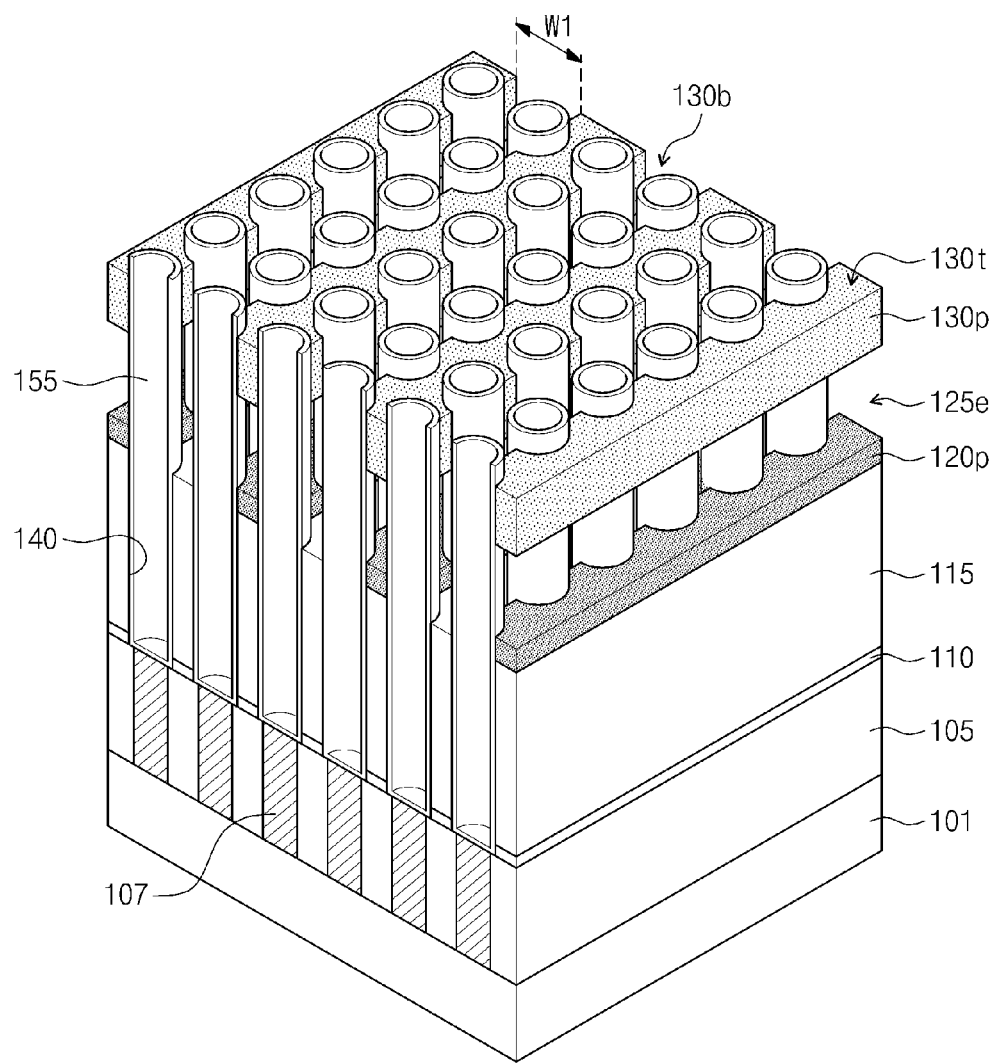
Figure 7F:
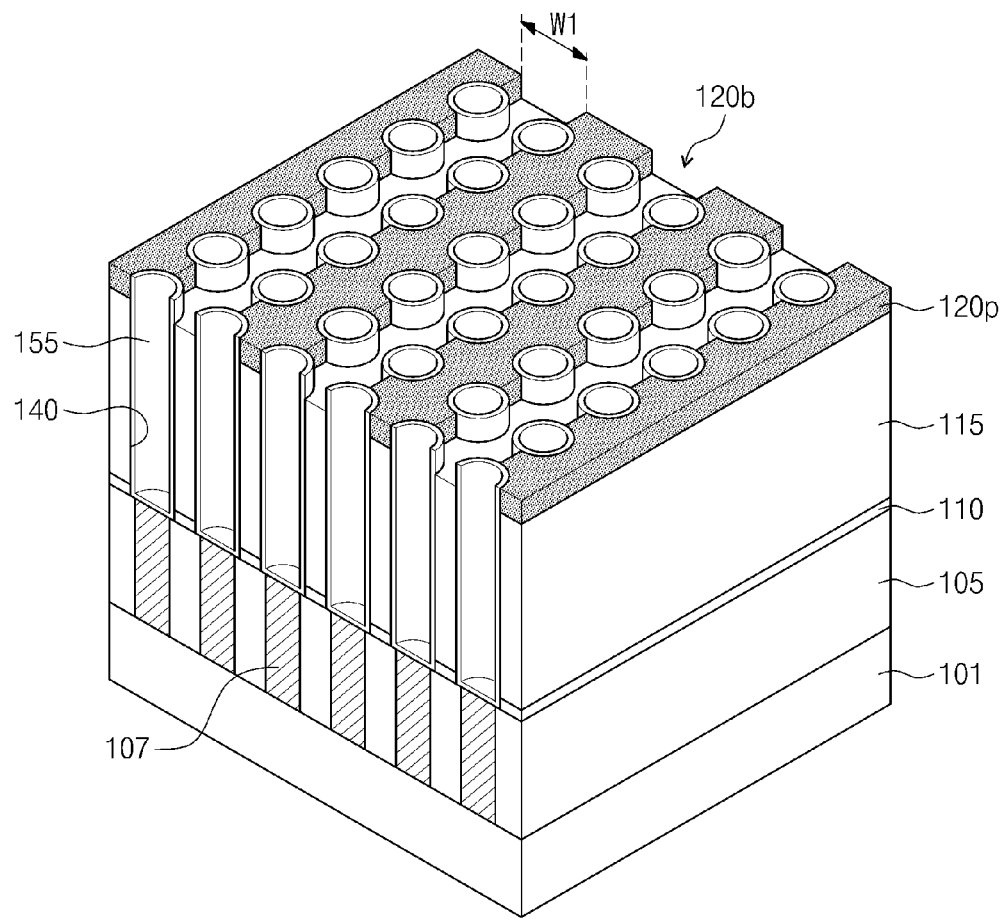

FIGS. 7A through 7G are perspective views illustrating a method of fabricating a semiconductor device according to yet other example embodiments of the inventive concepts. Here, FIG. 7F is a perspective view selectively illustrating some elements of the structure shown in FIG. 7E.

Referring to FIG. 7A, the capacitor holes 140 may be formed to vertically penetrate the mold stack 100, and then the cylindrical lower electrodes 155 may be formed to fill the capacitor holes 140. Thereafter, the hard mask layer 160 may be formed on the resultant structure provided with the lower electrodes 155, and the photoresist pattern 165 may be formed on the hard mask layer 160. In some embodiments, the photoresist pattern 165 may include a plurality of line patterned openings having the first width W1. As a result, the photoresist pattern 165 may be formed to define a plurality of line-shaped openings 165b exposing the hard mask layer 160. In some embodiments, from a plan view, the photoresist pattern 165 may be formed in such a way that the line pattern thereof is overlapped with a portion of each of the lower electrodes 155. For instance, each of the line patterns may have a width equivalent to a distance between centers of adjacent two of the lower electrodes 155 and a sidewall thereof may be substantially positioned at or near a central axis of the lower electrode 155.

Referring to FIG. 7B, the hard mask layer 160 may be patterned by an etching process using the photoresist pattern 165 as an etch mask. In some embodiments, the hard mask layer 160 may be formed to have open lines 160b having the first width W1 and exposing the upper supporting layer 130 between the lower electrodes 115. The photoresist pattern 165 may be removed by an ashing process.

Referring to FIG. 7C, the upper supporting layer 130, exposed by the open lines 160b, may be selectively removed by an etching process using the hard mask layer 160 as an etch mask. As the result of the selective removal of the upper supporting layer 130, the upper supporting pattern 130p may be formed to define upper-through lines 130b having the first width W1. The upper-through lines 130b may at least partially expose a plurality of the lower electrodes 155 that are arranged along the running direction of the upper supporting pattern 130p.

Referring to FIG. 7D, the hard mask layer 160 and the upper mold layer 125 may be removed by a first LAL lift-off process to form the upper space 125e separating the upper supporting pattern 130p from the lower supporting layer 120. In some embodiments, the upper supporting pattern 130p may be formed to partially, or fully, surround a plurality of the lower electrodes 155 arranged along the running direction of the upper supporting pattern 130p.

Referring to FIGS. 7E and 7F, the lower supporting layer 120 may be patterned by an etching process using the upper supporting pattern 130p as a mask to four the lower supporting pattern 120p. In some embodiments, the shape of the upper supporting pattern 130p can be transferred onto the lower supporting layer 120, without the need for an additional photolithography process. Similar to the upper supporting pattern 130p, the lower supporting pattern 120p may be formed to have the lower through lines 120b having the first width W1. In some embodiments, the upper supporting pattern 130p may be partially etched during the process of etching the lower supporting layer 120, and, as a result, the top surface 130t of the upper supporting pattern 130p may have an uneven surface profile, as shown in FIGS. 3B and 3C.

Figure 7G:
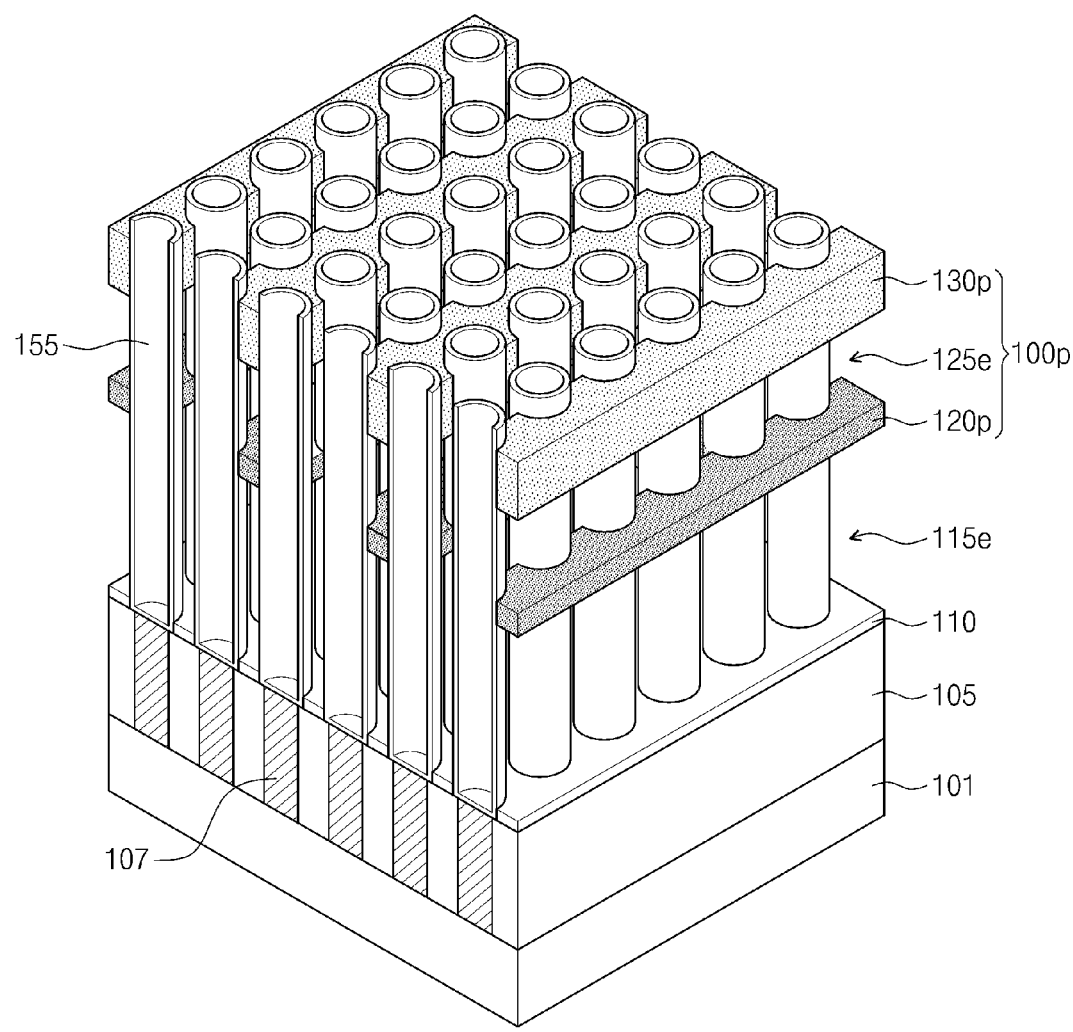

Referring to FIG. 7G, the lower mold layer 115 may be removed by a second LAL lift-off process to form the lower space 115e. According to the present embodiments, the lower and upper supporting patterns 120p and 130p having a line shape may be vertically spaced apart from each other by the upper space 125e and constitute the double-layered supporting pattern 100p that structurally supports the lower electrodes 155. Thereafter, as shown in FIGS. 1L and 1M, the dielectric layer 175 and the upper electrode 195 may be sequentially formed to cover the lower electrode 155. The lower electrode 155, the upper electrode 195, and the dielectric layer 175 therebetween may constitute the capacitor 190 serving as a memory element of the semiconductor memory device 1.

Figure 8A:
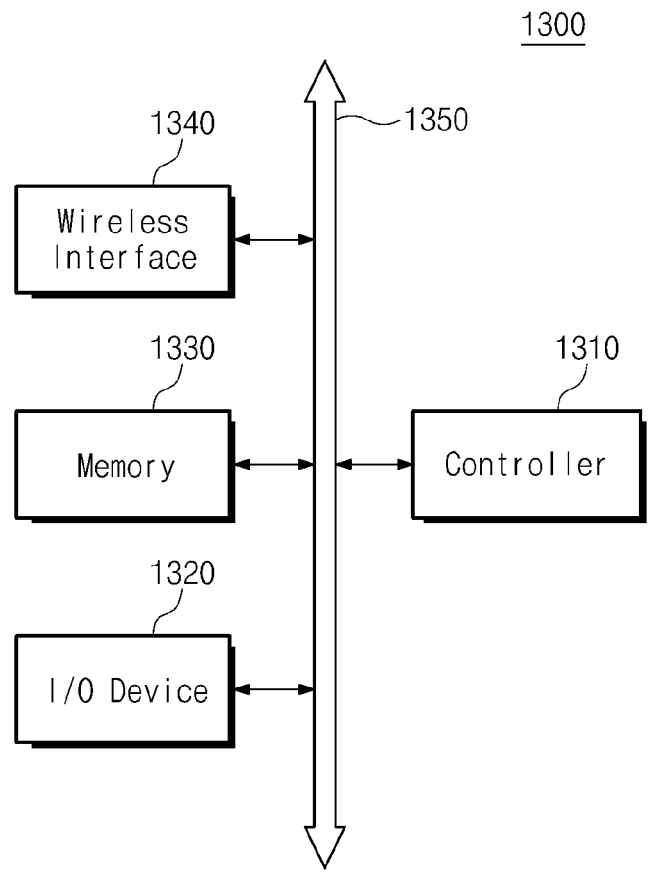
FIGS. 8A and 8B are block diagrams schematically illustrating electronic devices including a semiconductor device according to example embodiments of the inventive concepts.
Figure 8B:
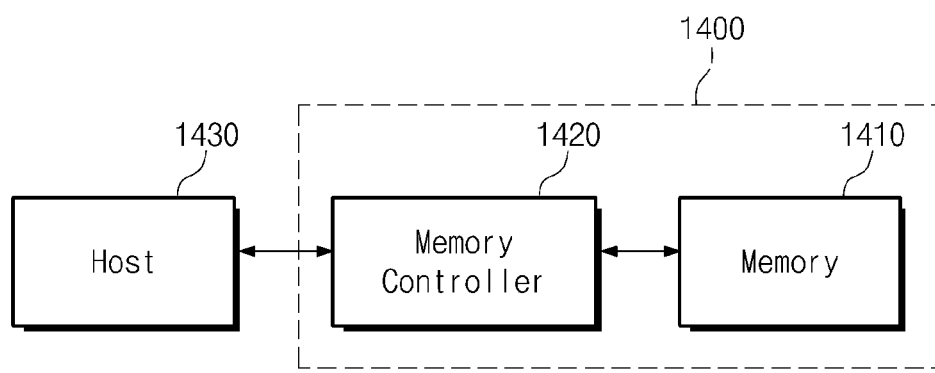

FIGS. 8A and 8B are block diagrams schematically illustrating electronic devices including a semiconductor device according to example embodiments of the inventive concepts.

Referring to FIG. 8A, an electronic device 1300 including a semiconductor device according to example embodiments of the inventive concepts will be described. The electronic device 1300 may, for example, be employed in one of a personal digital assistant (PDA), a laptop computer, a mobile computer, a web tablet, a wireless phone, a cell phone, a digital music player, a wire or wireless electronic device, or a complex electronic device including at least two or more such components thereof. The electronic device 1300 may include a controller 1310, an input/output device 1320 such as a keypad, a keyboard, a display, a memory 1330, and a wireless interface 1340 that are connected to each other through a bus 1350. The controller 1310 may include, for example, at least one microprocessor, a digital signal processor, a microcontroller or the like. The memory 1330 may be configured to store a command code to be used by the controller 1310 or a user data. The memory 1330 may include a semiconductor device according to example embodiments of the inventive concepts. The electronic device 1300 may use a wireless interface 1340 configured to transmit data to or receive data from a wireless communication network using a RF signal. The wireless interface 1340 may include, for example, an antenna, a wireless transceiver and the like. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and other suitable protocols.

Referring to FIG. 8B, a memory system including a semiconductor device according to example embodiments of the inventive concepts will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of the inventive concepts.

According to example embodiments of the inventive concepts, a double-layered supporting pattern is provided, which is configured to structurally support capacitor lower electrodes at two different levels. In some embodiments, the double-layered supporting pattern supports the electrodes at intermediate and upper portions of the capacitor electrodes. Due to the presence of the double-layered supporting pattern, it is possible to prevent the capacitor lower electrodes from leaning or bending during the fabrication of DRAM devices. Furthermore, according to example embodiments of the inventive concepts, the double-layered supporting pattern can be formed through a simplified process, and this enables a reduction in production costs.

While example embodiments of the inventive concepts have been particularly shown and described, it will be understood by one of ordinary skill in the art that variations in fond and detail may be made therein without departing from the spirit and scope of the attached claims.

What is claimed is:

1. A method of forming a semiconductor device, comprising:
    forming an array of storage nodes in a vertical direction relative to a substrate through a mold stack, the mold stack comprising a lower mold layer on the substrate, a lower support layer on the lower mold layer, an upper mold layer on the lower support layer, and an upper support layer on the upper mold layer;
    patterning the upper support layer to form an upper support pattern having a plurality of openings, each opening extending between multiple pairs of neighboring storage nodes of the array of storage nodes,
    removing the upper mold layer; and
    patterning the lower support layer using the upper support pattern as an etch mask to form a lower support pattern having a plurality of openings;
    wherein the upper support pattern is in contact with the storage nodes and a portion of the upper support pattern that extends between neighboring storage nodes varies in thickness.

2. The method of claim 1 wherein multiple openings are present between neighboring rows of the array of storage nodes and wherein multiple openings are present between neighboring columns of the array of storage nodes.

3. The method of claim 1 wherein patterning the lower support layer forms the lower support pattern to have a plurality of openings that correspond with the openings in the upper support layer in the vertical direction.

4. The method of claim 1 wherein removing the upper mold layer comprises performing a wet etch to remove the upper mold layer.

5. The method of claim 1 wherein removing the upper mold layer comprises removing the upper mold layer using the plurality of openings in the upper support layer.

6. The method of claim 1 further comprising removing the lower mold layer.

7. The method of claim 6 wherein removing the upper mold layer comprises removing the upper mold layer using the plurality of openings in the upper support layer.

8. The method of claim 6 wherein removing the lower mold layer comprises performing a wet etch to remove the lower mold layer.

9. The method of claim 1 wherein the lower support pattern is in contact with the storage nodes and a portion of the lower support pattern that extends between neighboring storage nodes has a substantially constant thickness.

10. The method of claim 1 wherein the portion of the upper support pattern extending between neighboring storage nodes has an intermediate region of relatively greater thickness than first and second end regions thereof.

11. The method of claim 10 wherein the intermediate region has a thickness that corresponds to a maximum thickness of the upper support pattern, and wherein the maximum thickness of the upper support pattern is greater than a maximum thickness of the lower support pattern.

12. The method of claim 10 wherein the end regions correspond to contact portions of the upper support pattern at which the upper support pattern makes contact with the storage nodes and wherein the intermediate region corresponds to intermediate portions of the upper support pattern between neighboring storage nodes.

13. The method of claim 1:
    wherein the storage nodes each have a height in the vertical direction between a bottom and a top of the storage node; and
    wherein the lower support pattern is positioned at a position in the vertical direction that is greater than or equal to a half of the height of the storage nodes.

14. The method of claim 1:
    wherein the lower support pattern has a first vertical cross-sectional profile; and
    wherein the upper support pattern has a second vertical cross-sectional profile that is different than the first cross-sectional profile.

15. The method of claim 1:
    wherein the storage nodes are arranged in rows and columns;
    wherein the lower support pattern has a plurality of openings, each opening extending between multiple pairs of neighboring storage nodes of the array of storage nodes, wherein multiple openings are present between neighboring rows of the array of storage nodes and wherein multiple openings are present between neighboring columns of the array of storage nodes;
    wherein the upper support pattern has a plurality of openings, each opening extending between multiple pairs of neighboring storage nodes of the array of storage nodes, wherein multiple openings are present between neighboring rows of the array of storage nodes and wherein multiple openings are present between neighboring columns of the array of storage nodes; and
    wherein the openings of the lower support pattern and the openings of the upper support pattern correspond with each other in the vertical direction.

16. The method of claim 1 wherein forming the array of storage nodes comprises:
    forming a plurality of lower electrodes,
    forming a capacitor dielectric layer on the plurality of lower electrodes;
    forming an upper electrode layer on the capacitor dielectric layer; and
    removing upper portions of the upper electrode layer to separate the upper electrode layer into a plurality of upper electrodes.

17. The method of claim 16 wherein the patterning of the upper support layer to form the upper support pattern occurs following the forming of the plurality of lower electrodes and prior to forming the capacitor dielectric layer and forming the upper electrode layer.

18. The method of claim 17 wherein the patterning of the upper support layer to form the upper support pattern removes upper portions of the lower electrodes.

19. The method of claim 16 further comprising forming an insulative protective layer on the storage nodes, following separation of the upper electrode layer into the plurality of upper electrodes.

20. A method of forming a semiconductor device, comprising:
- forming an array of storage nodes in a vertical direction relative to a substrate through a mold stack, the mold stack comprising a lower mold layer on the substrate, a lower support layer on the lower mold layer, an upper mold layer on the lower support layer, and an upper support layer on the upper mold layer;
- patterning the upper support layer to form an upper support pattern having a plurality of openings, each opening extending between multiple pairs of neighboring storage nodes of the array of storage nodes,
- removing the upper mold layer; and
- patterning the lower support layer using the upper support pattern as an etch mask to form a lower support pattern having a plurality of openings;
- wherein forming the array of storage nodes comprises:
- forming a plurality of lower electrodes,
- forming a capacitor dielectric layer on the plurality of lower electrodes;
- forming an upper electrode layer on the capacitor dielectric layer; and
- removing upper portions of the upper electrode layer to separate the upper electrode layer into a plurality of upper electrodes.

* * * * *